US008278387B2

(12) United States Patent
Kawashima et al.

(10) Patent No.: US 8,278,387 B2
(45) Date of Patent: Oct. 2, 2012

(54) RESIN COMPOSITION FOR LASER ENGRAVING, IMAGE FORMING MATERIAL, RELIEF PRINTING PLATE PRECURSOR FOR LASER ENGRAVING, RELIEF PRINTING PLATE, AND METHOD OF MANUFACTURING RELIEF PRINTING PLATE

(75) Inventors: Takashi Kawashima, Shizuoka-ken (JP); Atsushi Sugasaki, Shizuoka-ken (JP); Kenta Yoshida, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 630 days.

(21) Appl. No.: 12/404,343

(22) Filed: Mar. 16, 2009

(65) Prior Publication Data

US 2009/0246469 A1 Oct. 1, 2009

(30) Foreign Application Priority Data

Mar. 28, 2008 (JP) ................................. 2008-085948
Oct. 20, 2008 (JP) ................................. 2008-269844

(51) Int. Cl.
*C08F 28/04* (2006.01)
*C03C 15/00* (2006.01)
*C03C 1/00* (2006.01)
*G03F 7/00* (2006.01)

(52) U.S. Cl. ............... 525/11; 525/38; 525/55; 526/286; 526/289; 216/65; 522/2; 430/270.1; 430/281.1; 430/286.1

(58) Field of Classification Search ................... 428/172; 524/377, 800; 216/65; 526/286, 289; 430/159, 430/270.1, 173.1, 281.1, 286.1; 522/2; 264/400; 525/11, 38, 55, 63, 100, 326.8
See application file for complete search history.

(56) References Cited

U.S. PATENT DOCUMENTS

| 4,458,006 | A | | 7/1984 | Doenges et al. |
| 4,859,562 | A | * | 8/1989 | Pawlowski et al. ............ 430/175 |
| 5,489,639 | A | | 2/1996 | Faber et al. |
| 2003/0180636 | A1 | | 9/2003 | Kanga et al. |
| 2004/0157162 | A1 | | 8/2004 | Yokota et al. |
| 2004/0259022 | A1 | * | 12/2004 | Hiller et al. ................. 430/270.1 |
| 2005/0115920 | A1 | | 6/2005 | Hiller et al. |
| 2005/0227165 | A1 | | 10/2005 | Yamada et al. |
| 2006/0008729 | A1 | * | 1/2006 | Ichikawa et al. ............ 430/270.1 |
| 2006/0260481 | A1 | | 11/2006 | Becker et al. |
| 2007/0148556 | A1 | * | 6/2007 | Maeno et al. ...................... 430/1 |
| 2008/0063979 | A1 | | 3/2008 | Tomita et al. |
| 2008/0156212 | A1 | | 7/2008 | Yamada et al. |
| 2008/0194762 | A1 | * | 8/2008 | Sugasaki ........................ 524/612 |
| 2009/0081414 | A1 | * | 3/2009 | Sugasaki ........................ 428/172 |
| 2009/0176176 | A1 | | 7/2009 | Araki et al. |
| 2009/0191479 | A1 | | 7/2009 | Sugasaki |
| 2009/0191481 | A1 | | 7/2009 | Tashiro et al. |
| 2010/0243624 | A1 | * | 9/2010 | Yoshida et al. ........... 219/121.69 |
| 2010/0248139 | A1 | * | 9/2010 | Sugasaki .................... 430/280.1 |
| 2011/0156317 | A1 | * | 6/2011 | Yoshida ........................ 264/400 |
| 2011/0159438 | A1 | * | 6/2011 | Sato ................................ 430/306 |

FOREIGN PATENT DOCUMENTS

| EP | 1080883 | A2 | 3/2001 |
| EP | 1894957 | A | 3/2008 |
| EP | 2047987 | A | 4/2009 |
| EP | 2058123 | A | 5/2009 |
| JP | 3-075633 | A | 3/1991 |
| JP | 9-171247 | | 6/1997 |
| JP | 2773847 | | 7/1998 |
| JP | 2846954 | | 1/1999 |
| JP | 11-170718 | | 6/1999 |
| JP | 11-338139 | | 12/1999 |
| JP | 2000-168253 | | 6/2000 |
| JP | 2000-280643 | A | 10/2000 |
| JP | 2000-318330 | | 11/2000 |
| JP | 2002-357907 | | 12/2002 |
| WO | 02/16134 | A1 | 2/2002 |

OTHER PUBLICATIONS

Office Action issued on Oct. 14, 2010, for U.S. Appl. No. 12/497,557.
Office Action issued on Mar. 11, 2011, for U.S. Appl. No. 12/497,557.
Corresponding European Search Report, (Jul. 2009).
Chinese Office Action issued in the corresponding Chinese Patent Application No. 200910130142.9, dated Nov. 18, 2011.

* cited by examiner

*Primary Examiner* — Vasu Jagannathan
*Assistant Examiner* — Hannah Pak
(74) *Attorney, Agent, or Firm* — SOLARIS Intellectual Property Group, PLLC

(57) ABSTRACT

The invention provides a resin composition for laser engraving, containing at least (A) a polymerizable compound having two or more ethylenic unsaturated bonds, a carbon-sulfur bond being contained at the site where two among the two or more ethylenic unsaturated bonds are connected and (B) a binder polymer. The invention further provides an image forming material containing the resin composition, a relief printing plate precursor having a relief forming layer which contains the resin composition, a relief printing plate precursor having a relief forming layer which contains a product formed by subjecting the resin composition to cross-linking, a method for manufacturing a relief printing plate including subjecting the relief printing plate precursor having the relief forming layer which contains the resin composition to cross-linking, and a relief printing plate manufactured by the manufacturing method.

9 Claims, No Drawings

RESIN COMPOSITION FOR LASER ENGRAVING, IMAGE FORMING MATERIAL, RELIEF PRINTING PLATE PRECURSOR FOR LASER ENGRAVING, RELIEF PRINTING PLATE, AND METHOD OF MANUFACTURING RELIEF PRINTING PLATE

CROSS-REFERENCE TO RELATED APPLICATION

This application claims priority under 35 USC 119 from Japanese Patent Application No. 2008-085948 filed on Mar. 28, 2008 and Japanese Patent Application No. 2008-269844 filed on Oct. 20, 2008, the disclosures of which are incorporated by reference herein.

BACKGROUND OF THE INVENTION

1. Technical Field

The present invention relates to a resin composition for laser engraving, an image forming material, a relief printing plate precursor for laser engraving, a relief printing plate, and a method of manufacturing a relief printing plate.

2. Description of the Related Art

As a method for forming a printing plate by forming a concave-convex structure on a photosensitive resin layer laminated over the surface of a support, a method of exposing a relief forming layer which has been formed using a photosensitive composition, to ultraviolet radiation through an original image film so as to selectively cure image areas, and removing uncured parts by means of a developer solution, that is, so-called "analogue plate making", is well known.

A relief printing plate is a letterpress printing plate having a relief layer with a concave-convex structure, and such a relief layer having a concave-convex structure may be obtained by patterning a relief forming layer formed from a photosensitive composition containing, as a main component, for example, an elastomeric polymer such as synthetic rubber, a resin such as a thermoplastic resin, or a mixture of a resin and a plasticizer, to thus form a concave-convex structure. Among such relief printing plates, a printing plate having a flexible relief layer is often referred to as a flexo plate.

In the case of producing a relief printing plate by analogue plate making, since an original image film using a silver salt material is needed in general, the plate making process requires time and costs for the production of original image films. Furthermore, since chemical treatments are required in the development of original image films, and also treatments of development waste water are necessary, investigations on simpler methods of plate making, for example, methods which do not use original image films or methods which do not necessitate development treatments, are being undertaken.

SUMMARY

In recent years, a method of making a plate having a relief forming layer by means of scanning exposure, without requiring an original image film, is being investigated.

As a technique which does not require an original image film, there has been proposed a relief printing plate precursor in which a laser-sensitive mask layer element capable of forming an image mask is provided on a relief forming layer (see, for example, Japanese Patent No. 2773847 and Japanese Patent Application Laid-Open (JP-A) No. 9-171247). The method of making such a plate precursor is referred to as a "mask CTP method", because an image mask having the same function as the original image film is formed from the mask layer element by means of laser irradiation that is based on image data. This method does not require an original image film, but the subsequent plate making treatment involves a process of exposing the plate precursor to ultraviolet radiation through an image mask, and then removing uncured parts by development, and from the viewpoint of requiring a development treatment, the method has a room for further improvement.

As a method of plate making which does not require a development process, a so-called "direct engraving CTP method", in which plate making is carried out by directly engraving a relief forming layer using laser, has been proposed a number of times. The direct engraving CTP method is literally a method of forming a concave-convex structure which will serve as relief, by engraving the structure with laser. This method is advantageous in that the relief shape can be freely controlled, unlike the relief formation processes using original image films. For this reason, in the case of forming images like cutout characters, it is possible to engrave the image regions deeper than other regions, or for microdot images, to carry out shouldered engraving in consideration of resistance to the printing pressure, or the like.

However, in this method, since high energy is required to form a relief having a concave-convex structure which can withstand the printing pressure, on a relief forming layer having a predetermined thickness, and the speed of laser engraving is slow, the method has a problem of low productivity as compared to the methods in which image formation involves the use of a mask.

For this reason, it has been attempted to enhance the sensitivity of a relief printing plate precursor. For example, a flexographic printing plate precursor for laser engraving which includes an elastomer foam has been proposed (see JP-A Nos. 2002-357907 and 2000-318330). In this technology, an attempt is made to improve the engraving sensitivity by using a low density foamed material in a relief forming layer. However, due to being a foamed material having low density, there is a concern to the obtained printing plate with respect to lack of strength or the like, which might cause seriously impaired print durability.

Japanese Patent No. 2846954 and JP-A Nos. 11-338139 and 11-170718 disclose a flexographic plate precursor that can be processed by laser engraving or a flexographic plate obtained by laser engraving. In these documents, a flexographic plate is obtained by mixing a monomer with an elastomeric rubber as a binder, curing the mixture by a thermal polymerization mechanism or a photopolymerization mechanism, and then carrying out laser engraving.

Direct engraving CTP systems may exhibit a slow speed of laser engraving, because the thickness of the layer to be removed by the engraving is necessarily at least 100 μm in the direct engraving CTP system in view of the function of directly forming a relief, while the thickness of a mask layer element to be abraded is about 1 μm to 10 μm in the mask CTP systems. In view of addressing this, several proposals have been made for improving the sensitivity of a material to be engraved with respect to a laser (laser engraving sensitivity).

For example, a flexographic printing plate precursor for laser engraving containing a foamed body of elastomer has been proposed (JP-A No. 2000-318330). This technique aims to improve engraving sensitivity by using a foamed body having a low density. However, since the foamed body has a low density, the strength thereof tends to be insufficient for use as a printing plate, and thus the printing durability of the printing plate may be significantly decreased.

A flexographic printing plate precursor for laser engraving containing microspheres in which a hydrocarbon-based gas is encapsulated has also been proposed (see US Patent Application Publication No. 2003/180636). This technique aims for improvement of the engraving sensitivity by a system of expanding the gas in the microsphere due to heat generated by a laser to collapse a material to be engraved. However, since the material system thereof contains bubbles, the strength thereof tends to be insufficient to be used as a printing plate. Further, a gas tends to expand due to heat compared with a solid, and change in its volume due to change in an external temperature is inevitable even when a microsphere of high thermal deformation starting temperature is selected. Therefore, use of a bubble-containing material is not suitable to a printing plate, which requires stability in the accuracy of depth.

A resin letterpress printing plate for laser engraving which contains a polymeric filler having a ceiling temperature of less than 600 K has also been proposed (see JP-A No. 2000-168253). In this technology, an attempt is made to improve the engraving sensitivity by adding a polymeric filler having a low depolymerization temperature. However, when such a polymeric filler is used, surface irregularities may be generated on the surface of the printing plate precursor, and may seriously affect the printing quality.

As described above, various techniques have been proposed with respect to resin compositions that can be suitably used for a relief forming layer in a relief printing plate precursor for laser engraving, but a resin composition having high engraving sensitivity when subjected to laser engraving has not yet been provided at present.

The present invention has been achieved by taking the above circumstances into consideration. The present invention provides a resin composition for laser engraving which reveals high engraving sensitivity when subjected to laser engraving.

The present invention further provides an image forming material which reveals high engraving sensitivity and can be used for direct plate-making by laser engraving, a relief printing plate precursor for laser engraving, a method of manufacturing a relief printing plate for laser engraving using the relief printing plate precursor, and a relief printing plate formed by the manufacturing method.

Namely, a first aspect of the invention is a resin composition for laser engraving, comprising (A) a polyfunctional polymerizable compound having two or more ethylenic unsaturated bonds, a carbon-sulfur bond being contained at the site where two among the two or more ethylenic unsaturated bonds are connected and (B) a binder polymer.

A second aspect of the invention is an image forming material comprising the resin composition for laser engraving.

A third aspect of the invention is a relief printing plate precursor for laser engraving, comprising a relief forming layer, the relief forming layer comprising the resin composition for laser engraving.

A fourth aspect of the invention is a relief printing plate precursor for laser engraving, comprising a relief forming layer, the relief forming layer comprising a product formed by subjecting the resin composition for laser engraving to crosslinking by at least one of light and heat.

A fifth aspect of the invention is a method for manufacturing a relief printing plate, the method comprising: crosslinking at least a part of components of the relief forming layer of the relief printing plate precursor for laser engraving at least one of light or heat; and laser engraving the relief forming layer subjected to the crosslinking to form a relief layer.

A sixth aspect of the invention is a relief printing plate, comprising a relief layer and manufactured by the method for manufacturing a relief printing plate.

DETAILED DESCRIPTION

Details of the resin composition for laser engraving, the image forming material, the relief printing plate precursor for laser engraving, a relief printing plate, and a method of manufacturing a relief printing plate are described in the followings.

The resin composition for laser engraving of the invention contains at least: (A) a polyfunctional polymerizable compound having two or more ethylenic unsaturated bonds, a carbon-sulfur bond being contained at the site where two among the two or more ethylenic unsaturated bonds are connected; and (B) a binder polymer. The resin composition for laser engraving of the invention may be hereinafter simply referred as "the resin composition" or "the resin composition of the invention".

The resin composition of the invention has high engraving sensitivity when subjected to laser engraving. Accordingly, when the resin composition of the invention is used, the laser engraving can be carried out at a high speed. Accordingly, the time necessary for engraving can be shortened. The resin composition of the invention, which has the characteristics as described above, can be used in a wide range of applications for resin-formed objects to be subjected to laser engraving without particular limitation. Specific examples of the application of the resin composition of the invention include an image forming layer of an image forming material which forms an image by laser engraving, a relief forming layer of a printing plate precursor from which a convex relief is formed by laser engraving, an intaglio printing plate, a stencil printing plate, and stamp, while the invention is not limited to these. The resin composition of the invention can be particularly preferably used for an image forming layer of an image forming material which forms an image by laser engraving and a relief forming layer of a printing plate precursor for laser engraving. Explanations regarding components of the resin composition for laser engraving are given below.

(A) Sulfur-Containing Polyfunctional Monomer

The resin composition of the invention contains (A) a polymerizable compound having two or more ethylenic unsaturated bonds, a carbon-sulfur bond being contained at the site connecting two among the ethylenic unsaturated bonds (hereinafter, it may be also called "a sulfur-containing polyfunctional monomer").

Examples of a functional group which contains a carbon-sulfur bond in the sulfur-containing polyfunctional monomer include a functional group containing sulfide, disulfide, sulfoxide, sulfonyl, sulfonamide, thiocarbonyl, thiocarboxylic acid, dithiocarboxylic acid, sulfamic acid, thioamide, thiocarbamate, dithiocarbamate or thiourea.

In view of providing higher sensitivity, to laser, of a material to be engraved (laser engraving sensitivity), a functional group containing disulfide, thiocarbamate or dithiocarbamate is preferable as the functional group, and a functional group containing disulfide is more preferable as the functional group.

Preferable examples of a linking group which contains the carbon-sulfur bond connecting the two ethylenic unsaturated bonds in the sulfur-containing polyfunctional monomer include at least one unit selected from —C—S—, —C—S—S—, —NH(C=S)O—, —NH(C=O)S—, —NH(C=S)S— and —C—SO$_2$—. Examples which are more preferable in view of further enhancement of the engraving sensitivity include —C—SS—, —NH(C=S)O—, —NH(C=O)S— and —NH(C=S)S—, examples which are particularly preferable include —C—SS—.

There is no particular limitation for the number of the sulfur atom contained in the molecule of the sulfur-containing polyfunctional monomer so far as it is one or more. While it may be appropriately selected depending upon the object, it is preferably 1 to 10, more preferably 1 to 5, and still more preferably 1 to 2 in view of balancing the engraving sensitivity and its solubility in a solvent used for application thereof.

On the other hand, there is no particular limitation for the number of the ethylenic unsaturated site contained in the molecule so far as it is two or more. While it may be appropriately selected depending upon the object, it is preferably 2 to 10, more preferably 2 to 6 and, still more preferably 2 to 4 in view of softness and flexibility of the cross-linking membrane.

Preferable examples of the ethylenic unsaturated site contained in the sulfur-containing polyfunctional monomer include a partial structure represented by any one of the following Formulae (1) to (5). In view of obtaining degradability of a cross-linked product (polymerized product) formed of the sulfur-containing polyfunctional monomer, a partial structure represented by any one of Formulae (1) to (3) is more preferable, and a partial structure represented by Formula (1) is particularly preferable.

The sulfur-containing polyfunctional monomer may contain two or more of a partial structure represented by any one of Formulae (1) to (5) in one molecule thereof, and may contain two or more different partial structures represented by any of Formulae (1) to (5).

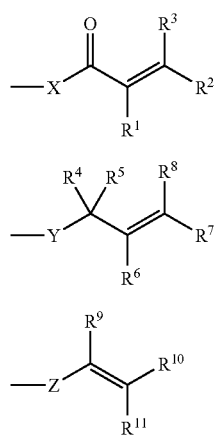

In Formulae (1) to (3), $R^1$ to $R^{11}$ each independently represent a hydrogen atom or a monovalent substituent group. X and Y each independently represent an oxygen atom, a sulfur atom, —N—$R^a$— or a sulfonyl group. Z represents an oxygen atom, a sulfur atom, —N—$R^a$—, a sulfonyl group or a phenylene group. Here, $R^a$ represents a hydrogen atom or a monovalent organic group.

In Formula (1), $R^1$ to $R^3$ each independently represent a hydrogen atom or a monovalent substituent group.

Examples of $R^1$ include a hydrogen atom and an organic group such as an optionally substituted alkyl group, and specific examples thereof include a hydrogen atom, a methyl group, a methylalkoxy group and a methyl ester group.

$R^2$ and $R^3$ each independently represent a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, an optionally substituted arylsulfonyl group or the like, and preferable examples among these include a hydrogen atom, a carboxyl group, an alkoxycarbonyl group, an optionally substituted alkyl group and an optionally substituted aryl group. Examples of a substituent which is able to be introduced into these groups include a methoxycarbonyl group, an ethoxycarbonyl group, an isopropyloxycarbonyl group, a methyl group, an ethyl group and a phenyl group.

Preferable examples of X include an oxygen atom, a sulfur atom or —N—$R^a$—, and preferable examples of $R^a$ include an optionally substituted alkyl group.

Herein, the expression that a group is "optionally substituted" means that the group can either has a substitutent or has no substitutent.

In Formula (2), $R^4$ to $R^8$ each independently represent a hydrogen atom or a monovalent substituent group.

Specific examples of each of $R^4$ to $R^8$ include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, an optionally substituted arylsulfonyl group or the like, and preferable examples among these include a hydrogen atom, a carboxyl group, an alkoxycarbonyl group, an optionally substituted alkyl group and an optionally substituted aryl group. Examples of the substituent which can be introduced into these groups include a methoxycarbonyl group, an ethoxycarbonyl group, an isopropyloxycarbonyl group, a methyl group, an ethyl group and a phenyl group.

Preferable examples of Y include an oxygen atom, a sulfur atom or —N—$R^a$—, and preferable examples of $R^a$ include an optionally substituted alkyl group.

In Formula (3), $R^9$ to $R^{11}$ each independently represent a hydrogen atom or a monovalent substituent group.

Specific examples of each of $R^9$ to $R^{11}$ include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, an optionally substituted arylsulfonyl group or the like, and preferable examples among these include a hydrogen atom, a carboxyl group, an alkoxycarbonyl group, an optionally substituted alkyl group and an optionally substituted aryl group. Examples of the substituent which can be introduced into these groups include a methoxycarbonyl group, an ethoxycarbonyl group, an isopropyloxycarbonyl group, a methyl group, an ethyl group and a phenyl group.

Preferable examples of Z include an oxygen atom, a sulfur atom, —N—$R^a$—, or a phenylene group, and preferable examples of $R^a$ include an optionally substituted alkyl group.

In addition to the partial structures represented by any of Formulae (1) to (3), the sulfur-containing polyfunctional monomer further contains a linking group L which connects the ethylenic unsaturated sites. Here, L represents a divalent or higher-valent linking group containing a carbon-sulfur bond. In view of obtaining thermal decomposition property of the polymerized product formed of the sulfur-containing polyfunctional monomer, the linking group L preferably contains an ester bond in addition to the carbon-sulfur bond, and more preferably contains both of an ester bond and a hydroxyl group.

Examples of a functional group which contains a carbon-sulfur bond in the linking group L include a functional group containing sulfide, disulfide, sulfoxide, sulfonyl, sulfonamide, thiocarbonyl, thiocarboxylic acid, dithiocarboxylic acid, sulfamic acid, thioamide, thiocarbamate, dithiocarbamate or thiourea.

In view of providing higher laser engraving sensitivity, a functional group containing disulfide, thiocarbamate or dithiocarbamate is preferable as the functional group, and a functional group containing disulfide is more preferable as the functional group.

The linking group L preferably contains a hydrocarbon group in addition to the functional group having a carbon-sulfur bond. It is particularly preferable that the sum of the carbon atoms contained in the linking group L is 1 to 10. The linking group L is particularly preferably contains plural hydrocarbon groups of 1 to 6 carbon atom(s) which are linked via a structure other than a hydrocarbon group. Preferable examples of the hydrocarbon group include an alkylene group having 1 to 6 carbon atom(s) and a phenylene group having 1 to 6 carbon atom(s). Preferable examples of the structure which configures the linking group L and is other than the hydrocarbon group include an ester bond, an amide bond, a urea bond, a urethane bond, an ether bond and a carbonyl bond, an an ester bond is particularly preferable among these. The hydrocarbon group may be appropriately substituted with a monovalent substituent group, and preferable examples of the substituent group include a hydroxyl group, a thiol group, an amino group, a carboxyl group, a cyano group and a nitro group. Particularly preferable examples of the hydrocarbon group which configures the linking group L include a hydrocarbon group substituted with a hydroxyl group. Further, the linking group L preferably has a structure containing 1 to 5 hydrocarbon group(s) per one ethylenic unsaturated bond in the sulfur-containing polyfunctional monomer.

Preferable specific examples of the sulfur-containing polyfunctional monomer having the partial structure represented by any one of Formulae (1) to (3) are shown hereinafter, while the present invention is not limited thereto. In the following specific examples, each R independently represents a hydrogen atom or a methyl group.

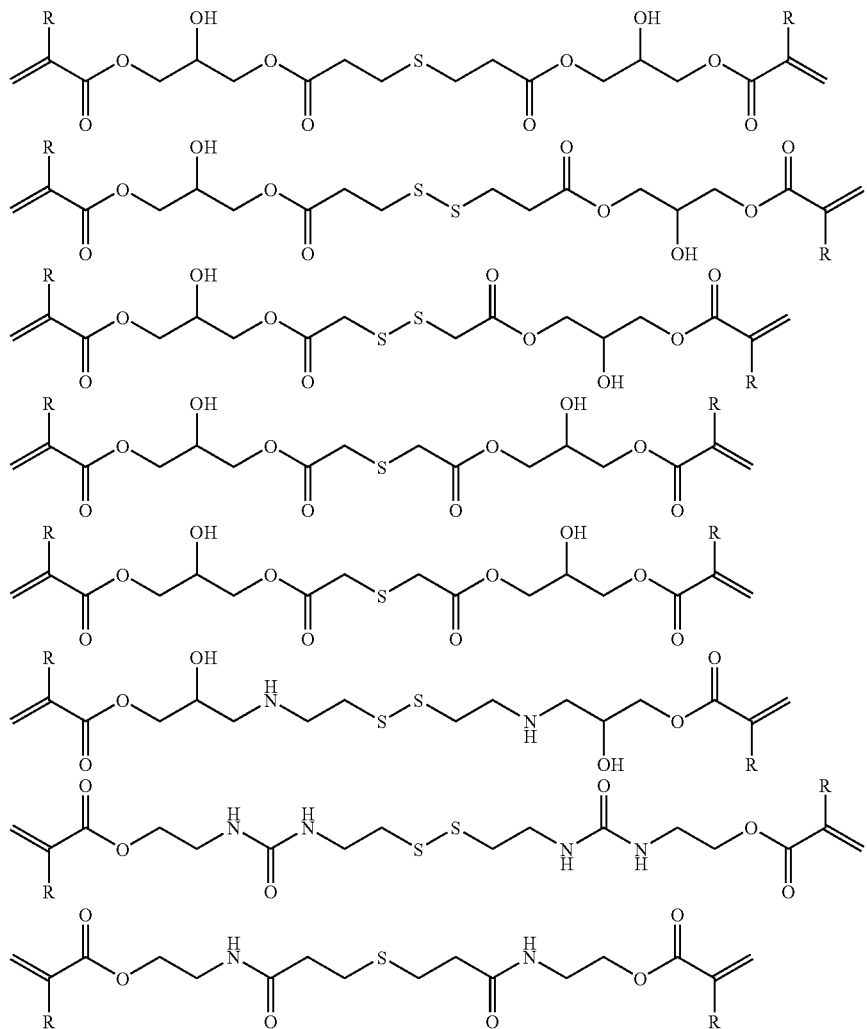

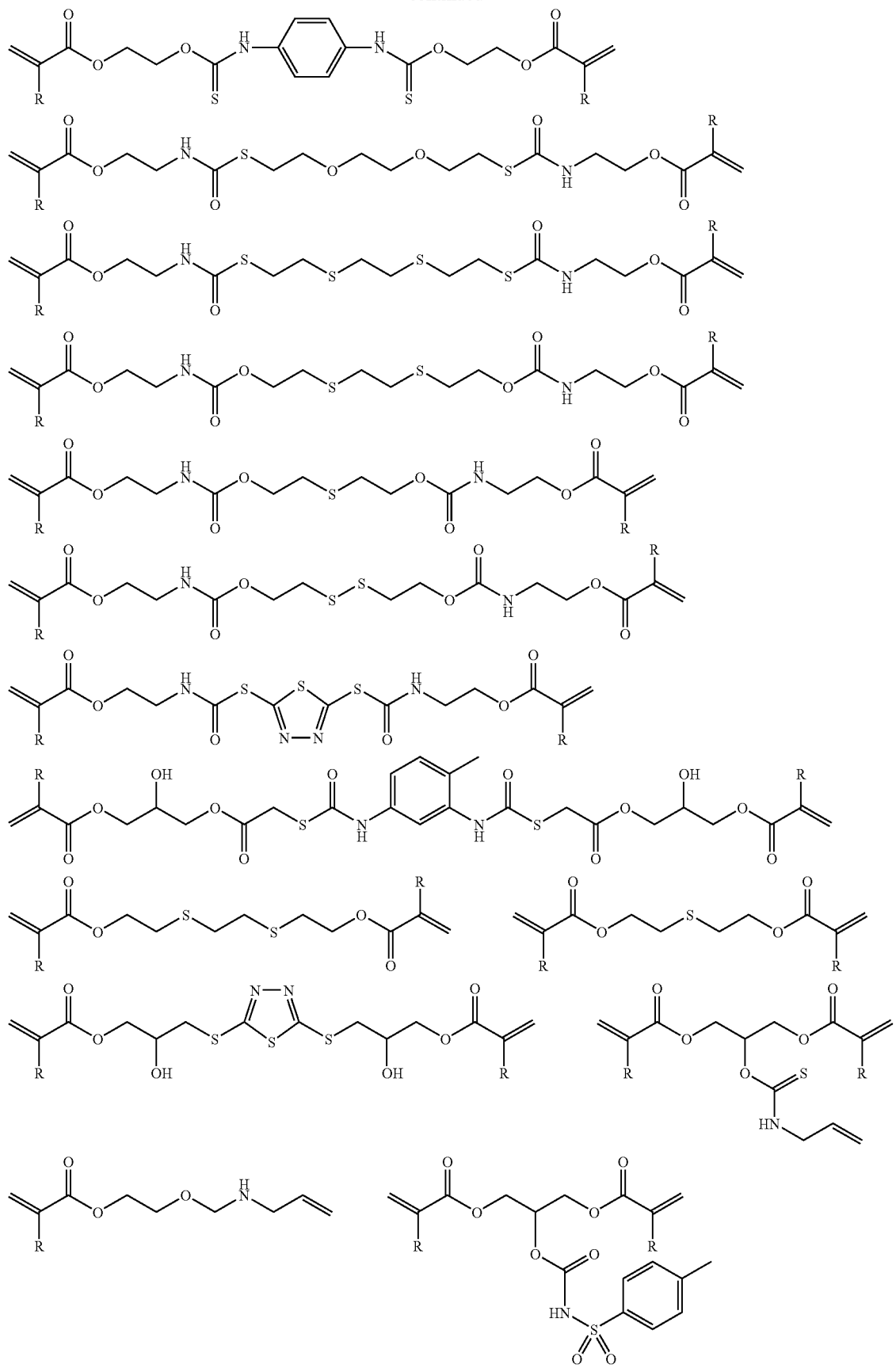

-continued
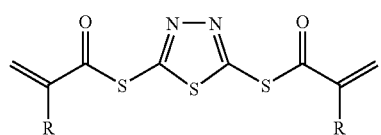
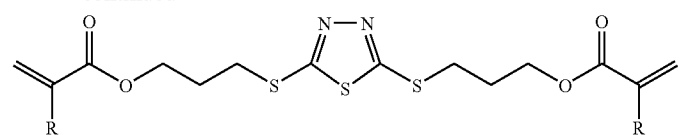
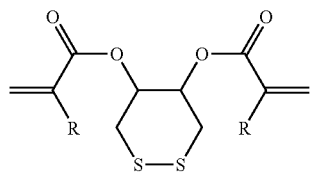
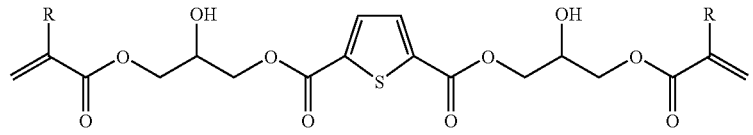
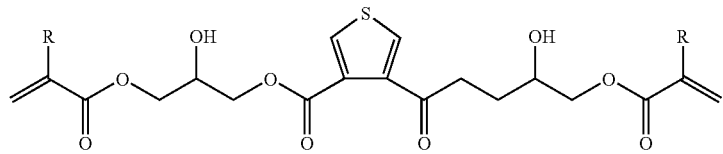
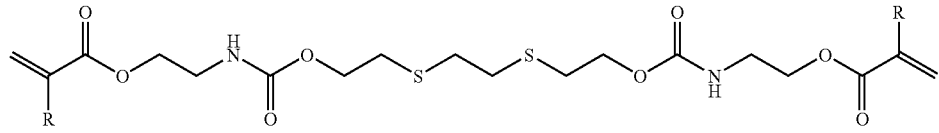
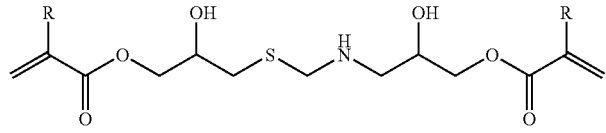
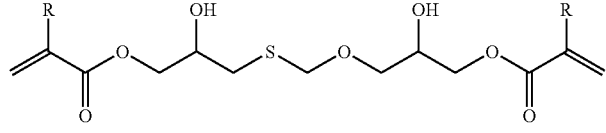
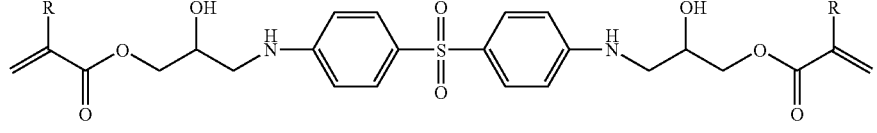
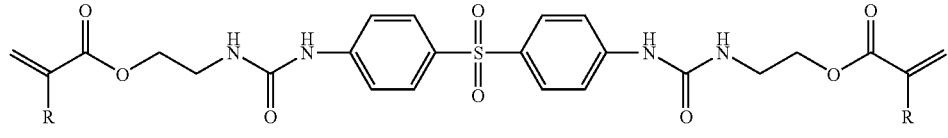
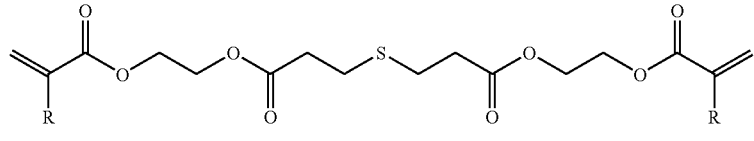
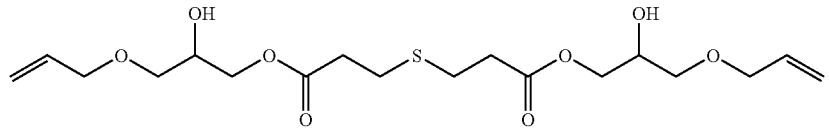
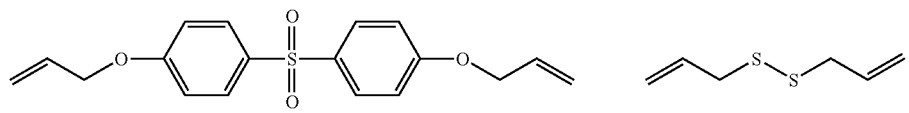

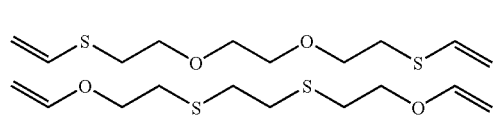
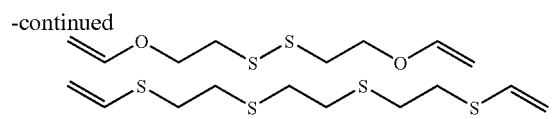
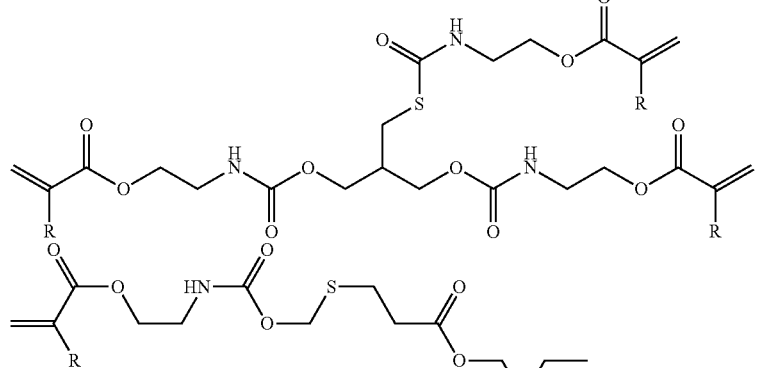
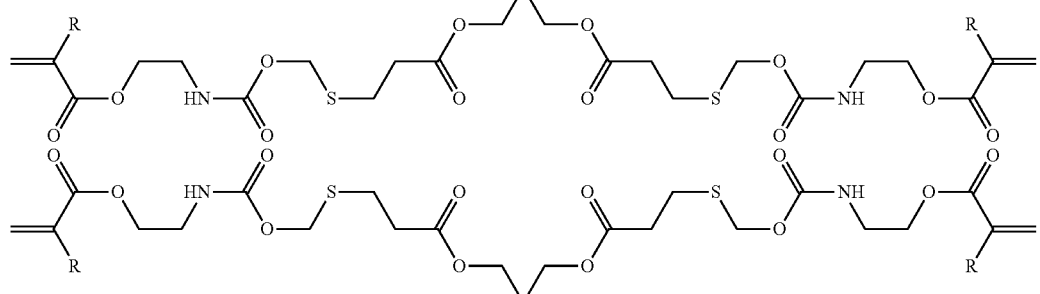
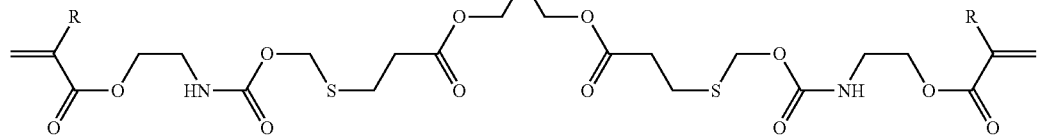
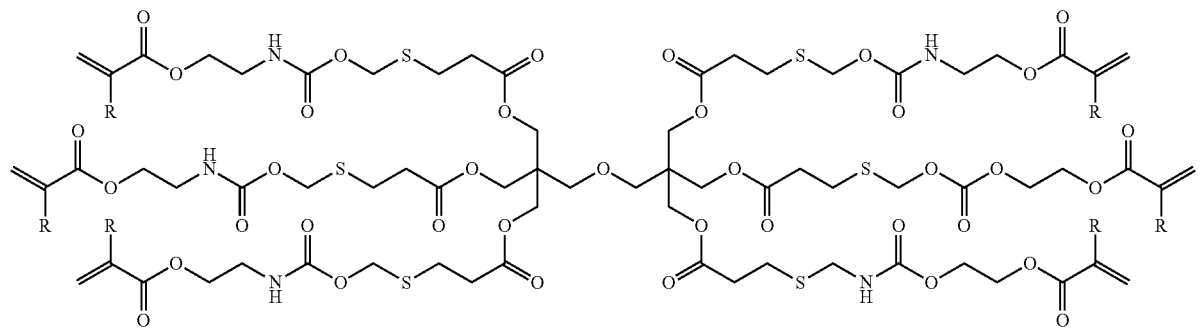
The partial structure represented by Formula (4) or (5) are explained hereinafter.
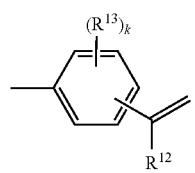
(4)
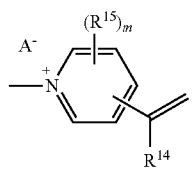
(5)
In Formula (4), $R^{12}$ represents a hydrogen atom or a methyl group. $R^{13}$ is an atom or an atomic group which is arbitrarily selected and may have a substituent. k is an integer of 1 to 4.

In Formula (5), $R^{14}$ represents a hydrogen atom or methyl group. $R^{15}$ is an atom or an atomic group which is arbitrarily selected and may have a substituent. m is an integer of 1 to 4. $A^-$ is a counter anion.

The pyridinium ring included in Formula (5) may be in a form of a benzopyridinium being condensed with a benzene ring by bonding two $R^{15}$s to form a benzene ring. In that case, it includes quinolinium group and isoquinolinium group.

Examples of the atom or the atomic group represented by $R^{13}$ or $R^{15}$ include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, an optionally substituted arylsulfonyl group or the like, and preferable examples among these include a hydrogen atom, a carboxyl group, an alkoxycarbonyl group, an optionally substituted alkyl group and an optionally substituted aryl group. Examples of a substituent which is able to be introduced into these groups include a methoxycarbonyl group, an ethoxycarbonyl group, an isopropyloxycarbonyl group, a methyl group, an ethyl group and a phenyl group.

Examples of the counter anion represented by $A^-$ include $F^-$, $Cl^-$, $Br^-$, $I^-$, $BF_4^-$, $PF_6^-$, $AsF_6^-$, $SF_6^-$, $BAr_4^-$, $CF_3SO_3^-$, $p\text{-}CH_3C_6H_4SO_3^-$, $CH_3SO_3^-$ and $CF_3COO^-$, wherein Ar is an aryl group which may have an arbitrary number of a fluorine atom(s) or $-CF_3$ as a substituent(s) thereof. The four Ar groups may be the same as or different from each other.

In addition to the partial structure represented by Formula (4) or (5), the sulfur-containing polyfunctional monomer in the invention further contains a linking group L which connects the ethylenenic unsaturated sites. The linking group L is defined in the same manner as in the above-described linking group L in the Formulae (1) to (3), and preferable examples thereof are also the same as those of the above-described linking group L in the Formulae (1) to (3).

Preferable specific examples of the sulfur-containing polyfunctional monomer having the partial structure represented by Formula (4) or (5) are shown hereinafter, while the present invention is not limited thereto. In the following specific examples, each R independently represents a hydrogen atom or a methyl group.

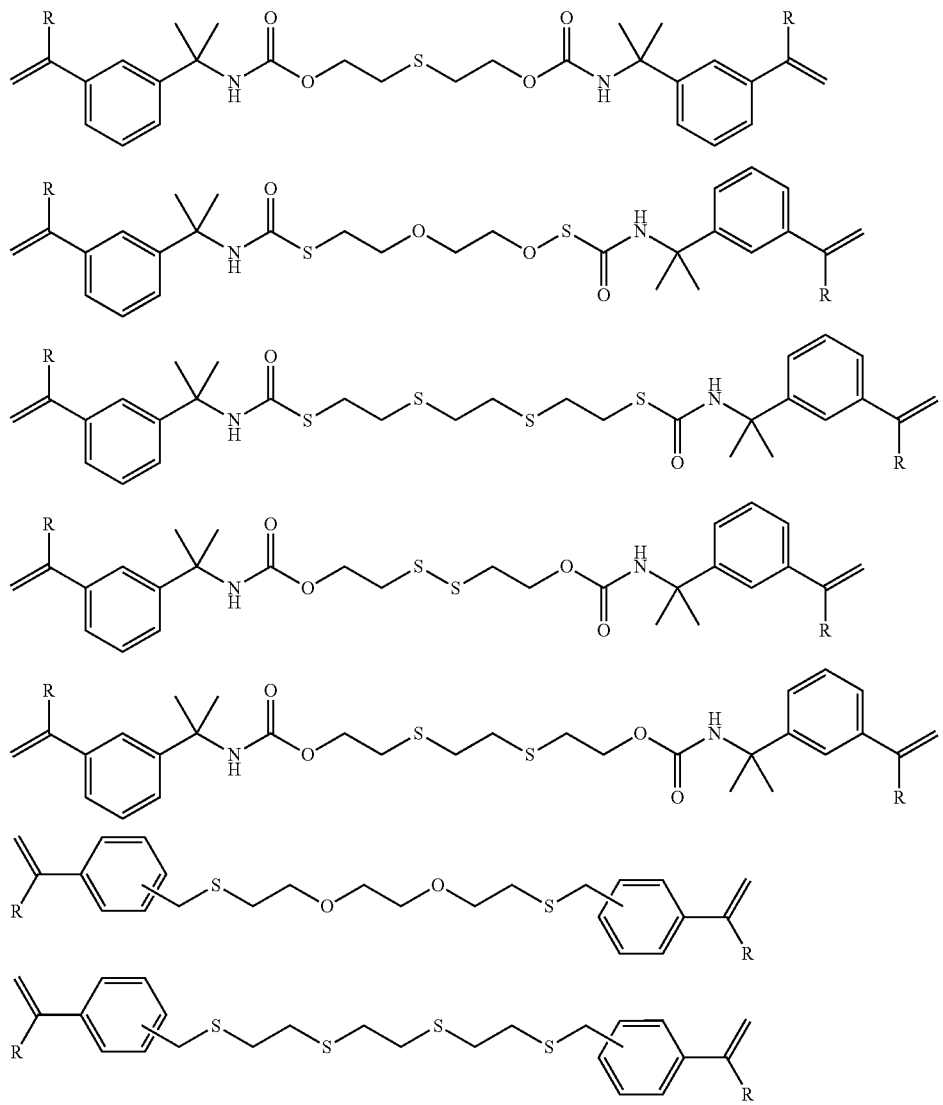

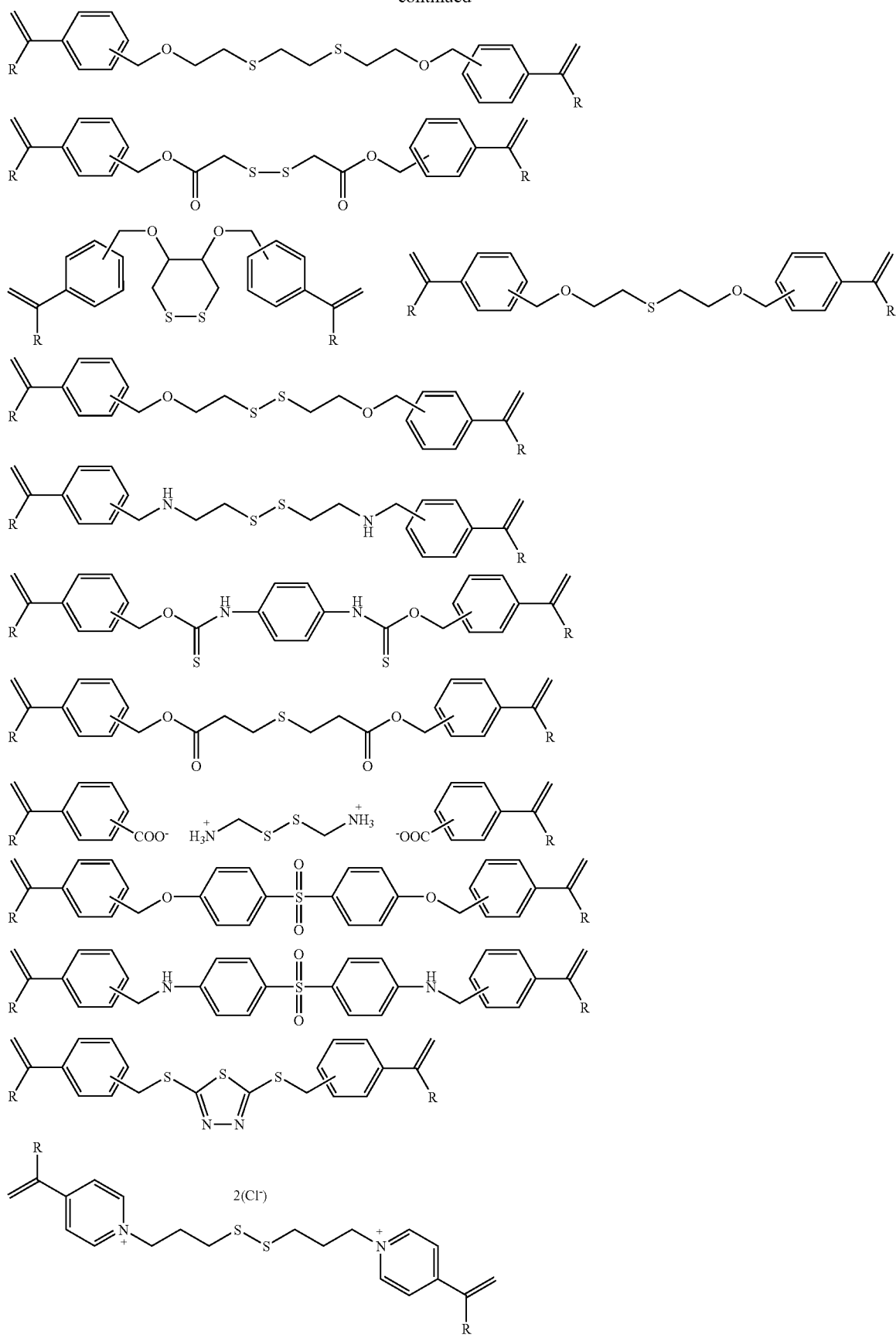

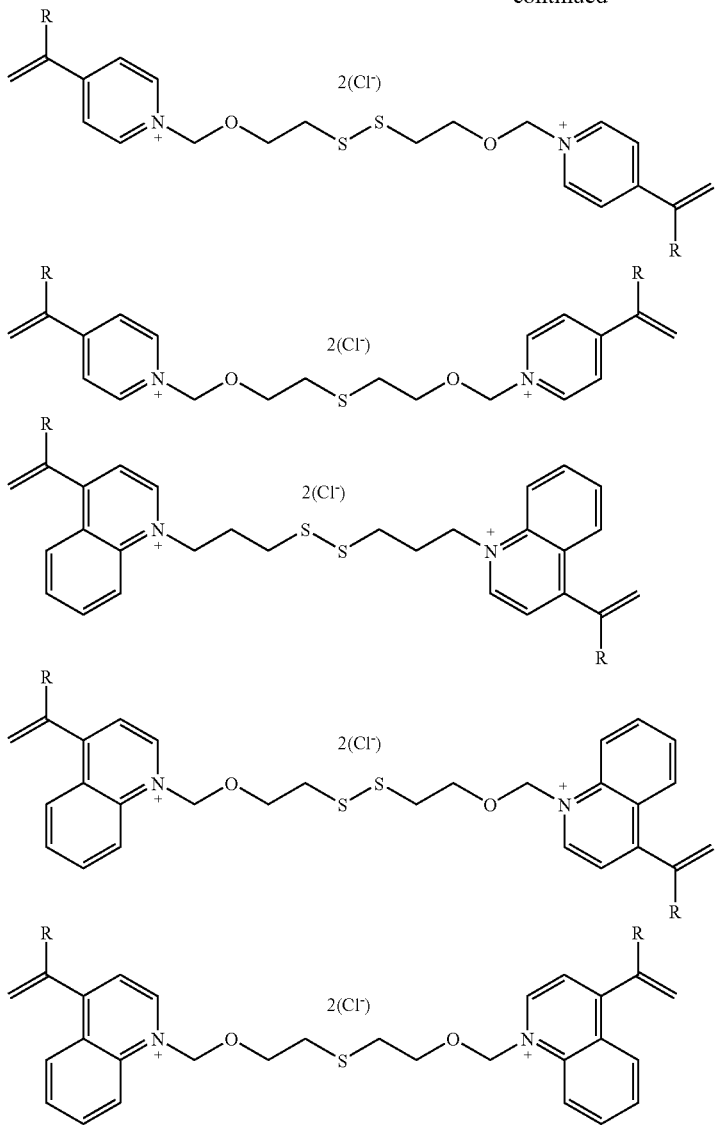

-continued

The sulfur-containing polyfunctional monomer in the invention can be synthesized by means of (1) a reaction of a sulfur-containing dicarboxylic acid with an ethylenic unsaturated bond-containing epoxy, (2) a reaction of a sulfur-containing diol with an ethylenic unsaturated bond-containing isocyanate, (3) a reaction of a dithiol with an ethylenic unsaturated bond-containing isocyanate, (4) a reaction of a diisothiocyanate with an ethylenic unsaturated bond-containing alcohol, (5) an esterifying reaction of a sulfur-containing diol with a (meth)acrylic acid compound, or the like. In those reactions, any solvent, catalyst, condensing agent, and the like may be used in appropriate amounts, and any appropriate reaction conditions may be used therefor.

Preferable examples of the solvent used in the reaction (1) include a heterocyclic compound (such as 3-methyl-2-oxazolidinone or N-methylpyrrolidone), a cyclic ether (such as dioxane or tetrahydrofuran), an aliphatic ether (such as diethyl ether, ethylene glycol dialkyl ether, propylene glycol dialkyl ether, polyethylene glycol dialkyl ether or polypropylene glycol dialkyl ether), an alcohol (such as methanol, ethanol, isopropanol, ethylene glycol monoalkyl ether, propylene glycol monoalkyl ether, polyethylene glycol monoalkyl ether or polypropylene glycol monoalkyl ether), a polyhydric alcohol (such as ethylene glycol, propylene glycol, polyethylene glycol, polypropylene glycol or glycerol), a nitrile (such as acetonitrile, glutarodinitrile, methoxyacetonitrile, propionitrile or benzonitrile), a ketone (such as acetone, 2-butanone or cyclohexanone), an ester (such as ethyl acetate, butyl acetate or propylene glycol monomethyl ether acetate), a non-polar solvent (such as toluene or xylene), a chlorine solvent (such as methylene chloride or ethylene chloride) and an amide (such as N,N-dimethylformamide, N,N-dimethylacetamide or acetamide). Among them, a cyclic ether, an aliphatic ether, a nitrile, a ketone, an alcohol and an ester are more preferable, and an alcohol and an ester are particularly preferable in view of higher solubility of raw materials thereto and easiness for removal thereof after the reaction.

Hereinafter, the reactions (1) to (5) will be specifically illustrated.

In the reaction (1), the amount of the ethylenic unsaturated bond-containing epoxy used is preferably 1.6 equivalents to 3.5 equivalents, more preferably 1.8 equivalents to 3.0 equivalents, and still more preferably 2.0 equivalents to 2.5 equivalents relative to the amount of the sulfur-containing dicarboxylic acid.

Preferable examples of the catalyst used in the reaction (1) include a protonic acid (such as sulfuric acid or p-toluenesulfonic acid), a phosphine (such as triphenyl phosphine or tricyclohexyl phosphine) and a quaternary ammonium salt (such as tetraethylammonium bromide or tetrabutylammonium chloride). In view of obtaining higher yield by the reaction, a phosphine and a quaternary ammonium salt are preferable, and tetraethylammonium bromide is further preferable.

In the reaction (1), the amount of the catalyst used is preferably 0.00001 equivalent to 0.5 equivalent, more preferably 0.00005 equivalent to 0.1 equivalent and, still more preferably 0.0001 equivalent to 0.05 equivalent relative to the amount of the sulfur-containing dicarboxylic acid.

Preferable examples of the solvent used in the reaction (2), (3) or (4) include a heterocyclic compound (such as 3-methyl-2-oxazolidinone or N-methylpyrrolidone), a cyclic ether (such as dioxane or tetrahydrofuran), an aliphatic ether (such as diethyl ether, ethylene glycol dialkyl ether, propylene glycol dialkyl ether, polyethylene glycol dialkyl ether or polypropylene glycol dialkyl ether), a nitrile (such as acetonitrile, glutarodinitrile, methoxyacetonitrile, propionitrile or benzonitrile), a ketone (such as acetone, 2-butanone or cyclohexanone), an ester (such as ethyl acetate, butyl acetate or propylene glycol monomethyl ether acetate), a hydrocarbon (such as toluene or xylene), a chlorine solvent (such as methylene chloride or ethylene chloride) and an amide (such as N,N-dimethylformamide, N,N-dimethylacetamide or acetamide). Among them, a cyclic ether, an aliphatic ether, a nitrile, a ketone and an ester are more preferable, and a ketone and an ester are particularly preferable in view of higher solubility of raw materials thereto and easiness for removal thereof after the reaction.

A tin catalyst and a bismuth catalyst may also be used in the reaction (2), (3) or (4). Among these, a bismuth catalyst is more preferable in view of reducing the influence on the environment.

Known methods such as that described in "Jikken Kagaku Koza (Experimental Chemistry)", Fourth Edition, pages 43 to 83, edited by the Chemical Society of Japan may be applied for the reaction (5). Examples of the methods which are referable in view of availability of raw materials and easiness of the production include those which use (a) (meth)acrylic acid, (b) (meth)acrylic chloride, (c) (meth)acrylate ester (such as methyl(meth)acrylate or ethyl(meth)acrylate) or (d) (meth)acrylic acid anhydride as a (meth)acrylic acid compound being the starting material. Among the above, methods which use the above (a), (c) or (d) are more preferable, and methods which use the above (c) or (d) are further preferable.

While a solvent may be used when the (c) (meth)acrylate ester is used as the starting (meth)acrylic acid compound in the reaction (5), it is preferable to conduct the reaction without using a solvent in view of the higher reactivity. In that case, the amount of the (meth)acrylate ester is preferably 1.6 equivalents to 20 equivalents, more preferably 1.8 equivalents to 15 equivalents, and further preferably 2.0 equivalents to 10 equivalents relative to the amount of the sulfur-containing diol.

Examples of a catalyst which can be preferably used in the case that the (c) is used as the starting (meth)acrylic acid compound in the reaction (5) include an acid (such as sulfuric acid or p-toluenesulfonic acid), a base (such as sodium methoxide, tert-butoxy potassium or N,N-dimethylaminopyridine) and a metal compound (such as titanium tetraisopropoxide or aluminum triisopropoxide). Metal compounds which are able to catalyze the reaction under a neutral condition are more preferable, and titanium tetraisopropoxide is further preferable.

The amount of the catalyst used in the reaction (5) is preferably 0.001 equivalent to 0.5 equivalent, more preferably 0.002 equivalent to 0.1 equivalent, and still more preferably 0.005 equivalent to 0.05 equivalent relative to the amount of the sulfur-containing diol.

Preferable examples of the solvent which can be preferably used in the case that the (d) (meth)acrylic acid anhydride is used as the starting (meth)acrylic acid compound in the reaction (5) include a heterocyclic compound (such as 3-methyl-2-oxazolidinone or N-methylpyrrolidone), a cyclic ether (such as dioxane or tetrahydrofuran), an aliphatic ether (such as diethyl ether, ethylene glycol dialkyl ether, propylene glycol dialkyl ether, polyethylene glycol dialkyl ether or polypropylene glycol dialkyl ether), a nitrile (such as acetonitrile, glutarodinitrile, methoxyacetonitrile, propionitrile or benzonitrile), a ketone (such as acetone, 2-butanone or cyclohexanone), an ester (such as ethyl acetate, butyl acetate or propylene glycol monomethyl ether acetate), a hydrocarbon (such as toluene or xylene), a chlorine solvent (such as methylene chloride or ethylene chloride) and an amide (such as N,N-dimethylformamide, N,N-dimethylacetamide or acetamide). Among them, a nitrile, a ketone and a hydrocarbon are more preferable, and a hydrocarbon is particularly preferable in view of higher solubility of raw materials thereto and easiness for removal thereof after the reaction. In that case, the amount of the (meth)acrylic acid anhydride is preferably 1.6 equivalents to 3.5 equivalents, more preferably 1.8 equivalents to 3.0 equivalents, and further preferably 2.0 equivalents to 2.5 equivalents relative to the amount of the sulfur-containing diol.

A base is used in the reaction (5). Preferable examples of the base include a tertiary amine (triethylamine, tributylamine, 1,4-diazabicyclo[2.2.2]octane and 1,8-diazabicyclo[5.4.0]undeca-7-ene), an aromatic nitrogen-containing heterocyclic compound (such as pyridine, N,N-dimethylaminopyridine, 1-methylimidazole, pyrazine or quinoline) and a metal salt (such as sodium acetate or tert-butoxy potassium). In view of increasing the reaction rate and reducing the material cost, triethylamine, tributylamine, 1,4-diazabicyclo[2.2.2]octane, pyridine and 1-methylimidazole are more preferable, and triethylamine is further preferable.

The amount of the base is preferably 1.6 equivalents to 3.5 equivalents, more preferably 1.8 equivalents to 3.0 equivalents, and further preferably 2.0 equivalents to 2.5 equivalents relative to the amount of the sulfur-containing diol.

N,N-dimethylaminopyridine is a compound which functions as a catalyst and also as a base when it is solely used. Therefore, when N,N-dimethylaminopyridine is used together with other base, the amount of N,N-dimethylaminopyridine used is a catalytic amount. In some cases where N,N-dimethylaminopyridine and other base are used together and the N,N-dimethylaminopyridine is used in its catalytic amount, the reaction (5) may achieve improved reactivity, shortening of the reaction time and an increase in the yield. In such an embodiment, the amount of the N,N-dimethylaminopyridine is preferably 0.01 equivalent to 0.6 equivalent, more preferably 0.05 equivalent to 0.4 equivalent thereof, and further preferably 0.1 equivalent to 0.2 equivalent y relative to the amount of the sulfur-containing diol.

A commercially available product may be used as to the sulfur-containing polyfunctional monomer in the invention.

The molecular weight of the sulfur-containing polyfunctional monomer is preferably 120 to 3,000, and more preferably 120 to 1,500 in view of providing the softness and flexibility to a film formed from the resin composition of the invention.

While the sulfur-containing polyfunctional monomer may be used solely in the invention, it may be also used in combination with a polyfunctional polymerizable compound having no sulfur atom in a molecule and/or a monofunctional polymerizable compound as a mixture of these. An embodiment where the sulfur-containing polyfunctional monomer is used solely and an embodiment where a mixture of the sulfur-containing polyfunctional monomer with a monofunctional ethylenic monomer is used are preferable, and an embodiment where a mixture of the sulfur-containing polyfunctional monomer with a monofunctional ethylenic monomer is used is more preferable in view of the engraving sensitivity.

Properties of a film formed from the resin composition of the invention such as brittleness or softness can be adjusted by employing polymerizable compounds, which include the sulfur-containing polyfunctional monomer.

The total amount of the polymerizable compounds, which include the sulfur-containing polyfunctional monomer, in the resin composition of the invention is preferably 10% by mass to 60% by mass, and more preferably 15% by mass to 40% by mass with respect to the amount of nonvolatile components in the resin composition in view of the improvement in softness and brittleness of the cross-linked film formed from the resin composition.

When the sulfur-containing polyfunctional monomer is used together with one or more polymerizable compound(s) other than the sulfur-containing polyfunctional monomer, the amount of the sulfur-containing polyfunctional monomer is preferably 5% by mass or more, and more preferably 10% by mass or more with respect to the total amount of the total amount of the polymerizable compounds.

A polyfunctional polymerizable compound, which is one of the polymerizable compound having no sulfur atom and can be used in combination with the sulfur-containing polyfunctional monomer, is preferably selected from compounds having 2 to 20 terminal ethylenic unsaturated bonds. The family of such compounds is widely known in the pertinent industrial field, and these compounds may be used in the invention without any particular limitations. These compounds respectively have a chemical form such as a monomer, a prepolymer such as a dimer or a trimer, an oligomer, a copolymer thereof, or a mixture of any of these.

Examples of the monomer include unsaturated carboxylic acids (for example, acrylic acid, methacrylic acid, itaconic acid, crotonic acid, isocrotonic acid, maleic acid, and the like), esters thereof, and amides thereof. Preferable examples thereof include esters of an unsaturated carboxylic acid and an aliphatic polyhydric alcohol compound and amides of an unsaturated carboxylic acid and an aliphatic polyvalent amine compound. Further, unsaturated carboxylic acid esters having a nucleophilic substituent such as a hydroxyl group, an amino group or a mercapto group; adducts of an amide with a monofunctional or polyfunctional isocyanate or an epoxy compound; dehydration condensation reaction products of an amide with a monofunctional or polyfunctional carboxylic acid, and the like may also be suitably used. Unsaturated carboxylic acid esters having an electrophilic substituent such as an isocyanate group or an epoxy group; adducts of an amide with a monofunctional or polyfunctional alcohol, an amine or a thiol; unsaturated carboxylic acid esters having a detachable substituent such as a halogen group or a tosyloxy group; substitution reaction products of an amide with a monofunctional or polyfunctional alcohol, an amine or a thiol, are also suitable. A family of compounds formed by modifying the above-described compounds by introducing an unsaturated phosphonic acid, styrene, vinyl ether or the like in place of the unsaturated carboxylic acid may also be used.

Specific examples of the ester monomer formed of an aliphatic polyhydric alcohol compound and an unsaturated carboxylic acid include, as acrylic acid esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethyelne glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomers, and the like.

Specific examples of the ester monomer further include, as methacrylic acid esters, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane, and the like.

Specific examples of the ester monomer further include, as itaconic acid esters, ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and the like.

Specific examples of the ester monomer further include, as crotonic acid esters, ethylene glycol dicrotonate, tetramethylene glycol dicrotonate, pentaerythritol dicrotonate, sorbitol tetracrotonate, and the like.

Specific examples of the ester monomer further include, as isocrotonic acid esters, e ethylene glycol diisocrotonate, pentaerythritol diisocrotonate, sorbitol tetraisocrotonate, and the like.

Specific examples of the ester monomer further include, as maleic acid esters, ethylene glycol dimaleate, triethylene glycol dimaleate, pentaerythritol dimaleate, sorbitol tetramaleate, and the like.

Specific examples of the ester monomer further include the aliphatic alcohol esters as described in Japanese Patent Application Publication (JP-B) Nos. 46-27926 and 51-47334, and JP-A No. 57-196231; the esters having an aromatic skeleton as described in JP-A Nos. 59-5240, 59-5241 and 2-226149; the esters containing an amino group as described in JP-A No. 1-165613; and the like.

Any of the ester monomers may also be used in combination as a mixture.

Specific examples of the amide monomer formed of an aliphatic polyvalent amine compound and an unsaturated carboxylic acid include methylenebisacrylamide, methylenebismethacrylamide, 1,6-hexamethylenebisacrylamide, 1,6-hexamethylenebismethacrylamide, diethylenetriamine trisacrylamide, xylenebisacrylamide, xylenebismethacrylamide, and the like.

Specific examples of the amide monomer further include the amides having a cyclohexylene structure as described in JP-B No. 54-21726.

Examples of the addition polymerizable compound which can be preferably used in the invention further include urethane-based addition polymerizable compounds that are produced using an addition reaction of an isocyanate and a hydroxyl group. Specific examples thereof include the vinylurethane compound containing two or more polymerizable vinyl groups in one molecule as described in JP-B No. 48-41708, which is obtained by adding a vinyl monomer containing a hydroxyl group represented by following Formula (i), to a polyisocyanate compound having two or more isocyanate groups in one molecule, and the like.

  (i)

In Formula (i), R and R' each independently represent H or $CH_3$.

The urethane acrylates described in JP-A No. 51-37193, JP-B Nos. 2-32293 and 2-16765; and the urethane compounds having an ethylene oxide skeleton as described in JP-B Nos. 58-49860, 56-17654, 62-39417 and 62-39418 are also suitable as the polymerizable compound.

When the polymerizable compounds having an amino structure or a sulfide structure in the molecule as described in JP-A Nos. 63-277653, 63-260909 and 1-105238, are used, a curable composition may be obtained in a short time.

Examples of the polymerizable compound further include polyester acrylates such as those described in JP-A No. 48-64183, and JP-B Nos. 49-43191 and 52-30490; and polyfunctional acrylates or methacrylates such as epoxy acrylates obtained by reacting an epoxy resin and (meth)acrylic acid. Examples of the addition polymerizable compound further include the specific unsaturated compounds described in JP-B Nos. 46-43946, 1-40337 and 1-40336; the vinylphosphonic acid compounds described in JP-A No. 2-25493; and the like. In certain cases, the structure containing a perfluoroalkyl group as described in JP-A No. 61-22048 can be suitably used. The compounds introduced in Journal of the Adhesion Society of Japan, Vol. 20, No. 7, pp. 300-308 (1984) as photocurable monomers and oligomers, may also be used as the polymerizable compound.

A monofunctional polymerizable compound, which can be used in combination with the sulfur-containing polyfunctional monomer, is preferably selected from compounds having one terminal ethylenic unsaturated bond. The family of such compounds is widely known in the pertinent industrial field, and these compounds may be used in the invention without any particular limitations.

Examples of the monofunctional polymerizable compound include unsaturated carboxylic acids (for example, acrylic acid, methacrylic acid, itaconic acid, crotonic acid, isocrotonic acid, maleic acid, and the like), esters thereof, and amides thereof. Preferable examples thereof include an esters formed of an unsaturated carboxylic acid and a monofunctional alcohol compound and an amide formed of an unsaturated carboxylic acid and a monofunctional aliphatic amine compound. Examples thereof further include: a unsaturated carboxylic acid ester having a nucleophilic substituent such as a hydroxyl group, an amino group or a mercapto group; adducts of an amide with a monofunctional isocyanate or epoxy compound; and dehydration condensation reaction products of an amide with a monofunctional carboxylic acid. Examples thereof further include: an unsaturated carboxylic acid ester having a an electrophilic substituent such as an isocyanate group or an epoxy group; adducts of an amide with a monofunctional alcohol, an amine or a thiol; an unsaturated carboxylic acid ester having a detachable substituent such as a halogen group or a tosyloxy group; a substitution reaction product of an amide with a monofunctional alcohol, an amine or a thiol. A family of compounds formed by modifying the above-described compounds by introducing an unsaturated phosphonic acid, styrene, vinyl ether or the like in place of the unsaturated carboxylic acid may also be used.

Specific examples of the ester formed of an unsaturated carboxylic acid and a monofunctional aliphatic alcohol compound as the monofunctional polymerizable compound include: (meth)acrylates having a hydroxyl group, such as 2-hydroxyethyl(meth)acrylate, 2-hydroxypropyl(meth)acrylate, 2-hydroxybutyl(meth)acrylate, 3-chloro-2-hydroxypropyl(meth)acrylate and β-hydroxy-β'-(meth)acryloyloxyethyl phthalate; alkyl(meth)acrylates such as methyl(meth)acrylate, ethyl(meth)acrylate, propyl(meth)acrylate, butyl(meth)acrylate, isoamyl(meth)acrylate, 2-ethylhexyl(meth)acrylate, lauryl(meth)acrylate and stearyl(meth)acrylate; cycloalkyl(meth)acrylates such as cyclohexyl(meth)acrylate; halogenated alkyl(meth)acrylates such as chloroethyl(meth)acrylate and chloropropyl(meth)acrylate; alkoxyalkyl(meth)acrylates such as methoxyethyl(meth)acrylate, ethoxyethyl(meth)acrylate and butoxyethyl(meth)acrylate; phenoxyalkyl(meth)acrylates such as phenoxyethyl acrylate and nonylphenoxyethyl(meth)acrylate; and alkoxyalkylene glycol(meth)acrylate such as ethoxydiethylene glycol(meth)acrylate, methoxytriethylene glycol(meth)acrylate and methoxydipropylene glycol(meth)acrylate;

Specific examples of the amide formed of an unsaturated carboxylic acid and a monofunctional aliphatic amine compound as the monofunctional polymerizable compound include: (meth)acrylamides such as (meth)acrylamide, diacetone(meth)acrylamide, and N,N'-methylenebis(meth)acrylamide; 2,2-dimethylaminoethyl(meth)acrylate; 2,2-diethylaminoethyl(meth)acrylate; N,N-dimethylaminoethyl(meth)acrylamide; and N,N-dimethylaminopropyl(meth)acrylamide.

The resin composition of the invention is characterized in containing the sulfur-containing polyfunctional monomer and may achieve excellent engraving sensitivity.

The sulfur-containing polyfunctional monomer used in the invention has, in a molecule thereof, a carbon-sulfur bond having bond dissociation energy which is smaller than that of a carbon-carbon bond. The sulfur-containing polyfunctional monomer can be cross-linked by light and/or heat. A cross-linked product resulted therefrom has a characteristic that the carbon-sulfur bond contained therein can be cleaved at lower temperature than a carbon-carbon bond contained in a cross-linked product resulted from a monomer which contains a carbon-carbon bond only.

As described above, the product prepared by cross-linking the sulfur-containing polyfunctional monomer has the characteristic to cause thermal decomposition at low temperature. This characteristic is considered as the cause of the improved engraving sensitivity of a resin composition of the invention which has been subjected to cross-linking revealed when the resin composition is subjected to laser engraving by irradiation of laser to the resin composition so that the irradiated area is dispersed or scattered.

In preferable embodiments, the resin composition of the invention contains, in addition to (A) a sulfur-containing polyfunctional monomer and (B) a binder polymer which will be mentioned later, a (C) light-heat converting agent which is able to absorb the light having a wavelength of 700 nm to 1,300 nm (hereinafter, it may be simply called "a light-heat converting agent") in view of being applied to uses employing infrared laser.

The laser engraving which uses near infrared laser and performed with the resin composition of such embodiments may basically include a series of five processes of (1) absorption of light by the light-heat converting agent (C), (2) light-heat conversion by the light-heat converting agent (C), (3) conduction of heat from the light-heat converting agent to a cross-linked product (polymerized product) of the binder polymer (B) and/or the sulfur-containing polyfunctional monomer (A) existing nearby, (4) thermal decomposition of the binder polymer and/or the cross-linked product (polymerized product) of the sulfur-containing polyfunctional monomer (A) and (5) dispersing or scattering of the decomposed binder polymer (B) and/or cross-linked product (polymerized product) of the sulfur-containing polyfunctional monomer (A).

As mentioned above, the sulfur-containing polyfunctional monomer (A) has a thermal decomposition characteristic at low temperature. An effect of promoting the thermal decomposition, whereby the laser engraving sensitivity of the resin composition is made to be very high, can be resulted in the process (4) due to the low-temperature thermal decomposition characteristic. The thermal decomposition-promoting effect can be particularly enhanced when the sulfur-containing polyfunctional monomer contains C—SS bond, —NH—C(=O)—S— bond and/or —NH—C(=S)—S— bond. This enhancement is considered as being caused since a bond dissociation energy of each of S—S bond, C(=O)—S bond and C(=S)—S bond is smaller than that of C—S—C bond. The effect can be particularly remarkable when the sulfur-containing polyfunctional monomer has a C—SS bond.

An effect of enhancing the engraving sensitivity of the resin composition of the invention can be remarkable when a poly(hydroxycarboxylic acid) ester such as polylactic acid, which is mentioned in the following, is used as the binder polymer (B) which is to be combined with the sulfur-containing polyfunctional monomer (A). It is presumably due to a phenomenon that, in the process (4), a nucleophilic site generated by the thermal decomposition of the binder polymer (B) conducts a nucleophilic attack to a cross-linked product (polymerized product) of the sulfur-containing polyfunctional monomer (A) whereby decomposition of the cross-linked product is promoted. It is also assumed that, when a substance which is apt to be depolymerized is used as the binder polymer (B), the binder polymer (B) can be decomposed into smaller fragments during the process (4) whereby dispersing of the decomposed product can effectively take place and the engraving sensitivity can be enhanced.

Hereinafter, illustration will be made for the binder polymer (B), which is an essential ingredient of the resin composition of the invention, and also for an optional ingredient such as a light-heat converting agent (C), which is able to absorb the light having a wavelength of 700 nm to 1,300 nm, a polymerization initiator or the like.

(B) Binder Polymer

The resin composition for laser engraving of the invention contains a binder polymer (B).

The binder polymer is contained in the resin composition for laser engraving as a main ingredient thereof. Usually, thermoplastic resins, thermoplastic elastomers, or the like are used as the binder polymer depending on the purpose with a viewpoint of improving recording sensitivity to laser.

In view of improving the laser engraving sensitivity of the resin composition, a polymer having a partial structure which thermally degrades by exposure or heating can be preferably used as the binder polymer (B).

In the case of using the resin composition for the purpose of forming a pliable film having flexibility, a soft resin or a thermoplastic elastomer can be selected as the binder polymer (B).

It is preferable to use a hydrophilic polymer or an alcoholphilic polymer as the binder polymer (B) from the viewpoints of the ease of preparation of a composition for relief forming layer and/or providing, to a relief printing plate obtained from the resin composition, an improved resistance to oily ink.

In the case of using the resin composition for the purpose of curing thereof by heating or exposure to enhance its strength, a polymer having a carbon-carbon unsaturated bond in the molecule can be selected as the binder polymer (B).

As such, binder polymers may be selected as the binder polymer (B) in the invention in accordance with the purpose, with taking into consideration of the properties according to the applications of the resin composition for laser engraving, and one species or a combination of two or more species of such binder polymers may be used.

The total amount of the binder polymer is preferably in a range of 1% by mass to 99% by mass, and is more preferably in a range of 5% by mass to 80% by mass, relative to the total solid content of the resin composition for laser engraving of the invention.

Hereinafter, various polymers that may be used as the binder polymer (B) in the invention will be described.

Polymer Having Decomposability

Examples of the binder polymer (B) which may be preferably used from the viewpoint of assuring the laser engraving sensitivity include a polymer having a partial structure which can be decomposed by being imparted with energy by means of exposure and/or heating.

Examples of the polymer having decomposability include those polymers containing, as a monomer unit having in the molecular chain a partial structure which is likely to be decomposed and cleaved, styrene, α-methylstyrene, α-methoxystyrene, acryl esters, methacryl esters, ester compounds other than those described above, ether compounds, nitro compounds, carbonate compounds, carbamoyl compounds, hemiacetal ester compounds, oxyethylene compounds, aliphatic cyclic compounds, and the like.

Among these, polyethers such as polyethylene glycol, polypropylene glycol and polytetraethylene glycol, aliphatic polycarbonates, aliphatic carbamates, polymethyl methacrylate, polystyrene, nitrocellulose, polyoxyethylene, polynorbornene, polycyclohexadiene hydrogenation products, or a polymer having a molecular structure having many branched structures such as dendrimers, may be particularly preferably exemplified in terms of decomposability.

A polymer containing a number of oxygen atoms in the molecular chain is preferable from the viewpoint of decomposability. From this point of view, compounds having a carbonate group, a carbamate group or a methacryl group in the polymer main chain, may be suitably exemplified. For example, a polyester or polyurethane synthesized from a (poly)carbonate diol or a (poly)carbonate dicarboxylic acid as the raw material, a polyamide synthesized from a (poly)carbonate diamine as the raw material, and the like may be exemplified as the examples of polymers having good thermal decomposability. These polymers may also be those containing a polymerizable unsaturated group in the main chain or the side chains. Particularly, when the thermally decomposable polymer has a reactive functional group such as a hydroxyl group, an amino group or a carboxyl group, it is easy to introduce a polymerizable unsaturated group into such polymer.

It is also possible to use a polyester containing a hydroxylcarboxylic acid unit such as polylactic acid as the thermally decomposable polymer. Specific preferable examples of such polyester include polyhydroxy alkanoate (PHA), lactic acid polymer, polyglycolic acid (PGA), polycaprolactone (PCL), poly(butylenesuccinic acid), modified compounds thereof and mixtures of any of them.

Thermoplastic Polymer

Examples of the binder polymer (B) which may be preferably used from the viewpoint of assuring the laser engraving sensitivity further include a thermoplastic polymer.

The thermoplastic polymer may be an elastomer or a non-elastomer resin, and may be selected according to the purpose of the resin composition for laser engraving of the invention.

Examples of the thermoplastic elastomer include urethane thermoplastic elastomers, ester thermoplastic elastomers, amide thermoplastic elastomers, silicone thermoplastic elastomers and the like. For the purpose of enhancing the laser engraving sensitivity of such a thermoplastic elastomer, an elastomer in which an easily decomposable functional group such as a carbamoyl group or a carbonate group has been introduced into the main chain, may also be used. A thermoplastic polymer may also be used as a mixture with the thermally decomposable polymer.

The thermoplastic elastomer is a material showing rubber elasticity at normal temperature, and the molecular structure includes a soft segment such as polyether or a rubber molecule, and a hard segment which prevents plastic deformation near normal temperature, as vulcanized rubber does. There exist various types of hard segments, such as frozen state, crystalline state, hydrogen bonding and ion bridging. Such thermoplastic elastomers may be suitable in the case of applying the resin composition for laser engraving of the invention to the production of, for example, relief printing plates requiring plasticity, such as flexo plates.

The kind of the thermoplastic elastomer can be selected according to the purpose. For example, in the case where solvent resistance is required, urethane thermoplastic elastomers, ester thermoplastic elastomers, amide thermoplastic elastomers and fluorine thermoplastic elastomers are preferable. In the case where thermal resistance is required, urethane thermoplastic elastomers, olefin thermoplastic elastomers, ester thermoplastic elastomers and fluorine thermoplastic elastomers are preferable. The hardness of a film formed from the resin composition of the invention can be significantly varied by selecting the kind of the thermoplastic elastomer.

Examples of the non-elastomeric resin include polyester resins include unsaturated polyester resins, polyamide resins, polyamideimide resins, polyurethane resins, unsaturated polyurethane resins, polysulfone resins, polyethersulfone resins, polyimide resins, polycarbonate resins, all aromatic polyester resins, and hydrophilic polymers containing hydroxyethylene units (such as a polyvinyl alcohol compound).

Hydrophilic Polymer and Alcohol-Philic Polymer

In view of improving removability of a waste (engraving waste) which may be generated in engraving the relief printing plate precursor using the resin composition of the invention, the binder polymer used in the invention is preferably a hydrophilic polymer or an alcohol-philic polymer. More specifically, examples of the hydrophilic polymer include those which will be described in the following. Among them, a hydrophilic polymer containing a hydroxyethylene unit is preferable. Preferable examples of the hydrophilic polymer or the alcohol-philic polymer further include polyvinylbutyral.

Details of the hydrophilic polymer, which is one preferable embodiment of the binder polymer, is given below.

The hydrophilic polymer herein refers to a water-soluble or water-swellable polymer. Specifically, the term "water-soluble" polymer herein refers to a polymer which dissolves in water at 25° C. in a proportion of 5% by mass or more with respect to the total amount of the water-polymer mixture, and the term "water-swellable" polymer herein refers to a polymer which absorbs water and expands such that the polymer does not seem to be dissolved by eye observation, but there is no obvious solid state (powdered state) precipitate when the polymer is added to water at 25° C. in a proportion of 5% by mass with respect to the total amount of the water-polymer mixture.

One hydrophilic polymer can be used singly, or two or more hydrophilic polymers can be used in combination.

Examples of the hydrophilic polymer include hydrophilic polymers having a hydroxyethylene unit; polysaccharides having hydrophilic functional groups, including celluloses; acrylic resins having a salt structure with neutralized acidic functional groups, such as sodium polyacrylate, or a salt structure with neutralized amino groups, or an onium structure; polyamide resins or polyester resins having a hydrophilic group such as polyethylene oxide introduced into the molecule; gelatin; and the like.

Examples of the hydrophilic polymer which are preferable from the viewpoint of exhibiting good hydrophilicity include hydrophilic polymers containing hydroxyethylene; celluloses containing a polar group such as an amino group, or a carboxylic acid group/sulfonic acid group/sulfuric acid group or a group having a salt structure obtained by neutralizing one of these groups; acrylic resins containing a polar group such as an amino group, or a carboxylic acid group/sulfonic acid group/sulfuric acid group or a group having a salt structure obtained by neutralizing one of these groups; and polyamide resins.

More preferable examples thereof include hydrophilic polymers containing hydroxyethylene; acrylic resins containing a polar group such as an amino group, or a carboxylic acid group/sulfonic acid group/sulfuric acid group or a group having a salt structure obtained by neutralizing one of these groups; and polyamide resins, while even more preferable examples include polyvinyl alcohols and polyamide resins.

Example of the hydrophilic polymer which are particularly preferable from the viewpoint of having film formability and having resistance to UV ink include a polyvinyl alcohol (PVA) compound.

The scope of the PVA compound herein includes copolymers and polymers containing a hydroxyethylene unit in a proportion of from 0.1% by mole to 100% by mole, preferably 1% by mole to 98% by mole, and more preferably 5% by mole to 95% by mole, as well as modification products thereof.

The monomer for forming the copolymer by being combined with a vinyl alcohol structural unit may be appropriately selected from known copolymerizable monomers.

Particularly preferable examples of PVA compound include PVA, a vinyl alcohol/vinyl acetate copolymer (partially saponified-polyvinyl alcohol), and modified products thereof.

Examples of the PVA compound include a polymer in which at least a part of the hydroxyl groups of the hydroxyethylene unit have been modified into carboxyl groups; a polymer in which at least a part of the hydroxyl groups of the hydroxyethylene unit have been modified into (meth)acryloyl groups; a polymer in which at least a part of the hydroxyl groups of the hydroxyethylene unit have been modified into amino groups; a polymer in which ethylene glycol or propylene glycol, or an oligomer thereof has been introduced into at least a part of the hydroxyl groups of the hydroxyethylene unit; and the like.

The polymer in which at least a part of the hydroxyl groups have been modified into carboxyl groups may be obtained by esterifying polyvinyl alcohol or a partially saponified polyvinyl alcohol with a polyfunctional carboxylic acid such as, for example, succinic acid, maleic acid or adipic acid. The amount of introduction of carboxyl groups into the polymer is preferably 0.01 mole to 1.00 mole, and more preferably 0.05 mole to 0.80 moles, relative to 1 mole of the hydroxyl groups.

The polymer in which at least a part of the hydroxyl groups have been modified into (meth)acryloyl groups, may be obtained by adding glycidyl(meth)acrylate to the above-mentioned carboxyl group-modified polymer, or by esterifying polyvinyl alcohol or a partially saponified polyvinyl alcohol with (meth)acrylic acid. The amount of introduction of (meth)acryloyl groups into the polymer is preferably 0.01 mole to 1.00 mole, and more preferably 0.03 mole to 0.50 moles, relative to 1 mole of the hydroxyl groups. Here, the expression "(meth)acryloyl group" is used to collectively refer to acryloyl group and/or methacryloyl group. Also, the expression "(meth)acrylate" is used to collectively refer to acrylate and/or methacrylate. The same applies to the expression "(meth)acrylic acid".

The polymer in which at least a part of the hydroxyl groups have been modified into amino groups may be obtained by esterifying polyvinyl alcohol or a partially saponified polyvinyl alcohol with a carboxylic acid containing an amino group such as carbamic acid. The amount of introduction of amino groups into the polymer is preferably 0.01 mole to 1.00 mole, more preferably 0.05 mole to 0.70 moles, relative to 1 mole of the hydroxyl groups.

The polymer in which ethylene glycol or propylene glycol, or an oligomer thereof has been introduced into at least a part of the hydroxyl groups, may be obtained by heating polyvinyl alcohol or a partially saponified polyvinyl alcohol and a glycol in the presence of catalytic sulfuric acid, and removing water, which is a side product, out of the reaction system. The total amount of introduction of ethylene glycol or propylene glycol, or an oligomer thereof into the polymer is preferably 0.01 mole to 0.90 moles, and more preferably 0.03 mole to 0.50 moles, relative to 1 mole of the hydroxyl groups.

In a preferable embodiment, the polymer in which at least a part of hydroxyl groups have been modified into (meth)acryloyl groups can be selected among the modification products of the PVA compounds. It can be because the direct introduction of an unreacted crosslinkable functional group into the hydrophilic polymer may enable to enhance the strength of a cross-linked product formed by subjecting the resin composition of the invention to cross-linking without using a large amount of the sulfur-containing polyfunctional monomer (A) so that both of the flexibility and strength of the cross-linked product can be achieved. When the resin composition of such embodiment is applied to a relief forming layer of a relief printing plate precursor, the relief forming layer can be provided with both of the flexibility and the strength.

A hydrophilic polymer which does not contain a hydroxyethylene unit and has a polarity, the degree of which is near to that of the PVA compound to the extent that the hydrophilic polymer is compatible with to PVA compound (hereinafter, may also be appropriately referred to as "non-PVA compound"), can be preferably used in combination with one or more of the PVA compound(s).

Specific examples of the non-PVA compound include: a hydrophilic polyamide obtained by introducing a hydrophilic group (such as polyethylene glycol or piperazine) into a non-water-soluble polyamide obtainable by polymerization of adipic acid, 1,6-hexanediamine or ε-caprolactam only. The hydrophilic polyamide can be preferably used as the non-PVA compound due to its compatibility with the PVA compound exhibited by the hydrophilic group. More specifically, the hydrophilic polyamide has good compatibility with the PVA compounds, and easily infiltrates between the molecules of PVA compounds, so that the intermolecular force between two hydrophilic polymers can be decreased and the polymer can be softened as a whole.

Examples of the method for synthesis of the hydrophilic polyamide include the followings.

When ε-caprolactam and/or adipic acid is reacted with a polyethylene glycol modified with amine at both chain ends, polyamide having a polyethylene glycol unit is obtained. When ε-caprolactam and/or adipic acid is reacted with piperazine, a hydrophilic polyamide having a piperazine skeleton is obtained.

When an amide group of a hydrophilic polyamide is reacted with an epoxy group of glycidyl methacrylate, a hydrophilic polyamide having a crosslinkable functional group introduced into the polymer molecule is obtained.

Hydrophobic Polymer

The binder polymer may contain a relatively hydrophobic binder polymer. Polymers including the monomers shown below as a component of polymerization or copolymerization can be used as the relatively hydrophobic binder polymer so as to adjust the properties such as the film hardness or flexibility of a film formed from the resin composition, and compatibilities with other components such as co-present polymerizable compounds or initiator.

Compounds having only one ethylenic unsaturated bond, such as: (meth)acrylates having a hydroxyl group, such as 2-hydroxyethyl(meth)acrylate, 2-hydroxypropyl(meth)acrylate, 2-hydroxybutyl(meth)acrylate, 3-chloro-2-hydroxypropyl(meth)acrylate and β-hydroxy-β'-(meth)acryloyloxyethyl phthalate; alkyl(meth)acrylates such as methyl(meth)acrylate, ethyl(meth)acrylate, propyl(meth)acrylate, butyl(meth)acrylate, isoamyl(meth)acrylate, 2-ethylhexyl(meth)acrylate, lauryl(meth)acrylate and stearyl(meth)acrylate; cycloalkyl(meth)acrylates such as cyclohexyl(meth)acrylate; halogenated alkyl(meth)acrylates such as chloroethyl(meth)acrylate and chloropropyl(meth)acrylate; alkoxyalkyl(meth)acrylates such as methoxyethyl(meth)acrylate, ethoxyethyl(meth)acrylate and butoxyethyl(meth)acrylate; phenoxyalkyl(meth)acrylates such as phenoxyethyl acrylate and nonylphenoxyethyl(meth)acrylate; alkoxyalkylene glycol(meth)acrylate such as ethoxydiethylene glycol(meth)acrylate, methoxytriethylene glycol(meth)acrylate and methoxydipropylene glycol(meth)acrylate; (meth)acrylamides such as (meth)acrylamide, diacetone(meth)acrylamide, and N,N'-methylenebis(meth)acrylamide; 2,2-dimethylaminoethyl(meth)acrylate, 2,2-diethylaminoethyl(meth)acrylate, N,N-dimethylaminoethyl(meth)acrylamide and N,N-dimethylaminopropyl(meth)acrylamide; compounds having two or more ethylenic unsaturated bonds, such as: di(meth)acrylate of polyethylene glycol, such as diethylene glycol di(meth)acrylate; polypropylene glycol di(meth)acrylate such as dipropylene glycol di(meth)acrylate; trimethylolpropane tri(meth)acrylate, pentaerythritol tri(meth)acrylate, pentaerythritol tetra(meth)acrylate, glycerol tri(meth)acrylate; polyvalent(meth)acrylates obtainable by subjecting a compound having an ethylenic unsaturated bond and active hydrogen, such as an unsaturated carboxylic acid or unsaturated alcohol, to addition reaction to ethylene glycol diglycidyl ether; polyvalent(meth)acrylates obtainable by subjecting an unsaturated epoxy compound such as glycidyl(meth)acrylate, and a compound having active hydrogen, such as a carboxylic acid or an amine, to addition reaction; polyvalent (meth)acrylamides such as methylenebis(meth)acrylamide; polyvalent vinyl compounds such as divinylbenzene; and the like may be mentioned. According to the invention, these may be used individually alone, or in combination of two or more species.

Examples of the monomer of the polymerization component which is preferable from the viewpoint of film formability of the resin composition include alkoxyalkylene glycol (meth)acrylates such as 2-hydroxyethyl(meth)acrylate, 2-hydroxypropyl(meth)acrylate, 2-hydroxybutyl(meth)acrylate, ethoxydiethylene glycol(meth)acrylate, methoxytriethylene glycol(meth)acrylate and methoxydipropylene glycol (meth)acrylate; (meth)acrylamide, diacetone(meth)acrylamide, cyclohexyl(meth)acrylate, benzyl(meth)acrylate, and N-acryloylmorpholine are preferable. Among these, acrylates are particularly preferable from the viewpoint of securing the flexibility of the polymer obtainable therefrom.

In addition to these, examples the polymer which may be used as the binder polymer further include the following polymers.

A polymer containing at least either an olefin or a carbon-carbon triple bond in the main chain may be mentioned, and examples thereof include SB (polystyrene-polybutadiene), SBS (polystyrene-polybutadiene-polystyrene), SIS (polystyrene-polyisoprene-polystyrene), and SEBS (polystyrene-polyethylene/polybutylene-polystyrene).

Polymer Having Carbon-Carbon Unsaturated Bond

A polymer having carbon-carbon unsaturated bonds in the molecule may be suitably used as the binder polymer (B). The carbon-carbon unsaturated bonds may be present in either the main chain or the side chains, or may also be present in both of the chains. Hereinafter, the carbon-carbon unsaturated bond may also be simply referred to as an "unsaturated bond", and a carbon-carbon unsaturated bond present at an end of the main chain or the side chain may also be referred to as a "polymerizable group".

In the case where the polymer has carbon-carbon unsaturated bonds in the main chain thereof, the polymer may have the unsaturated bonds at one terminal therof, at both terminals therof, and/or within the main chain therof. Furthermore, in the case where the polymer has carbon-carbon unsaturated bonds in a side chain thereof, the unsaturated bonds may be directly attached to the main chain, and/or may be attached to the main chain via an appropriate linking group.

Examples of the polymer containing carbon-carbon unsaturated bonds in the main chain include SB (polystyrene-polybutadiene), SBS (polystyrene-polybutadiene-polystyrene), SIS (polystyrene-polyisoprene-polystyrene), SEBS (polystyrene-polyethylene/polybutylene-polystyrene), and the like.

In the case of using a polymer having a highly reactive polymerizable unsaturated group such as a methacryloyl group as the polymer having carbon-carbon unsaturated bonds in the side chain, a film having very high mechanical strength may be produced. Particularly, highly reactive polymerizable unsaturated groups may be relatively easily introduced into the molecule into polyurethane thermoplastic elastomers and polyester thermoplastic elastomers.

Any known method may be employed for introducing unsaturated bonds or polymerizable groups into the binder polymer. Examples of the method include: a method of copolymerizing the polymer with a structural unit having a polymerizable group precursor which is formed by attaching a protective group to the polymerizable group, and eliminating the protective group to restore the polymerizable group; and a method of producing a polymer compound having a plurality of reactive groups such as a hydroxyl group, an amino group, an epoxy group, a carboxyl group, an acid anhydride group, a ketone group, a hydrazine residue, an isocyanate group, an isothiacyanate group, a cyclic carbonate group or an ester group, subsequently reacting the polymer compound with a binding agent which has a plurality of groups capable of binding with the reactive group (for example, polyisocyanate and the like for the case of a hydroxyl group or an amino group), to thereby carry out adjustment of the molecular weight and conversion to a bindable group at the chain end, and then reacting this group which is capable of reacting with the terminal bindable group, with an organic compound having a polymerizable unsaturated group, to thus introduce a polymerizable group by means of a polymer reaction. When these methods are used, the amount of introduction of the unsaturated bond or the polymerizable group into the polymer compound may be controlled.

It is also preferable to use the polymer having an unsaturated bond in combination with a polymer which does not have an unsaturated bond. That is, since a polymer obtainable by adding hydrogen to the olefin moiety of the polymer having carbon-carbon unsaturated bonds, or a polymer obtainable by forming a polymer using as a raw material a monomer in which an olefin moiety has been hydrogenated, such as a monomer resulting from hydrogenation of butadiene, isoprene or the like, has excellent compatibility, the polymer may be used in combination with the polymer having unsaturated bonds, so as to regulate the amount of unsaturated bonds possessed by the binder polymer. In the case of using these in combination, the polymer which does not have unsaturated bonds may be used in a proportion of generally 1 parts by mass to 90 parts by mass, and preferably 5 parts by mass to 80 parts by mass, relative to 100 parts by mass of the polymer having unsaturated bonds.

As will be discussed later, in aspects where curability is not required for the binder polymer, such as in the case of using another polymerizable compound in combination, the binder polymer does not necessarily contain an unsaturated bond, and a variety of polymers which do not have unsaturated bonds may be solely used as the binder polymer in the relief forming layer. Examples of the polymer which does not have unsaturated bonds and can be used in such a case include polyesters, polyamides, polystyrene, acrylic resins, acetal resins, polycarbonates and the like.

The binder polymer suitable for the use in the invention, which may or may not have unsaturated bonds, has a number average molecular weight preferably in the range of from 1,000 to 1,000,000, and more preferably in the range of from 5,000 to 500,000. When the number average molecular weight of the binder polymer is in the range of 1,000 to 1,000,000, the mechanical strength of the film to be formed may be secured. Here, the number average molecular weight is a value measured using gel permeation chromatography (GPC), and reduced with respect to polystyrene standard products with known molecular weights.

The binder polymer suitable for the use in the invention preferably has a weight average molecular weight of in the range of from 5,000 to 500,000. When the weight average molecular weight of the binder polymer is 5,000 or more, the binder polymer may have excellent property to maintain its shape as a simple resin substance. When the weight average molecular weight of the binder polymer is 500,000 or less, the binder polymer may have excellent solubility to solvents such as water to be suitable for preparation of the resin composition for laser engraving. The weight average molecular weight of the binder polymer is more preferably in the range of from 10,000 to 400,000, and particularly preferably in the range of from 15,000 to 300,000.

The content of the binder polymer in the resin composition for laser engraving is preferably 15% by mass to 79% by mass, and more preferably 30% by mass to 65% by mass, with respect to the total mass of the solid content of the resin composition for laser engraving. When the content of the binder polymer is set to 15% by mass or more, a printing plate precursor having a relief forming layer containing the resin composition may provide a printing plate having a sufficient print durability as a printing plate. Also, when the content of the binder polymer is set to 79% by mass or less, there can be no occurrence of the lack of other components, and a flexibility as a printing plate which is sufficient to be used for flexo printing may be provided to the relief printing plate resulting therefrom.

In the invention, the engraving sensitivity can be further enhanced when the sulfur-containing polyfunctional monomer (A) is used in combination with a poly(hydroxycarboxylic acid) ester such as polylactic acid. It is presumably due to a phenomenon that, as described above, the active moiety (nucleophilic site) generated by the depolymerization (thermal decomposition) of the polylactic acid conducts a nucleophilic attack on the cross-linked product (polymerized product) of the sulfur-containing polyfunctional monomer (A) whereby decomposition of the cross-linked product can be promoted.

The resin composition for laser engraving of the invention preferably contains, together with the specific binder polymer (A) and the binder polymer (B) described as the essential ingredient, arbitrary ingredients. Examples of the arbitrary ingredients include a photothermal conversing agent, a polymerization initiator and a plasticizer. Each of such ingredients is more specifically explained below.

(C) Light-Heat Converting Agent

The composition for laser engraving of the invention preferably contains a light-heat converting agent which absorbs light having a wavelength which is in a range of 700 nm to 1,300 nm. Namely, the light-heat converting agent which can be used in the invention has a maximum absorption wavelength of 700 nm to 1,300 nm.

The light-heat converting agent can be used as an infrared-ray absorbing agent when the composition for laser engraving of the invention is applied to laser engraving which uses a laser which emits light having a wavelength of 700 nm to 1,300 nm (such as a YAG laser, a fiber laser or a surface emitting laser) as a light source. The light-heat converting agent absorbs laser light to generate heat, which enhances thermal decomposition of the resin composition. The light-heat converting agent which can be used in the invention is preferably a dye or a pigment, the maximum absorption wavelength of which being in the range of 700 nm to 1,300 nm.

Commercially available dyes and known dyes that are described in literatures such as "Handbook of Dyes" (edited by the Society of Synthetic Organic Chemistry, Japan, 1970), may be used as for the dye. Specific examples thereof include azo dyes, metal complex azo dyes, pyrazolone azo dyes, naphthoquinone dyes, anthraquinone dyes, phthalocyanine dyes, carbonium dyes, diimmonium compounds, quinonimine dyes, methine dyes, cyanine dyes, squarylium colorants, pyrylium salts, and metal thiolate complexes.

Preferable examples of the dye include the cyanine dyes described in JP-A Nos. 58-125246, 59-84356, 59-202829, 60-78787 and the like; the methine dyes described in JP-A Nos. 58-173696, 58-181690, 58-194595, and the like; the naphthoquinone dyes described in JP-A Nos. 58-112793, 58-224793, 59-48187, 59-73996, 60-52940, 60-63744 and the like; the squarylium colorants described in JP-A No. 58-112792 and the like; the cyanine dyes described in U.K. Patent No. 434,875; and the like Preferable examples of the dye further include the near-infrared absorption sensitizers described in U.S. Pat. No. 5,156,938, the substituted arylbenzo(thio)pyrylium salts described in U.S. Pat. No. 3,881,924; the trimethinethiapyrylium salts described in JP-A No. 57-142645 (U.S. Pat. No. 4,327,169); the pyrylium-compounds described in JP-A Nos. 58-181051, 58-220143, 59-41363, 59-84248, 59-84249, 59-146063 and 59-146061; the cyanine dyes described in JP-A No. 59-216146; the pentamethinethiopyrylium salts and the like described in U.S. Pat. No. 4,283,475; and the pyrylium compounds described in JP-B Nos. 5-13514 and 5-19702. Preferable examples of the dye furthermore include the near-infrared absorption dyes represented by formulae (I) and (II) in U.S. Pat. No. 4,756,993.

Preferable examples of the light-heat converting agent of the invention include the specific indolenine cyanine colorants described in JP-A No. 2002-278057.

Particularly preferable examples among these dyes include cyanine colorants, squarylium colorants, pyrylium salts, nickel thiolate complexes, and indolenine cyanine colorants. Cyanine colorants or indolenine cyanine colorants are even more preferable.

Specific examples of the cyanine colorants which may be suitably used in the invention include those described in paragraphs 0017 to 0019 of JP-A No. 2001-133969, paragraphs 0012 to 0038 of JP-A No. 2002-40638, and paragraphs 0012 to 0134 of JP-A No. 2002-23360.

The colorants represented by following Formula (6) or Formula (7) are preferable from the viewpoint of light-heat converting property.

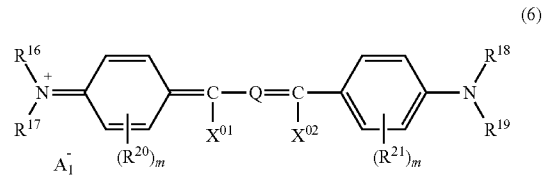

(6)

In Formula (6), $R^{16}$ to $R^{19}$ each independently represent a hydrogen atom, an alkyl group or an aryl group; $R^{20}$ and $R^{21}$ each independently represent an alkyl group, a substituted oxy group, or a halogen atom; n and m each independently represent an integer from 0 to 4; $R^{16}$ and $R^{17}$, or $R^{18}$ and $R^{19}$ may be respectively be bound to each other to form a ring, and $R^{16}$ and/or $R^{17}$ may be bound to $R^{20}$, and $R^{18}$ and/or $R^{19}$ may be bound to $R^{21}$, to respectively form a ring; if a plurality of $R^{20}$ are present, the $R^{20}$s may be bound to each other to form a ring; if a plurality of $R^{21}$ are present, the $R^{21}$s may be bound to each other to form a ring; $X^{01}$ and $X^{02}$ each independently represent a hydrogen atom, an alkyl group or an aryl group, and at least one of $X^{01}$ and $X^{02}$ represents a hydrogen atom or an alkyl group; Q represents a trimethine group or pentamethine group which may be substituted, and may form a cyclic structure together with a divalent organic group; and $A_1^-$ represents a counter-anion. However, if the colorant represented by formula (6) has an anionic substituent in the structure and does not require charge neutralization, $A_1^-$ is not necessary. Preferably, $A_1^-$ is a halogen ion, a perchloric acid ion, a tetrafluoroborate ion, a hexafluorophosphate ion or a sulfonic acid ion, from the viewpoint of the storage stability of the photosensitive layer coating solution, and particularly preferably, $A_1^-$ is a perchloric acid ion, a hexafluorophosphate ion or an arylsulfonic acid ion.

Specific examples of the dyes represented by Formula (6), which may be suitably used in the invention, include those shown below.

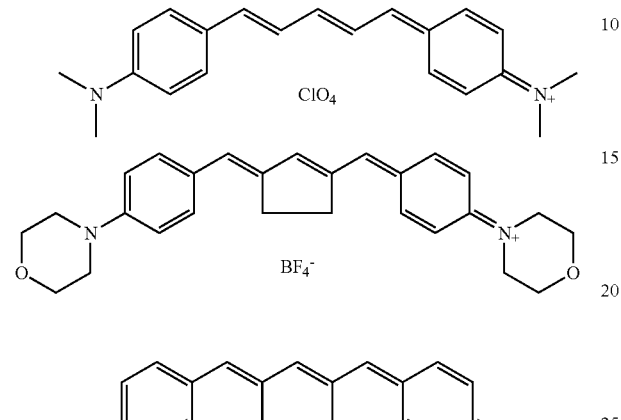

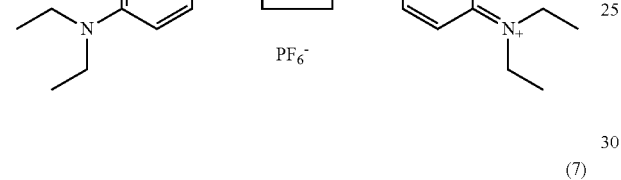

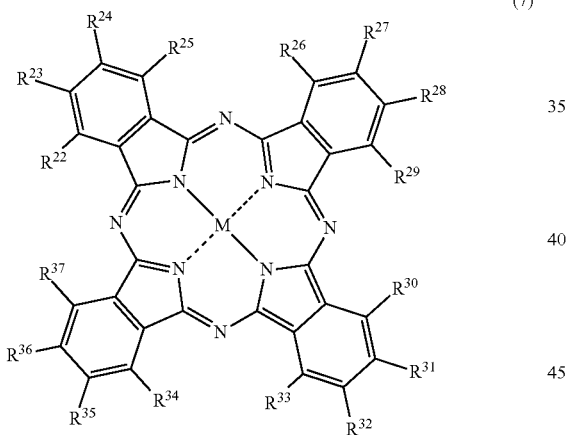

(7)

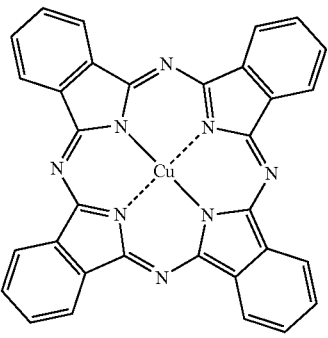

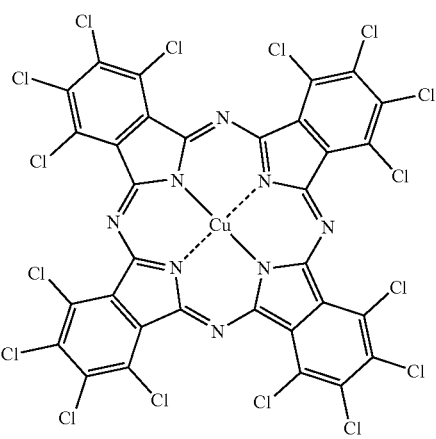

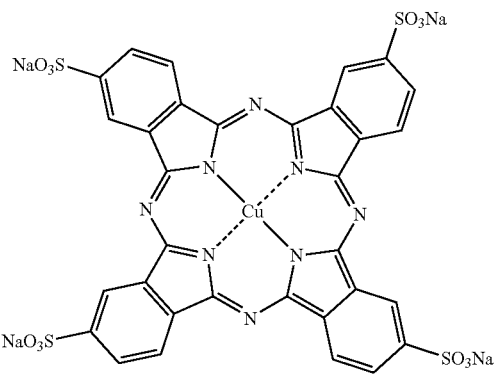

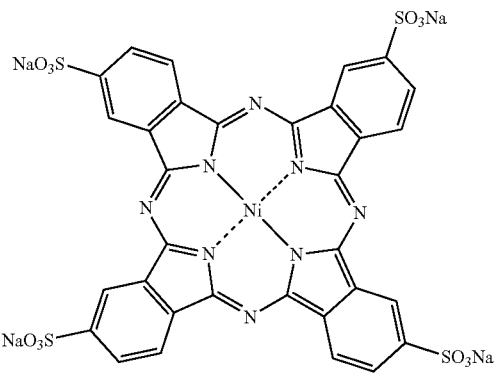

In Formula (7), $R^{22}$ to $R^{37}$ each independently represent a hydrogen atom, a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group, or an onium salt structure. These groups may be substituted if it is possible to have a substituent. M represents two hydrogen atoms or metal atoms, a halo-metal group, or an oxy-metal group, and as the metal atoms included therein, there may be mentioned the atoms of Groups IA, IIA, IIIB and IVB of the Period Table of Elements, the first-row, second-row and third-row transition metals, and lanthanoid elements. Among them, copper, magnesium, iron, zinc, cobalt, aluminum, titanium and vanadium are preferable.

Specific examples of the dyes represented by Formula (7), which may be suitably used in the invention, include those shown below.

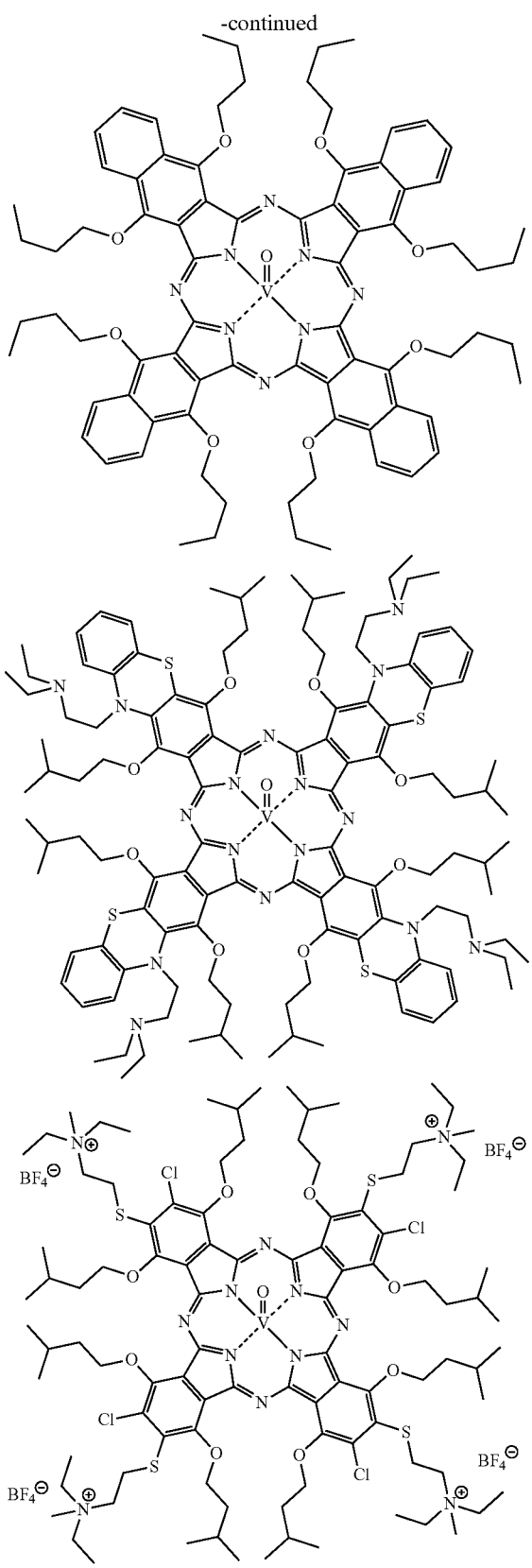

Examples of the pigment which may be used in the invention include commercially available pigments, and the pigments described in the Color Index (C.I.) Handbook, "Handbook of New Pigments" (edited by Japan Association of Pigment Technology, 1977), "New Pigment Application Technology" (published by CMC, Inc., 1986), and "Printing Ink Technology" (published by CMC, 1984).

Examples of the pigments include black pigments, yellow pigments, orange pigments, brown pigments, red pigments, magenta pigments, blue pigments, green pigments, fluorescent pigments, metal powder pigments, and other polymer-bound pigments. Specifically, insoluble azo pigments, azo lake pigments, condensed azo pigments, chelate azo pigments, phthalocyanine pigments, anthraquinone pigments, perylene- and perinone pigments, thio indigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, carbon black, and the like may be used. Among these pigments, carbon black is preferable.

These pigments may be used without being subjected to a surface treatment, or may be used after being subjected to a surface treatment. Examples of a method of the surface treatment include a method of coating the pigment surface with resin or wax, a method of adhering surfactants to the pigment surface, a method of binding a reactive substance (for example, a silane coupling agent, an epoxy compound, polyisocyanate, or the like) to the pigment surface, and the like. These surface treatment methods are described in "Properties and Applications of Metal Soaps" (published by Saiwai Shobo Co., Ltd.), "Printing Ink Technology" (published by CMC, Inc., 1984), and "New Pigment Application Technology" (published by CMC, Inc., 1986).

The particle size of the pigment is preferably in the range of 0.01 µm to 10 µm, more preferably in the range of 0.05 µm to 1 µm, and particularly preferably in the range of 0.1 µm to 1 µm. When the particle size of the pigment is 0.01 µm or larger, the dispersion stability of the pigment in the coating solution can be increased. Also, when the particle size is 10 µm or less, the uniformity of the layer formed from the resin composition can be improved.

Any known dispersing technologies that are used in the production of ink or in the production of toner may be used as the method for dispersing the pigment. Examples of the dispersing instrument used in the dispersing include an ultrasonic dispersing machine, a sand mill, an attritor, a pearl mill, a super mill, a ball mill, an impeller, a disperser, a KD mill, a colloid mill, Dynatron, a triple-roll mill, a pressurized kneader, and the like. Details are described in "New Pigment Application Technology" (published by CMC, Inc., 1986).

In embodiments, the light-heat converting agent used in the invention can be at least one selected from cyanine compounds and phthalocyanine compounds, which are preferable from the viewpoint of high engraving sensitivity. The engraving sensitivity tends to be further increased and is thus preferable when at least one of these light-heat converting agents are used in a combination under a condition that the thermal decomposition temperature of the light-heat converting agent is equal to or higher than the thermal decomposition temperature of a hydrophilic polymer which is suitable as the binder polymer.

Specific examples of the light-heat converting agent that may be used in the invention include a colorant which have a maximum absorption wavelength in the range of 700 nm to 1,300 nm and is selected from cyanine colorants such as heptamethine cyanine colorants, oxonol colorants such as pentamethine oxonol colorants, indolium colorants, benzindolium colorants, benzothiazolium colorants, quinolinium colorants, phthalide compounds reacted with a color developing agent, and the like. Photo-absorption properties of colorants greatly vary depending on the type and the intramolecular position of the substituent, the number of conjugate bonds, the type of counterion, the surrounding environment around the colorant molecule, or the like.

Commercially available laser colorants, hypersaturated absorption colorants, and near-infrared absorption colorants may also be used. Examples of the laser colorants include "ADS740PP", "ADS745HT", "ADS760MP", "ADS740WS", "ADS765WS", "ADS745HO", "ADS790NH" and "ADS800NH" (all trade names, manufactured by American Dye Source, Inc. (Canada)); and "NK-3555", "NK-3509" and "NK-3519" (all trade names, manufactured by Hayashibara Biochemical Labs, Inc.). Examples of the near-infrared absorption colorants include "ADS775MI", "ADS775MP", "ADS775HI", "ADS775PI", "ADS775PP", "ADS780MT", "ADS780BP", "ADS793EI", "ADS798MI", "ADS798MP", "ADS800AT", "ADS805PI", "ADS805PP", "ADS805PA", "ADS805PF", "ADS812MI", "ADS815EI", "ADS818HI", "ADS818HT", "ADS822MT", "ADS830AT", "ADS838MT", "ADS840MT", "ADS845BI", "ADS905AM", "ADS956BI", "ADS1040T", "ADS1040P", "ADS1045P", "ADS1050P", "ADS1060A", "ADS1065A", "ADS1065P", "ADS1100T", "ADS1120F", "ADS1120P", "ADS780WS", "ADS785WS", "ADS790WS", "ADS805WS", "ADS820WS", "ADS830WS", "ADS850WS", "ADS780HO", "ADS810CO", "ADS820HO", "ADS821NH", "ADS840NH", "ADS880MC", "ADS890MC" and "ADS920MC" (all trade names, manufactured by American Dye Source, Inc. (Canada)); "YKR-2200", "YKR-2081", "YKR-2900", "YKR-2100" and "YKR-3071" (all trade names, manufactured by Yamamoto Chemical Industry Co., Ltd.); "SDO-1000B" (trade name, manufactured by Arimoto Chemical Co., Ltd.); and "NK-3508" and "NKX-114" (both trade names, manufactured by Hayashibara Biochemical Labs, Inc.), while the examples are not intended to be limited to these.

Those described in Japanese Patent No. 3271226 may be used as the phthalide compound reacted with a color developing agent. Phosphoric acid ester metal compounds, for example, the complexes of a phosphoric acid ester and a copper salt described in JP-ANo. 6-345820 and WO 99/10354, may also be used as the light-heat converting agent. Further, ultramicroparticles having light absorption characteristics in the near-infrared region, and having a number average particle size of preferably 0.3 µm or less, more preferably 0.1 µm or less, and even more preferably 0.08 µm or less, may also be used as the light-heat converting agent. Examples thereof include metal oxides such as yttrium oxide, tin oxide and/or indium oxide, copper oxide or iron oxide, and metals such as gold, silver, palladium or platinum. Also, compounds obtained by adding metal ions such as the ions of copper, tin, indium, yttrium, chromium, cobalt, titanium, nickel, vanadium and rare earth elements, into microparticles made of glass or the like, which have a number average particle size of 5 µm or less, and more preferably 1 µm or less, may also be used as the light-heat converting agent.

In the case that the colorant may react with a component contained in the resin composition of the invention and causes a change in its absorption wavelength of light absorption, the colorant may be encapsulated in microcapsules. In that case, the number average particle size of the capsules is preferably 10 µm or less, more preferably 5 µm or less, and even more preferably 1 mm or less. Compounds obtained by adsorbing metal ions of copper, tin, indium, yttrium, rare earth elements or the like on ion-exchanged microparticles, may also be used as the light-heat converting agent. The ion-exchanged microparticles may be any of organic resin microparticles or inorganic microparticles. Examples of the inorganic microparticles include amorphous zirconium phosphate, amorphous zirconium phosphosilicate, amorphous zirconium hexametaphosphate, lamellar zirconium phosphate, reticulated zirconium phosphate, zirconium tungstate, zeolites and the like. Examples of the organic resin microparticles include generally used ion-exchange resins, ion-exchange celluloses, and the like.

Preferable examples of the light-heat converting agent further include a carbon black.

Any kind of the carbon black may be used as long as the carbon black has stable dispersibility or the like in the resin composition. The carbon black may be a product classified according to American Society for Testing and Materials (ASTM) standard or may be those usually used in various applications such as coloring, rubber making, or batteries.

Examples of the carbon black include furnace black, thermal black, channel black, lamp black, acetylene black, and the like. In addition, black-colored colorants such as carbon black may be used in the form of color chips or color pastes, in which the colorants have been dispersed in advance in nitrocellulose, a binder or the like, to prepare the resin composition, using a dispersant which facilitates dispersing the ships or pastes in the resin composition if necessary. Such chips or pastes can be easily obtained as commercially available products.

The range of the carbon black which can be used in the invention is wide to include a carbon black having a relatively low specific surface area and a relatively low DBP absorption as well as a micronized carbon black having a large specific surface area.

Suitable examples of the carbon black include PRINTEX U, PRINTEX A, and SPEZIALSCHWARZ 4 (all registered trademarks, manufactured by Degussa GmbH).

A conductive carbon black having a specific surface area of at least 150 m$^2$/g and the number of DBP of at least 150 ml/100 g is preferably used as the carbon black in the invention with a viewpoint of improving the engraving sensitivity due to its efficiency in conducting heat generated by light-heat converting to the surrounding polymer and the like.

Preferably, the specific surface area is 250 m$^2$/g or more, and particularly preferably 500 m$^2$/g or more. The number of DBP is preferably 200 ml/100 g or more, and particularly preferably 250 ml/100 g or more. While the carbon black may be acidic or basic, it is preferably a basic carbon black. A mixture of different carbon blacks may of course be used.

Appropriate conductive carbon blacks having the specific surface area as high as about 1500 m$^2$/g and the number of DBP as large as about 550 ml/100 g are commercially available under the names of KETJENNLACK (registered trade mark): EC300 J, KETJENNLACK (registered trade mark) EC600J (available from Akzo), PRINREX (registered trade mark) XE (available from Degussa) or BLACK PEARLS (registered trade mark) 2000 (available from Cabot), and KETJENBLACK (manufactured by Lion Co.).

While the content of the light-heat converting agent in the resin composition for laser engraving may greatly vary depending on the magnitude of the molecular absorption coefficient thereof, it is preferably in a range from 0.01 mass % to 20 mass %, more preferably in a range from 0.05 mass % to 10 mass %, and particularly preferably in a range from 0.1 mass % to 5 mass %, based on the total solid content of the resin composition.

(D) Polymerization Initiator

The resin composition for laser engraving of the invention preferably contains a polymerization initiator. Any polymerization initiator that is known to those having ordinary skill in the art may be used in the invention without particular limitation. Specific examples thereof are extensively described in Bruce M. Monroe, et al., Chemical Revue, 93 435 (1993) or R. S. Davidson, Journal of Photochemistry and Biology A: Chemistry, 73, 81 (1993); J. P. Faussier, "Photoinitiated Polymerization—Theory and Applications": Rapra Review Vol. 9, Report, Rapra Technology (1998); M. Tsunooka et al., Prog. Polym. Sci., 21, 1 (1996); and the like. Also known is a family of compounds which oxidatively or reductively cause bond cleavage, such as those described in F. D. Saeva, Topics in Current Chemistry, 156, 59 (1990); G. G. Maslak, Topics in Current Chemistry, 168, 1 (1993); H. B. Shuster et al., JACS, 112, 6329 (1990); I. D. F. Eaton et al., JACS, 102, 3298 (1980); and the like.

Hereinafter, specific examples of preferable polymerization initiators will be discussed in detail, particularly with regard to a radical polymerization initiator which is a compound capable of generating a radical by the action of photo and/or thermal energy, and initiating and accelerating a polymerization reaction with a polymerizable compound including the sulfur-containing polyfunctional monomer (A), while the invention is not intended to be restricted thereby.

According to the invention, preferable examples of the radical polymerization initiator include (a) aromatic ketone, (b) onium salt compound, (c) organic peroxide, (d) thio compound, (e) hexaarylbiimidazole compound, (f) keto oxime ester compound, (g) borate compound, (h) azinium compound, (i) metallocene compound, (j) active ester compound, (k) compound having a carbon-halogen bond, (l) azo compound, and the like. Specific examples of the compounds of (a) to (l) will be shown in the followings, while the invention is not limited thereto.

(a) Aromatic Ketone

Examples of the (a) aromatic ketone which is preferable as the radical polymerization initiator usable in the invention include the compounds having a benzophenone skeleton and a thioxanthone skeleton as described in "RADIATION CURING IN POLYMER SCIENCE AND TECHNOLOGY", J. P. Fouassier and J. F. Rabek (1993), p. 77-117. For example, the following compounds may be mentioned.

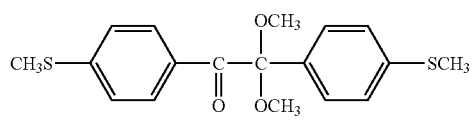

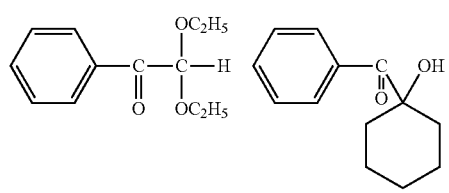

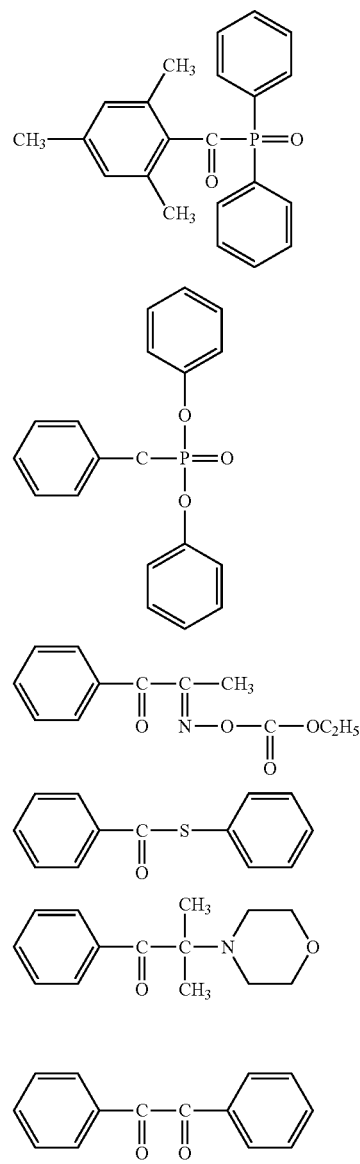

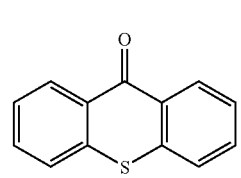

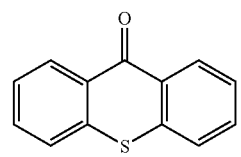

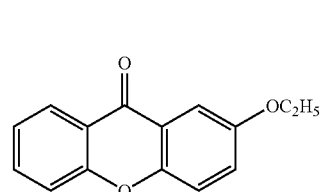

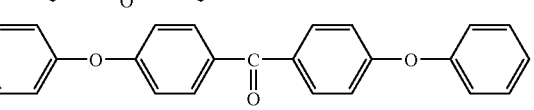

Among them, particularly preferable examples of the (a) aromatic ketone include the following compounds.

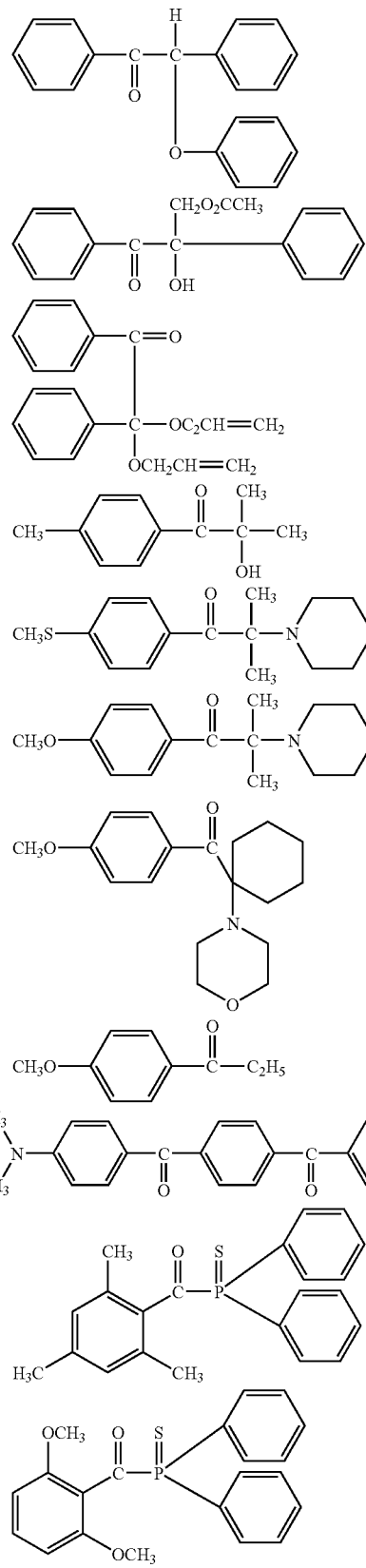

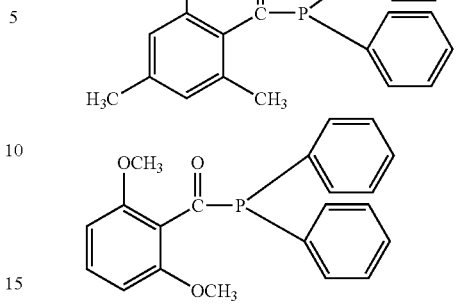

(b) Onium Salt Compound

Examples of the (b) onium salt compound which is preferable as the radical polymerization initiator usable in the invention include compounds represented by any one of the following Formulae (8) to (10).

 (8)

 (9)

 (10)

In Formula (8), $Ar^1$ and $Ar^2$ each independently represent an aryl group having up to 20 carbon atoms, which may be substituted; and $(Z^1)^-$ represents a counterion selected from the group consisting of a halogen ion, a perchlorate ion, a carboxylate ion, a tetrafluoroborate ion, a hexafluorophosphate ion and a sulfonate ion, and is preferably a perchlorate ion, a hexafluorophosphate ion or an arylsulfonate ion.

In Formula (9), $Ar^3$ represents an aryl group having up to 20 carbon atoms, which may be substituted; and $(Z^2)^-$ represents a counterion which is defined in the same manner as $(Z^1)^-$.

In Formula (10), $R^{37}$, $R^{38}$ and $R^{39}$, which may be the same or different from each other, each represent a hydrocarbon group having up to 20 carbon atoms, which may be substituted; and $(Z^3)^-$ represents a counterion which is defined in the same manner as $(Z^1)^-$.

Specific examples of the onium salt which may be suitably used in the invention include those described in paragraphs 0030 to 0033 of JP-A No. 2001-133969 or those described in paragraphs 0015 to 0046 of JP-A No. 2001-343742, which have been previously suggested by the Applicant, and the specific aromatic sulfonium salt compounds described in JP-A Nos. 2002-148790, 2001-343742, 2002-6482, 2002-116539 and 2004-102031.

(c) Organic Peroxide

Examples of the (c) organic peroxide which is preferable as the radical polymerization initiator usable in the invention include nearly all of organic compounds having one or more oxygen-oxygen bonds in the molecule. Specific examples thereof include t-butyl peroxy benzoate, methyl ethyl ketone peroxide, cyclohexanone peroxide, 3,3,5-trimethylcyclohexanon peroxide, methylcyclohexanone peroxide, acetylacetone peroxide, 1,1-bis(tertiary-butylperoxy)-3,3,5-trimethylcyclohexane, 1,1-bis(tertiary-butylperoxy)cyclohexane, 2,2-bis(tertiary-butylperoxy)butane, tertiary-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tertiary-butyl peroxide, tertiary-butylcumyl peroxide, dicumyl peroxide, bis(tertiary-butylperoxyisopropyl)benzene, 2,5-dimethyl-2,5-di(tertiary-butylperoxy)hexane, 2,5-xanoyl peroxide, succinic acid peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tertiary-butyl peroxyacetate, tertiary-butyl peroxypivalate, tertiary-butyl peroxyneodecanoate, tertiary-butyl peroxyoctanoate, tertiary-butyl peroxy-3,5,5-trimethylhexanoate, tertiary-butyl peroxylaurate, tertiary-carbonate, 3,3',4,4'-tetra(t-butlperoxycarbonyl)benzophenone, 3,3',4,4'-tetra(t-amylperoxycarbonyl)benzophenone, 3,3'4,4'-tetra(t-hexylperoxycarbonyl)benzophenone, 3,3'4,4'-tetra-(t-octylperoxycarbonyl)benzophenone, 3,3',4,4'-tetra-(cumylperoxycarbonyl)benzophenone, 3,3'4,4'-tetra-(p-isopropylcumylperoxycarbonyl)benzophenone, carbonyl di(t-butylperoxy dihydrogen diphthalate), carbonyl di(t-hexylperoxy dihydrogen diphthalate), and the like.

Among them, 3,3',4,4'-tetra(t-butylperoxycarbonyl)benzophenone, 3,3'4,4'-tetra-(t-amylperoxycarbonyl)benzophenone, 3,3',4,4'-tetra-(t-hexylperoxycarbonyl)benzophenone, 3,3'4,4'-tetra-(t-octylperoxycarbonyl)benzophenone, 3,3',4,4'-tetra-(cumylperoxycarbonyl)benzophenone, 3,3'4,4'-tetra-(p-isopropylcumylperoxycarbonyl)benzophenone, and di-t-butyl diperoxyisophthalate are preferable, and t-butyl peroxy benzoate and dicumyl peroxide are more preferable.

(d) Thio Compound

Examples of the (d) thio compound which is preferable as the radical polymerization initiator usable in the invention include compounds having a structure represented by following Formula (11).

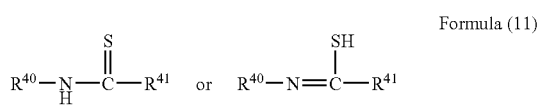

Formula (11)

In Formula (11), $R^{40}$ represents an alkyl group, an aryl group or a substituted aryl group; $R^{41}$ represents a hydrogen atom or an alkyl group; and $R^{40}$ and $R^{41}$ may be bound to each other to represent a non-metallic atomic group necessary for forming a 5- to 7-membered ring which may contain a heteroatom selected from an oxygen atom, a sulfur atom and a nitrogen atom.

Specific examples of the thio compound represented by Formula (11) include the compounds having the following substitutes as the $R^{40}$ and $R^{41}$.

| No. | $R^{26}$ | $R^{27}$ |
|---|---|---|
| 1 | —H | —H |
| 2 | —H | —CH$_3$ |
| 3 | —CH$_3$ | —H |
| 4 | —CH$_3$ | —CH$_3$ |
| 5 | —C$_6$H$_5$ | —C$_2$H$_5$ |
| 6 | —C$_6$H$_5$ | —C$_4$H$_9$ |
| 7 | —C$_6$H$_4$Cl | —CH$_3$ |
| 8 | —C$_6$H$_4$Cl | —C$_4$H$_9$ |

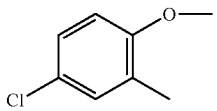

-continued

| No. | $R^{26}$ | $R^{27}$ |
|---|---|---|
| 9 | —C$_6$H$_4$—CH$_3$ | —C$_4$H$_9$ |
| 10 | —C$_6$H$_4$—OCH$_3$ | —CH$_3$ |
| 11 | —C$_6$H$_4$—OCH$_3$ | —C$_2$H$_5$ |
| 12 | —C$_6$H$_4$—OC$_2$H$_5$ | —CH$_3$ |
| 13 | —C$_6$H$_4$—OC$_2$H$_5$ | —C$_2$H$_5$ |
| 14 | —C$_6$H$_4$—OCH$_3$ | —C$_4$H$_9$ |
| 15 | —(CH$_2$)$_2$— | |
| 16 | —(CH$_2$)$_2$—S— | |
| 17 | —CH(CH$_3$)—CH$_2$—S— | |
| 18 | —CH$_2$—CH(CH$_3$)—S— | |
| 19 | —C(CH$_3$)$_2$—CH$_2$—S— | |
| 20 | —CH$_2$—C(CH$_3$)$_2$—S— | |
| 21 | —(CH$_2$)$_2$—O— | |
| 22 | —CH(CH$_3$)—CH$_2$—O— | |
| 23 | —C(CH$_3$)$_2$—CH$_2$—O— | |
| 24 | —CH=CH—N(CH$_3$)— | |
| 25 | —(CH$_2$)$_3$—S— | |
| 26 | —(CH$_2$)$_2$—CH(CH$_3$)—S— | |
| 27 | —(CH$_2$)$_3$—O— | |
| 28 | —(CH$_2$)$_5$— | |
| 29 | —C$_6$H$_4$—O— | |
| 30 | —N=C(SCH$_3$)—S— | |
| 31 | —C$_6$H$_4$—NH— | |
| 32 | 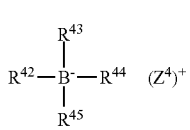 | |

(e) Hexaarylbiimidazole Compound

Examples of the (e) hexaarylbiimidazole compound which is preferable as the radical polymerization initiator usable in the invention include the rofin dimers described in JP-B Nos. 45-37377 and 44-86516. Specific examples thereof include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-triflourophenyl)-4,4',5,5'-tetraphenylbiimidazole, and the like.

(f) Keto Oxime Ester Compounds

Examples of the (f) keto oxime ester compound which is preferable as the radical polymerization initiator in the invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, 2-ethoxycarbonyloxyimino-1-phenylpropan-1-one, and the like.

(g) Borate Compounds

Examples of the (g) borate compounds which is preferable as the radical polymerization initiator usable in the invention include compounds represented by following Formula (12).

$$R^{42}-\underset{\underset{R^{45}}{|}}{\overset{\overset{R^{43}}{|}}{B^-}}-R^{44} \quad (Z^4)^+ \tag{12}$$

In Formula (12), $R^{42}$, $R^{43}$, $R^{44}$ and $R^{45}$, which may be the same or different from each other, each represent a substituted or unsubstituted alkyl group, a substituted or unsubstituted aryl group, a substituted or unsubstituted alkenyl group, a substituted or unsubstituted alkynyl group, or a substituted or unsubstituted heterocyclic group, and two or more groups among $R^{42}$, $R^{43}$, $R^{44}$ and $R^{45}$ may be bound with each other to form a cyclic structure, with the proviso that at least one among $R^{42}$, $R^{43}$, $R^{44}$ and $R^{45}$ is a substituted or unsubstituted alkyl group; and $(Z^4)^+$ represents an alkali metal cation or a quaternary ammonium cation.

Specific examples of the compound represented by Formula (12) include the compounds described in U.S. Pat. Nos. 3,567,453 and 4,343,891, and European Patent Nos. 109,772 and 109,773, and the compounds shown below.

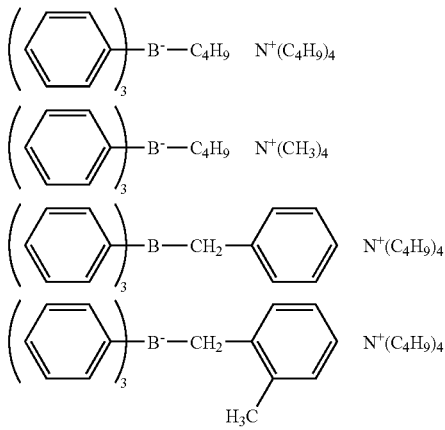

(h) Azinium Compounds

Examples of the (h) azinium salt compound which is preferable as the radical polymerization initiator usable in the invention include the compounds having an N—O bond as described in JP-A Nos. 63-138345, 63-142345, 63-142346 and 63-143537, and JP-B No. 46-42363.

(i) Metallocene Compounds

Examples of the (i) Metallocene compounds which is preferable as the radical polymerization initiator usable in the invention include the titanocene compounds described in JP-A Nos. 59-152396, 61-151197, 63-41484, 2-249 and 2-4705, and the iron arene complexes described in JP-A Nos. 1-304453 and 1-152109.

Specific examples of the titanocene compounds include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)-bis(2,6-difluoro-3-(pyrr-1-yl)phenyltitaniumbis(cyclopentadienyl) bis[2,6-difluoro-3-(methylsulfonamido)phenyl]titanium, bis(cyclopentadienyl)bis[2,6-difluoro-3-(N-butylbiaroylamino)phenyl]titanium, bis(cyclopentadienyl)bis[2,6-difluoro-3-(N-butyl-(4-chloropbenzoyl)amino)phenyl]titanium, bis(cyclopentadienyl)bis[2,6-difluoro-3-(N-benzyl-2,2-dimehylpentanoylamino)phenyl]titanium, bis(cyclopentadienyl)bis[2,6-difluoro-3-(N-(2-ethylhexyl-4-tolylsulfonyl)amino)phenyl]titanium, bis(cyclopentadienyl) bis[2,6-difluoro-3-(N-(3-oxaheptyl)benzoylamino)phenyl] titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonylamino) phenyl]titanium, bis(cyclopentadienyl)bis[2,6-difluoro-3-(trifluoroacetylamino)phenyl]titanium, bis(cyclopentadienyl)bis[2,6-difluoro-3-(2-chlorobenzoylamino)phenyl]titanium, bis(cyclopentadienyl) bis[2,6-difluoro-3-(4-chlorobenzoylamino)phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium, bis(cyclopentadienyl)bis[2,6-difluoro-3-(N-cyclohexylbenzoylamino)phenyl]titanium, and the like.

(j) Active Ester Compounds

Examples of the (j) active ester compound which is preferable as the radical polymerization initiator usable in the invention include the imidosulfonate compounds described in JP-A No. 62-6223, and the active sulfonates described in JP-B No. 63-14340 and JP-A No. 59-174831.

(k) Compounds Having Carbon-Halogen Bond

Examples of the (k) compound having a carbon-halogen bond which is preferable as the radical polymerization initiator usable in the invention include compounds represented by following formulae (13) to (19).

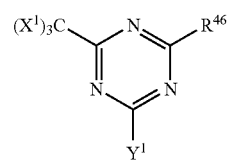

(13)

In Formula (13), $X^1$ represents a halogen atom; $Y^1$ represents $-C(X^1)_3$, $-NH_2$, $-NHR^{47}$, $-NR^{47}$, or $-OR^{47}$; $R^{46}$ represents $-C(X^2)_3$, an alkyl group, a substituted alkyl group, an aryl group or a substituted aryl group, or a substituted alkenyl group; and $R^{47}$ represents an alkyl group, a substituted alkyl group, an aryl group, or a substituted aryl group.

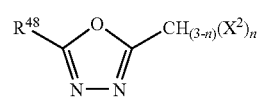

(14)

In Formula (14), $R^{48}$ represents an alkyl group, a substituted alkyl group, an alkenyl group, a substituted alkenyl group, an aryl group, a substituted aryl group, a halogen atom, an alkoxy group, a substituted alkoxy group, a nitro group, or a cyano group; $X^2$ represents a halogen atom; and n represents an integer from 1 to 3.

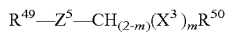

(15)

In Formula (15), $R^{49}$ represents an aryl group or a substituted aryl group; $R^{50}$ represents any one of the groups shown below, or a halogen atom; $Z^5$ represents $-C(=O)-$, $-C(=S)-$ or $-SO_2-$; $X^3$ represents a halogen atom; and m represents 1 or 2.

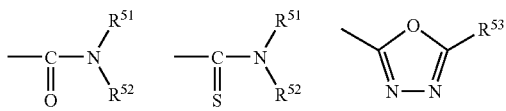

wherein $R^{51}$ and $R^{52}$ are each an alkyl group, a substituted alkyl group, an alkenyl group, a substituted alkenyl group, an aryl group or a substituted aryl group; and $R^{53}$ has the same meaning as defined for $R^{46}$ in Formula (13).

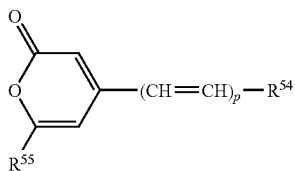

(16)

In Formula (16), $R^{54}$ represents an aryl group or a heterocyclic group, each of which may be substituted; $R^{55}$ represents a trihaloalkyl group or a trihaloalkenyl group, each having 1 to 3 carbon atoms; and p represents 1, 2 or 3.

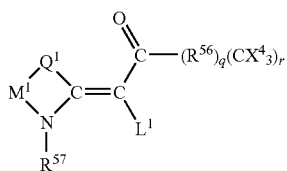

(17)

Formula (17) represents a carbonylmethylene heterocyclic compound having a trihalogenomethyl group. In Formula (17), $L^1$ represents a hydrogen atom or a substituent of formula: $CO—(R^{56})_q(C(X^4)_3)_r$; $Q^1$ represents a sulfur atom, a selenium atom, an oxygen atom, a dialkylmethylene group, an alken-1,2-ylene group, a 1,2-phenylene group, or an N—R group; $M^1$ represents a substituted or unsubstituted alkylene or alkenylene group, or represents a 1,2-arylene group; $R^{57}$ represents an alkyl group, an aralkyl group or an alkoxyalkyl group; $R^{56}$ represents a carbocyclic or heterocyclic divalent aromatic group; $X^4$ represents a chlorine atom, a bromine atom or an iodine atom; and either q=0 and r=1, or q=1 and r=1 or 2.

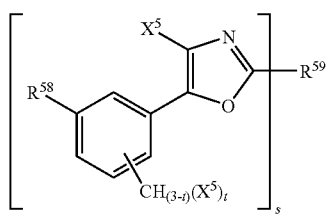

(18)

Formula (18) represents a 4-halogeno-5-(halogenomethylphenyl)oxazole compound. In Formula (18), $X^5$ represents a halogen atom; t represents an integer from 1 to 3; s represents an integer from 1 to 4; $R^{58}$ represents a hydrogen atom or a $CH_{3-t}X^5_t$ group; $R^{59}$ represents an unsaturated organic group which has a valency of s and may be substituted.

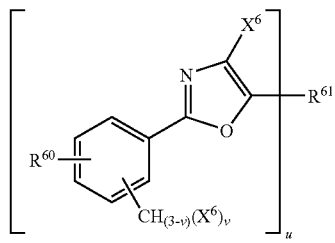

(19)

Formula (19) represents a 2-(halogenomethylphenyl)-4-halogeno-oxazole derivative. In Formula (19), $X^6$ represents a halogen atom; v represents an integer from 1 to 3; u represents an integer from 1 to 4; $R^{60}$ represents a hydrogen atom or a $CH_{3-v}(X^6)_v$ group; and $R^{61}$ represents an unsaturated organic group which has a valency of u and may be substituted.

Specific examples of the compounds having a carbon-halogen bond include the compounds described in Wakabayashi, et al., Bull. Chem. Soc. Japan, 42, 2924 (1969), for example, 2-phenyl-4,6-bis(trichlormethyl)-S-triazine, 2-(p-chlorphenyl)-4,6-bis(trichlormethyl)-S-triazine, 2-(p-tolyl)-4,6-bis(trichlormethyl)-3-triazine, 2-(p-methoxyphenyl)-4,6-bis(trichlormethyl)-S-triazine, 2-(2',4'-dichlorphenyl)-4,6-bis(trichlormethyl)-S-triazine, 2,4,6-tris(trichlormethyl)-S-triazine, 2-methyl-4,6-bis(trichlormethyl)-S-triazine, 2-n-nonyl-4,6-bis(trichlormethyl)-S-triazine, 2-trichlorethyl)-4,6-bis(trichlormethyl)-S-triazine, and the like. In addition, the compounds described in U.K. Patent No. 1388492, for example, 2-styryl-4,6-bis(trichlormethyl)-S-triazine, 2-(p-methylstyryl)-4,6-bis(trichlormethyl)-S-triazine, 2-(p-methoxystyryl)-4,6-bis(trichlormethyl)-S-triazine, 2-(p-methoxystyryl)-4-amino-6-trichlormethyl-S-triazine, and the like; the compounds described in JP-A No. 53-133428, for example, 2-(4-methoxy-naphth-1-yl)-4,6-bis-trichlormethyl-S-triazine, 2-(4-ethoxy-naphth-1-yl)-4,6-bis-trichlormethyl-S-triazine, 2-[4-(2-ethoxyethyl)-naphth-1-yl]-4,6-bis-trichlormethyl-S-triazine, 2-(4,7-dimethoxy-naphth-1-yl)-4,6-bis-trichlormethyl-S-triazine, 2-(acenaphth-5-yl)-4,6-bis-trichlormethyl-S-triazine, and the like; the compounds described in German Patent No. 3337024, for example, the compounds shown below; and the like may also be mentioned. Furthermore, there may be mentioned a family of compounds as shown below, which can be easily synthesized by a person having ordinary skill in the art according to the synthesis method described in M. P. Hutt, E. F. Elslager and L. M. Herbel, "Journal of Heterocyclic Chemistry", Vol. 7, No. 3, p. 511-(1970), such as the following compounds.

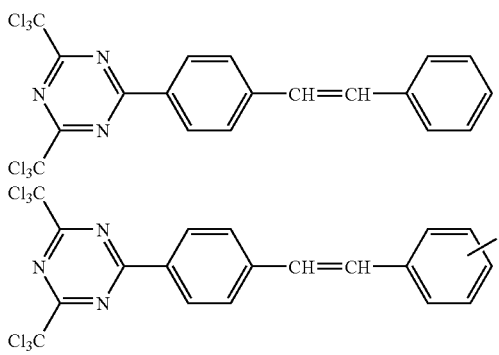

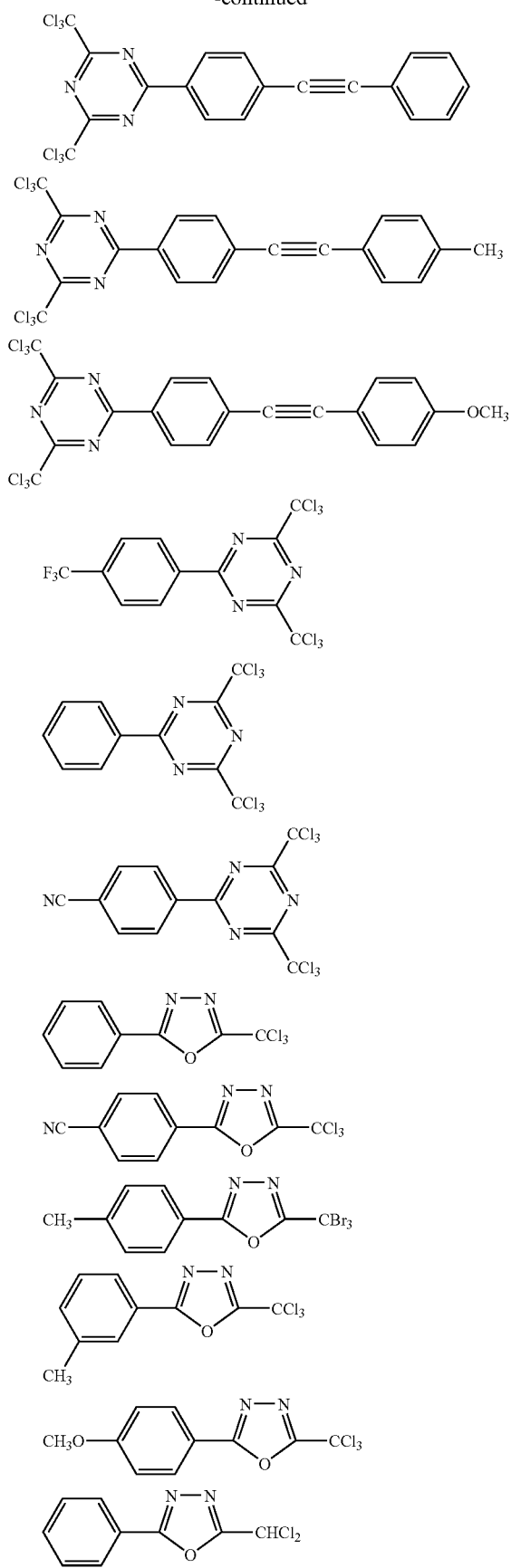

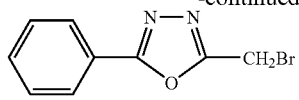

(l) Azo Compound

Examples of the (l) azo compound which is preferable as the radical polymerization initiator usable in the invention include 2,2'-azobisisobutyronitrile, 2,2'-azobispropionitrile, 1,1'-azobis( cyclohexane-1-carbonitrile), 2,2'-azobis(2-methylbutyronitrile), 2,2'-azobis(2,4-dimethylvaleronitrile), 2,2'-azobis(4-methoxy-2,4-dimethylvaleronitrile), 4,4'-azobis(4-cyanovaleric acid), dimethyl 2,2'-azobisisobutyrate, 2,2'-azobis(2-methylpropionamideoxime), 2,2'-azobis[2-(2-imidazolin-2-yl) propane], 2,2'-azobis{2-methyl-N-[1,1-bis (hydroxymethyl)-2-hydroxyethyl]propionamide}, 2,2'-azobis[2-methyl-N-(2-hydroxyethyl)propionamide], 2,2'-azobis (N-butyl-2-methylpropionamide), 2,2'-azobis(N-cyclohexyl-2-methylpropionamide), 2,2'-azobis[N-(2-propenyl)-2-methylpropionamide], 2,2'-azobis(2,4,4-trimethylpentane), and the like.

More preferable examples of the radical polymerization initiator which can be used in combination with the sulfur-containing polyfunctional monomer (A) in the invention include (a) the aromatic ketone, (b) the onium salt compound, (c) the organic peroxide, (e) the hexaarylbiimidazole compound, (i) the metallocene compound, (k) the compound having a carbon-halogen bond, and (l) the azo compound.

The organic peroxide (c) and the azo compound (l) can be more preferable, and the organic peroxide (c) can be particularly preferable in view of the engraving sensitivity and in view of making a better relief edge shape formed by engraving a relief forming layer of the relief printing plate precursor formed from the resin composition of the invention.

The engraving sensitivity is usually lowered when the hardness of the relief better is made high for making the edge shape. However, the use of the sulfur-containing polyfunctional monomer (A) and the preferable polymerization initiator may enable to improve the edge shape without lowering the engraving sensitivity. It is presumably because an oxygen atom and a nitrogen atom in the polymerization initiator result in an interaction with a sulfur atom in the sulfur-containing polyfunctional monomer (A) so that these components adjacently exist, which leads to raising the degree of polymerization to raise the hardness of the polymerized (cured) product, whereby the edge shape is improved. It is also presumed that the low-temperature thermal decomposition characteristic of the sulfur-containing polyfunctional monomer (A) can suppress a decrease of the engraving sensitivity which can be caused by increase in the degree of polymerization.

The polymerization initiators are suitably used by using them singly alone, or in combination of two or more thereof.

The amount of the polymerization initiator used in the invention can be preferably 0.01% by mass to 10% by mass, and more preferably 0.1% by mass to 3% by mass, relative to the total solid content of the resin composition for laser engraving.

(F) Plasticizer

The resin composition for laser engraving of the invention preferably contains a plasticizer.

Examples of the plasticizer include dioctyl phthalate, didodecyl phthalate, triethylene glycol dicaprylate, methyl glycol phthalate, tricresyl phosphate, dioctyl adipate, dibutyl sebacate, triacetylglycerin, and the like. Examples of the plasticizer further include polyethylene glycols, polypropylene glycol (mono-ol type, diol type and the like), and polypropylene glycol (mono-ol type, diol type and the like).

Since the plasticizer is expected to have an effect to soften the relief forming layer, the plasticizer is desired to have good compatibility with the binder polymer. In general, a highly hydrophilic compound has good compatibility with the binder polymer. Among highly hydrophilic compounds, an ether compound containing a heteroatom in a straight chain, or a compound having a structure in which a hydrophilic group such as secondary amine and a hydrophobic group are alternately repeated, can be preferably used. The presence of the hydrophilic group such as —O— or —NH— achieves the compatibility of such compounds with PVA compounds, and the other hydrophobic group weakens the intermolecular force of PVA compounds, to thereby contribute to the softening.

A compound having fewer hydroxyl groups which are capable of forming hydrogen bonding between PVA compounds can be also preferably used as the plasticizer. Examples of such compound include ethylene glycol, propylene glycol, and dimers, trimers, and homo-oligomers or co-oligomers such as tetramer or higher-mers of ethylene glycol and propylene glycol, and secondary amines such as diethanolamine and dimethylolamine. Among these, ethylene glycols (monomers, dimers, trimers and oligomers) having small steric hindrance, excellent compatibility and low toxicity, are particularly preferably used as the plasticizer.

Ethylene glycols are roughly classified into three types according to the molecular weight. The first group includes ethylene glycol, which is a monomer; the second group includes diethylene glycol, which is a dimer, and triethylene glycol, which is a trimer; and the third group includes polyethylene glycol, which is a tetramer or higher one. Polyethylene glycol is roughly classified into liquid polyethylene glycol having a molecular weight in the range of 200 to 700, and solid polyethylene glycol having a molecular weight of 1000 or greater, and those are commercially available under names followed by the average molecular weight in many cases.

As a result of intensive search, the present inventors have found that the lower molecular weight of the plasticizer is, the effect of the plasticizer to soften a resin is enhanced. In consideration of this, compounds which may be particularly preferably used as the plasticizer are ethylene glycol which belongs to the first group, diethylene glycol and triethylene glycol which belong to the second group, and tetraethylene glycol (tetramer) which belongs to the third group. Among them, diethylene glycol, triethylene glycol and tetraethylene glycol can be more preferably used as the plasticizer from the viewpoints of low toxicity, absence of extraction from the resin composition, and excellent handling property thereof. Mixtures of two or more of the plasticizers can be also preferably used.

The plasticizer may be added in a proportion of 30% by mass or less with respect to the total mass of the solid content of the resin composition for laser engraving.

Additives for Enhancing Engraving Sensitivity

Nitrocellulose

Examples of an additive for enhancing engraving sensitivity include nitrocellulose.

Nitrocellulose, that is a self-reactive compound, generates heat at the time of laser engraving to assist thermal decomposition of the co-existing hydrophilic polymer. The engraving sensitivity is assumed to be enhanced as a result thereof.

Any nitrocellulose can be used in the invention as long as it can be thermally decomposed, and can be any one of RS (regular soluble) nitrocellulose, SS (spirit soluble) nitrocellulose and AS (alcohol soluble) nitrocellulose. The content of nitrogen in the nitrocellulose is usually about 10% by mass to 14% by mass, preferably 11% by mass to 12.5% by mass, and more preferably about 11.5% by mass to 12.2% by mass. The degree of polymerization of the nitrocellulose may also be selected from a wide range of about 10 to 1500. The polymerization degree of the nitrocellulose is typically 10 to 900, and preferably about 15 to about 150. Preferable examples of the nitrocellulose include those having a solution viscosity of 20 seconds to $^1\!/_{10}$ seconds, more preferably about 10 seconds to $^1\!/_8$ seconds, measured according to the method of viscosity indication provided by Hercules Powder Company, that is also known as JIS K6703 "Nitrocelluloses for Industrial Use". The nitrocellulose which can be used in the invention typically has a solution viscosity of 5 seconds to $^1\!/_8$ seconds, which is preferably about 1 second to $^1\!/_8$ seconds.

The RS nitrocellulose (for example, a nitrocellulose having a nitrogen content of about 11.7% to 12.2%), which is soluble in a ester such as ethyl acetate, a ketone such as methyl ethyl ketone or methyl isobutyl ketone, or an ether such as cellosolve, can be used as a nitrocellulose which can be contained in the resin composition for laser engraving The nitrocellulose may be used singly or in combination of two or more thereof as necessary.

The content of nitrocellulose may be selected as long as decrease in the engraving sensitivity of the resin composition for laser engraving can be avoided, and the content is typically 5 parts by mass to 300 parts by mass, preferably 20 parts by mass to 250 parts by mass, more preferably 50 parts by mass to 200 parts by mass, and particularly preferably 40 parts by mass to 200 parts by mass, relative to 100 parts by mass of the binder polymer and the polymerizable compound.

Highly Thermally Conductive Substance

In view of improving the engraving sensitivity of the resin composition of the invention, a highly thermally conductive substance can be added to the resin composition as an additive for assisting heat transfer in the resin composition.

Examples of the highly thermally conductive substance include an inorganic compound such as a metal particle and an organic compound such as an electrically conductive polymer.

Preferable examples of the metal particle include gold microparticles, silver microparticles and copper microparticles, each having a particle size in the order of micrometers to a few nanometers.

Preferable examples of the organic compound include polymers which are generally known as electrically conductive polymers.

Preferable examples of the electrically conductive polymers include conjugate polymers, and specific examples thereof include polyaniline, polythiophene, polyisothianaphthene, polypyrrole, polyethylene dioxythiophene, polyacetylene and modified compounds thereof. From the viewpoint of being highly sensitive, polyaniline, polythiophene, polyethylene dioxythiophene and modified compounds thereof are further preferable, and polyaniline is particularly preferable. While the polyaniline can be either in an emeraldine base form or in an emeraldine salt form when added to the resin composition, it can be preferably in an emeraldine salt form in view of higher heat transfer efficiency.

Specific examples of the metal particle and the electrically conductive polymer include commercially available products supplied by Sigma Aldrich Corp., Wako Pure Chemical Industries, Ltd., Tokyo Chemical Industry Co., Ltd., Mitsubishi Rayon Co.,Ltd., Panipol Oy and the like. Specific examples which are particularly preferable in view of improving the heat transfer efficiency include AQUAPASS- 01x (trade name, manufactured by Mitsubishi Rayon Co., Ltd.), and PANIPOL W and PANIPOL F (both trade names, manufactured by Panipol Oy).

The electrically conductive polymer can be preferably added to the resin composition in a form of an aqueous dispersion or an aqueous solution. As described above, the solvent used in preparing the resin composition for laser engraving is water or an alcoholic solvent in the case where a hydrophilic polymer and/or an alcohol-philic polymer, which are preferable embodiments of the binder polymer in the invention, are used. Accordingly, when the electrically conductive polymer is added to the resin composition in a form of an aqueous dispersion or an aqueous solution, miscibility of the electrically conductive polymer with a hydrophilic or an alcohol-philic polymer may become good, which may further result in increasing in the strength of a film formed by the resin composition for laser engraving and also in increasing the engraving sensitivity of the film due to an improvement in its heat transfer efficiency.

Co-Sensitizer

The sensitivity required for photo-curing of the resin composition for laser engraving may be further enhanced by using a co-sensitizer. While the operating mechanism thereof is not clear, it is thought to be largely based on the following chemical process. Namely, it is presumed that various intermediate active species (radicals and cations) generated in the course of a photoreaction initiated by a polymerization initiator and an addition polymerization reaction subsequent thereto, react with the co-sensitizer to generate new active radicals. These intermediate active species may be roughly classified into (i) compounds which are reduced and can generate active radicals; (ii) compounds which are oxidized and can generate active radicals; and (iii) compounds which react with less active radicals, and are converted to more active radicals or act as a chain transfer agent. However, in many cases, there is no general theory applicable on which individual compound belongs to which class.

Examples of the co-sensitizer which may be applied in the invention include the following compounds.

(i) Compounds Which Generate Active Radicals Upon Being Reduced

Compounds having a carbon-halogen bond are classified in this group. It is presumed that an active radical is generated when the carbon-halogen bond is reductively cleaved. Specific preferable examples of the compound include trihalomethyl-s-triazines and trihalomethyloxadiazoles.

Compounds having a nitrogen-nitrogen bond are also classified in this group. It is presumed that an active radical is generated when the nitrogen-nitrogen bond is reductively cleaved. Specific preferable examples of the compound include hexaarylbiimidazoles.

Compounds having an oxygen-oxygen bond are also classified in this group. It is presumed that an active radical is generated when the oxygen-oxygen bond is reductively cleaved. Specific preferable examples of the compound include organic peroxides.

Onium compounds are also classified in this group. It is presumed that an active radical is generated when a carbon-heteroatom bond or an oxygen-nitrogen bond in an onium compound is reductively cleaved. Specific preferable examples of the compound include diaryliodonium salts, triarylsulfonium salts, N-alkoxypyridinium salts (azinium) salts, and the like.

Ferrocenes and iron arene complexes are also classified in this group. It is presumed that an active radical is reductively generated therefrom.

(ii) Compounds Which Generate Active Radicals Upon Being Oxidized

Alkylate complexes can be classified in this group. It is presumed that an active radical is generated when a carbon-heteroatom bond therein is oxidatively cleaved. Specific preferable examples thereof include triarylalkylborates.

Alkylamine compounds can be also classified in this group. It is presumed that an active radical is generated when a C—X bond on a carbon atom which is adjacent to a nitrogen atom therein is cleaved through oxidation. Preferable examples of the X include a hydrogen atom, a carboxyl group, a trimethylsilyl group, a benzyl group and the like. Specific preferable examples of the alkylamine compound include ethanolamines, N-phenylglycine, and N-trimethylsilylmethylanilines.

Sulfur-containing or tin-containing compounds, which are obtained by substituting the nitrogen atom of the above-mentioned alkylamine compounds by a sulfur atom or a tin atom, can be also classified in this group and may generate an active radical in a similar manner as the alkylamine compounds. Compounds having an S—S bond are also known to have sensitivity enhancing property by the S—S bond cleavage.

α-substituted methylcarbonyl compounds, which may generate an active radical by the cleavage of a bond between a carbonyl moiety and an α-carbon atom through oxidation, can be also classified in this group. Compounds obtained by converting the carbonyl moiety in the a-substituted methylcarbonyl compounds into an oxime ether also show an effect which is similar to that of the α-substituted methylcarbonyl compounds. Specific examples of the compounds include 2-alkyl-1-[4-(alkylthio)phenyl]-2-morpholinopronone-1's, and oxime ethers obtained by reacting a 2-alkyl-1-[4-(alkylthio)phenyl]-2-morpholinopronone-1 with a hydroxylamine and then etherifying the N—OH moiety in the resultant.

Sulfinates can be also classified in this group. An active radical may be reductively generated therefrom. Specific examples thereof include sodium arylsulfinate.

(iii) Compounds Which Convert Less Active Radicals to More Active Radicals by Reacting Therewith, and Compounds Which Act as a Chain Transfer Agent Compounds having SH, PH, SiH or GeH within the molecule can be classified in this group. These compounds may generate a radical by donating hydrogen to a less active radical species, or may generate a radical by being oxidized and then deprotonated. Specific examples thereof include 2-mercaptobenzothiazoles, 2-mercaptobenzoxazoles, 2-mercaptobenzimidazoles, and the like.

More specific examples of these co-sensitizers are described in, for example, JP-A No. 9-236913, as additives for enhancing the sensitivity, and those may also be applied in the invention. Some examples thereof will be shown below, while the invention is not limited thereto. In the following formulae, "–TMS" represents a trimethylsilyl group.

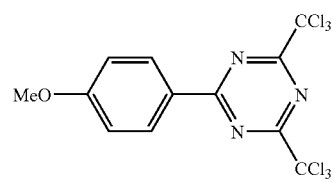

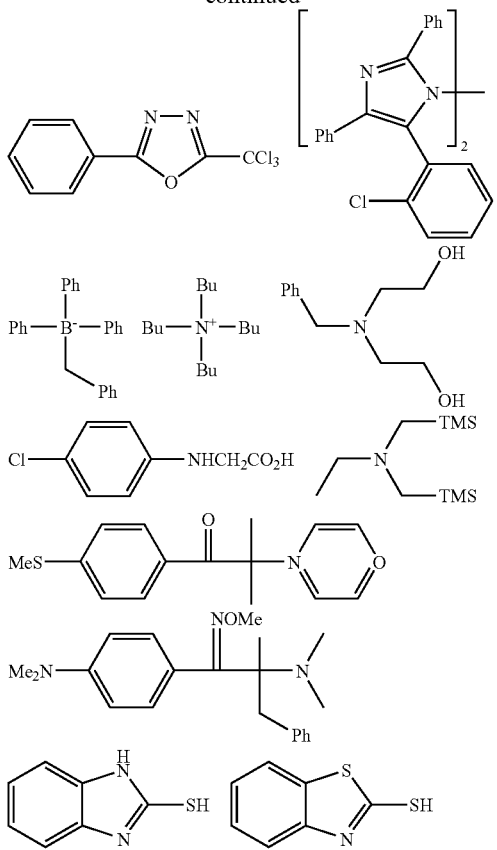

As is similar to the light-heat converting agent, various chemical modifications for improving the properties of the resin composition for laser engraving may be carried out to the co-sensitizer. Examples of a method for the chemical modification include: bonding with the sulfur-containing polyfunctional monomer (A), the light-heat converting agent, and/or some other part; introduction of a hydrophilic site; enhancement of compatibility; introduction of a substituent for suppressing crystal precipitation; introduction of a substituent for enhancing adhesiveness; and conversion into a polymer.

The co-sensitizer may be used singly, or in combination of two or more species thereof. The content of the co-sensitizer in the resin composition for laser engraving is preferably 0.05 parts by mass to 100 parts by mass, more preferably 1 parts by mass to 80 parts by mass, and even more preferably 3 parts by mass to 50 parts by mass, relative to 100 parts by mass of the polymerizable compound.

Polymerization Inhibitor

A small amount of thermal polymerization inhibitor can be preferably added to the resin composition of the invention in view of inhibiting unnecessary thermal polymerization of the polymerizable compound including the sulfur-containing polyfunctional monomer (A) during the production or storage of the resin composition.

Suitable examples of the thermal polymerization inhibitor include hydroquinone, p-methoxyphenol, di-t-butyl-p-cresol, pyrogallol, t-butylcatechol, benzoquinone, 4,4'-thio-bis(3-methyl-6-t-butylphenol), 2,2'-methylenebis(4-methyl-6-t-butylphenol), N-nitrosophenylhydroxylamine cerium (I) salt, and the like.

The addition amount of the thermal polymerization inhibitor is preferably 0.01% by mass to 5% by mass with respect to the total mass of the resin composition for laser engraving. Also, if necessary, in order to prevent the inhibition of polymerization caused by oxygen, a higher fatty acid compound such as behenic acid or behenic acid amide may be added to the resin composition and can be localized at the surface of the relief forming layer during the course of drying of the relief forming layer performed after the resin composition is applied over (on or above) a support or the like. The addition amount of the higher fatty acid compound can be preferably 0.5% by mass to 10% by mass with respect to the total mass of the resin composition.

Colorant

A colorant such as a dye or a pigment may also be added to the resin composition for laser engraving for the purpose of coloring the resin composition. The addition of the dye or the pigment may enhance properties of the resin composition such as the visibility of the image part, suitability for image density measuring device and the like. A pigment is particularly preferably used as the colorant in the invention. Specific examples of the colorant include pigments such as phthalocyanine pigments, azo pigments, carbon black or titanium oxide; and dyes such as Ethyl Violet, Crystal Violet, azo dyes, anthraquinone dyes or cyanine dyes. The amount of addition of the colorant is preferably about 0.5% by mass to 5% by mass with respect to the total mass of the resin composition.

Other Additives

In order to improve the properties of a cured film formed of the resin composition for laser engraving, known additives such as a filler may also be added.

Examples of the filler include carbon black, carbon nanotubes, fullerene, graphite, silica, alumina, aluminum, calcium carbonate and the like, and these fillers can be used singly or as mixtures of two or more thereof.

Image-Forming Material

The image-forming material of the invention contains the resin composition for laser engraving according to the invention.

There is no particular limitation for the image-forming material of the invention so far as a two- or three-dimensional image can be formed by subjecting the resin composition for laser engraving of the invention to laser engraving. The image-forming material can be applied not only to a relief printing plate precursor for laser engraving which will be mentioned later but also to three-dimensional articles, seals, abrasion mask layers, intaglio printing plates, and the like.

Relief Printing Plate Precursor for Laser Engraving

The relief printing plate precursor for laser engraving according to the invention has a relief forming layer containing the resin composition for laser engraving of the invention. In embodiments, the relief forming layer may be a relief forming layer prepared by subjecting the resin composition for laser engraving of the invention to cross-linking by means of light and/or heat.

The relief forming layer can be preferably formed on or above a support.

The relief printing plate precursor for laser engraving may further have an arbitrary other layer, and examples of such an arbitrary other layer include an adhesive layer which resides between the support and the relief forming layer, and a slip coat layer and/or a protective layer which can be provided on the relief forming layer.

Relief Forming Layer

The relief forming layer contains the resin composition of the invention and contains either components which can be cross-linked or a cross-linked structure formed by application of light and/or heat.

In embodiments, a manufacturing method of a relief printing plate from the relief printing plate precursor for laser engraving preferably includes: crosslinking components of the relief forming layer; and laser engraving the crosslinked relief forming layer to form a relief layer. The crosslinking may enable to suppress wearing of the relief forming layer subjected to printing and provide a relief printing plate having a relief layer sharply-shaped by laser engraving.

The content of the binder polymer in the relief forming layer is preferably 30% by mass to 80% by mass, and more preferably 40% by mass to 70% by mass, with respect to the total mass of the solid content of the relief forming layer. When the content of the binder polymer is set to 30% by mass or more, the printing plate precursor having thereof can be prevented from causing a cold flow. Also, when the content of the binder polymer is set to 80% by mass or less, there can be no occurrence of the lack of other components, and a sufficient printing durability as a printing plate may be provided to the relief printing plate resulting therefrom.

The content of the polymerization initiator is preferably 0.01% by mass to 10% by mass, and more preferably 0.1% by mass to 3% by mass, with respect to the total mass of the solid content of the relief forming layer. When the content of the polymerization initiator is set to 0.01% by mass or more, the crosslinking process of the crosslinkable relief forming layer rapidly progress. When the content of the polymerization initiator is set to 10% by mass or less, there can be no occurrence of the lack of other components, and a sufficient printing durability as a printing plate may be provided to the relief printing plate resulting therefrom.

The content of the polymerizable compound is preferably 10% by mass to 60% by mass, and more preferably 15% by mass to 40% by mass, with respect to the total mass of the solid content of the relief forming layer. When the content of the polymerizable compound is set to 10% by mass or more, there can be no occurrence of the lack of other components, and a sufficient printing durability as a printing plate may be provided to the relief printing plate resulting therefrom. When the content of the polymerizable compound is set to 60% by mass or less, a sufficient strength as a printing plate may be provided to the relief printing plate resulting therefrom.

The relief forming layer may be obtained by providing the resin composition for forming the relief forming layer to have a sheet shape or a sleeve shape over the surface of the support.

Support

A support which can be used in the relief printing plate precursor for laser engraving typically has a flat plate shape or a sheet shape. The material used in the support is not particularly limited, while a material having high dimensional stability is preferably used. Examples thereof include metals such as steel, stainless steel or aluminum; thermo-plastic resins such as polyesters (for example, PET, PBT and PAN) or polyvinyl chloride; thermo-setting resins such as epoxy resin or phenolic resin; synthetic rubbers such as styrene-butadiene rubber; and fiber reinformced plastic (FRP) resins formed of resin materials such as epoxy resin or phenolic resin containing reinforcing fibers such as a glass fiber, a carbon fiber or the like. Among these, a polyethylene terephthalate (PET) film and a steel substrate is preferable in view of strength, durability and availability. The shape of the support depends on whether the relief forming layer is a sheet-shaped or a sleeve-shaped.

Adhesive Layer:

The relief printing plate precursor according to the invention may have an adhesive layer disposed between the relief forming layer and the support in view of reinforcing adhesive force working between these layers.

Any material that may enhance the adhesive force after the crosslinking in the relief forming layer can be employed, and a material which can also enhance the adhesive force before the crosslinking in the relief forming layer can be preferably employed. The "adhesive force" herein include both of that working between the support and the adhesive layer and that working between the adhesive layer and the relief forming layer.

The adhesive force between the support and the adhesive layer is preferably as follows. Namely, when a combination of the adhesive layer and the relief forming layer are going to peeled off, at a rate of 400 mm/min, from the support provided in a laminate having the support, the adhesive layer and the relief forming layer provided in this order, the peeling force per a unit width of 1 cm of the sample is preferably 1.0 N/cm or larger or the combination is unpeelable from the support under this condition, and is more preferably 3.0 N/cm or larger or the combination is unpeelable from the support under this condition.

The adhesive force between the adhesive layer and the relief forming layer is preferably as follows. Namely, when the adhesive layer is peeled off, at a rate of 400 mm/min, from the relief forming layer provided in a laminate of the adhesive layer and the relief forming layer, the peeling force per a unit width of 1 cm of the sample is preferably 1.0 N/cm or larger or the adhesive layer is unpeelable from the relief forming layer under this condition, and is more preferably 3.0 N/cm or larger or the adhesive layer is unpeelable from the relief forming layer under this condition.

Examples of the material which configures the adhesive layer include materials mentioned in Handbook of Adhesives, Second Edition (1977) edited by I. Skies.

Protective Film and Slip Coat Layer

The relief forming layer becomes a part at which a relief is formed after the laser engraving. The surface of the convex portion of the relief may generally work as an ink deposition portion. There is almost no concern for generation of damages or depressions on the surface of the relief forming layer which might affect printing when the relief forming layer is cured by crosslinking, since the thus-crosslinked relief forming layer has strength and hardness. However, the crosslink-curable relief forming layer which is not subjected to the crosslinking tend to have soft surfaces and are concerned for generation of damages or depressions on the surface thereof when they are handled. From the viewpoint of prevention of the damages or depressions, a protective film may be provided over (on or above) the relief forming layer.

If the protective film is too thin, the effect of preventing damages and depressions may not be obtained, and if the protective film is too thick, inconvenience may arise upon the handling thereof and production costs therefor may become higher. In consideration of these, the thickness of the protective film is preferably 25 μm to 500 μm, and more preferably 50 μm to 200 μm.

Films formed of known materials as that for a protective film of a printing plate, for example can be used in the invention, and examples thereof include polyester films such as those of PET (polyethylene terephthalate), and polyolefin films such as those of PE (polyethylene) or PP (polypropylene). The surface of the film may be plain (smooth), or may also be mattified to have very minute irregularities.

The protective film is required to be capable of being easily removed from the surface of the relief forming layer if desired as well as be capable of stably adhered to the surface of the relief forming layer, since the protective film is peeled off from the surface of the relief forming layer when the laser engraving is performed.

When the protective film is unpeelable or when the protective film cannot be easily adhered to the relief forming layer, a slip coat layer can be provided between the protective film and the relief forming layer.

The material for forming the slip coat layer preferably contains, as the main component, a water-soluble or water-dispersible and less tacky resin such as polyvinyl alcohol, polyvinyl acetate, a partially saponified polyvinyl alcohol, a hydroxyalkylcellulose, an alkylcellulose or a polyamide resin. Among these, a partially saponified polyvinyl alcohol having a degree of saponification of 60% by mole to 99% by mole, a hydroxyalkylcellulose with an alkyl group having 1 to 5 carbon atoms and an alkylcellulose with an alkyl group having 1 to 5 carbon atoms can be particularly preferably used from the viewpoint of lesser tackiness.

In the case where the protective film is peeled off, at a rate of 200 mm/min, from a laminate of the relief forming layer (and the slip coat layer) and the protective film, the peeling force per a unit width of 1 cm of the sample is preferably 5 mN/cm to 200 mN/cm, and more preferably 10 mN/cm to 150 mN/cm. When the peeling force is 5 mN/cm or more, the relief printing plate precursor can be subjected to operation without the removal of the protective film in the middle of the operation, and when the peeling force is 200 mN/cm or less, the protective film may be removed comfortably.

Method for Manufacturing Relief Printing Plate Precursor for Laser Engraving

There is no particular limitation to the preparation of a relief forming layer of a relief printing plate precursor for laser engraving according to the invention. Examples of the method for preparing the relief forming layer include: a method including removing the solvent from the application solution composition for forming a relief forming layer prepared as described above and fusion extruding the composition to on or above a support; and a method including flowing the application solution composition for forming a relief forming layer over a support and drying the resultant in an oven to remove the solvent from the composition.

A protective film may be laminated on the surface of the thus-formed relief forming layer in accordance with necessity. When a protective film is provided on a relief forming layer, the protective film and the relief forming layer are typically layered followed by laminating. Examples of a method for the lamination includes: a method in which a body in which the protective film and the relief forming are layered is passed through a space, which resides between a pair of calendar rolls, at least one of which is heated during the passage, so that the protective film and the relief forming layer can be press-contacted with heat to be laminated (attached with each other); and a method in which a surface of the relief forming layer, in which a small amount of solvent is impregnated, is prepared and the relief forming layer is tightly attached to the protective film via the surface so that the protective film and the relief forming layer can be laminated.

In relation thereto, examples of the method for the preparation of the relief forming layer further include a method which includes firstly laminating a relief forming layer on a protective film, and then laminating a support and the relief forming layer. Herein, an adhesive layer can be provided by using a support having the adhesive layer, and a slip coat layer can be provided by using a protective film having the slip coat layer.

An application solution composition for forming a relief forming layer may be prepared, for example, by dissolving or dispersing the binder polymer and the optional light-heat converting agent and/or the optional plasticizer to an appropriate solvent, and further dissolving polymerizable compounds including the sulfur-containing polufunctional monomer (A) and the polymerization initiator to the resulted solution.

It is necessary that most of the solvent component used for preparing the application solution is removed during the preparation of the printing plate precursor. Therefore, it is preferable that a lower alcohol which has a low-boiling solvent such as ethanol is used and that the addition amount of the solvent is small. It is possible to suppress the amount of the solvent added to the application solution by warming the system to form the application solution. However, when the temperature resulted by the warming is too high, polymerizable compound and/or the like in the system may tend to cause polymerization. In consideration of this, when the application solution composition for forming a relief forming layer has a formulation including a polymerizable compound and/or a polymerization initiator, the temperature for preparation of the composition is preferably adjusted to be within a range of 30° C. to 80° C.

The scope of the "relief printing precursor" of the invention includes embodiments in which the relief printing layer is not subjected to crosslinking as well as embodiments in which the relief printing layer has been subjected to crosslinking. Examples of a method for subjecting the relief printing layer to crosslinking include the crosslinking process (1) in the following method of manufacturing a relief printing plate of the invention.

A thickness of the relief forming layer of the relief printing plate precursor for laser engraving which is before and after being subjected to the crosslinking is preferably 0.05 mm to 10 mm, more preferably 0.05 mm to 7 mm and, particularly preferably, 0.05 mm to 0.3 mm.

Method of Manufacturing Relief Printing Plate

The method of manufacturing a relief printing plate according to the invention has at least (1) crosslinking at least a part of components of the relief forming layer of the relief printing plate precursor for laser engraving of the invention by light (by means such as exposure to actinic ray) and/or by heat and (2) laser engraving the relief forming layer subjected to the crosslinking to form a relief layer. The method can provide the relief printing plate according to the invention having a relief layer over a support.

Further, a process of (3) rinsing, in which the surface of a relief layer after engraving is rinsed, a process of (4) drying, in which the relief layer which has been engraved is dried, and/or a process of (5) post-crosslinking, in which energy is applied to the relief layer which has been engraved to form a crosslinking structure, can be carried out after the process of (2) laser engraving if necessary.

Cross linking in the relief forming layer during the process (1) can be carried out by irradiation of actinic rays and/or heat.

When both of crosslinking using light and crosslinking using heat are used in combination in the process (1) of crosslinking in the crosslinking of the relief forming layer during the process (1), both crosslinking processes may be performed simultaneously or separately.

The process (1) is a process to crosslinking crosslinkable components of the relief forming layer of the relief printing plate precursor for laser engraving by light and/or heat.

The relief forming layer preferably contains polymerizable compounds including the sulfur-containing polyfunctional monomer, the binder polymer, a light-heat converting agent, and a polymerization initiator. The process (1) includes polymerizing the polymerizable compound to form crosslinking by the effect of the polymerization initiator.

The polymerization initiator is preferably a radical generator. Radical generators are roughly classified into photopolymerization initiators and thermal polymerization initiators, depending on whether the trigger of the respective generating radical is light or heat.

When the relief forming layer contains a photopolymerization initiator, a crosslinked structure can be formed in the relief forming layer by irradiating the relief forming layer with actinic ray which serves as the trigger of the photopolymerization initiator (crosslinking by light).

The irradiation of actinic ray is generally carried out over the entire surface of the relief forming layer. Examples of the actinic ray include visible light, ultraviolet radiation and an electron beam, but ultraviolet radiation is most generally used. While it is acceptable to perform the irradiation of the actinic ray only to a front surface of a support, which is the opposite side of a rear surface of the relief forming layer which faces the support, it is preferable to irradiate the actinic ray also from the rear surface as well as from the front surface when the support is a transparent film which transmits actinic ray. When the protective film is present, the irradiation from the front surface may be carried out with the protective film being provided, or may be carried out after the protective film has been removed. Considering the presence of oxygen which may cause a polymerization inhibition, the irradiation with actinic ray may be carried out after coating the crosslinkable relief forming layer with a vinyl chloride sheet under vacuum.

When the relief forming layer contains a thermal polymerization initiator, a crosslinked structure can be formed in the relief forming layer by heating the relief printing plate precursor for laser engraving (crosslinking by heat). Some of the above-described photopolymerization initiator can also work as thermal polymerization initiators. Examples of the method of heating include a method of heating the printing plate precursor in a hot air oven or a far-infrared oven for a predetermined time and a method of contacting the printing plate precursor with a heated roll for a predetermined time.

The crosslinking by light in the process (1) may require a device for irradiation of active ray which is relatively expensive, it is preferable in that there is almost no limitation to the material to form the relief printing plate precursor, because the temperature of the relief printing plate precursor may not be greatly affected by the irradiation of active ray.

On the other hand, temperature of the printing plate precursor may rise in the crosslinking by heating, which may result in deformation of a thermoplastic polymer and/or denaturation of compound having small stability against heat. Accordingly, cares may be necessarily taken to select a compound used in the relief forming layer.

A thermal polymerization initiator can be added upon the crosslinking by heat. Commercially-available thermal polymerization initiator for free radical polymerization can be used as the thermal polymerization initiator. Examples of the thermal polymerization initiator include an appropriate peroxide, a hydroperoxide, and a compound containing an azo group. Typical vulcanizers can also be used for crosslinking. Crosslinking by heat can be also carried out by adding, as a crosslinking ingredient, a thermally crosslinkable resin (heat-curable resin) such as an epoxy resin to the relief forming layer.

The crosslinking by heat can be preferable as a crosslinking method for the relief forming layer in the process (1) with a viewpoint that the relief forming layer can be uniformly cured (crosslinked) from the surface to the inside.

The crosslinking in the relief forming layer has a first advantage that a relief formed after the laser engraving can become sharp as well as a second advantage that stickiness of engraving wastes formed upon laser engraving can be suppressed. When a relief forming layer which is not subjected to crosslinking is laser-engraved, a portion which is not intended to be engraved tends to be melted or deformed by remaining heat prevailing to the periphery of a portion irradiated with the laser to prevent obtaining a sharp relief layer in some cases. Further, In general, the lower a molecular weight of a material, the more the material tends to be liquid rather than solid to increase the stickiness of the material. Stickiness of engraving wastes formed upon engraving the relief forming layer tends to increase as the amount of using the low molecular weight material increases. Since the polymerizable compound, which is a low molecular material, can be formed into a high molecular weight material by crosslinking, the stickiness of the engraving wastes to be formed from the crosslinked relief forming layer tends to be decreased.

In the process (2) of engraving, the relief forming layer subjected to the crosslinking is engraved with laser to form a relief layer. More specifically, a relief layer is formed in the process (2) by irradiating the relief forming layer with a laser light and corresponding to a desired image to be formed. The engraving preferably includes controlling the laser head with a computer based on the digital data of a desired image to be formed, and performing scanning irradiation over the relief forming layer. When an infrared laser is irradiated, molecules in the relief forming layer undergo molecular vibration, and thus heat is generated. When a high power laser such as a carbon dioxide laser or a YAG laser is used as the infrared laser, a large amount of heat is generated at the laser-irradiated areas, and the molecules in the photosensitive layer undergo molecular breakage or ionization, so that selective removal (that is, engraving) can be achieved.

An advantage of the laser engraving is the ability to three-dimensionally control the structure of the engraved portion since the depth of engraving can be arbitrarily set thereby, For example, when areas for printing fine dots are engraved shallowly or with a shoulder, the relief may be prevented from collapsing under printing pressure. When groove areas for printing cutout characters are engraved deeply, the grooves may be hardly filled with ink, and collapse of the cutout characters may be thus suppressed.

When the engraving is performed with an infrared laser which corresponds to the maximum absorption wavelength of the light-heat converting agent, a more sensitive and well-defined (sharp) relief layer can be obtained.

If engraving remnants remain and adhere to the engraved surface, the process (3) of rinsing, in which the engraved surface is rinsed with water or with a liquid containing water as a main component to wash away the engraving remnants, may be further performed.

Examples of the method of the rinsing include a method of spraying water at high pressure, or a method of brush rubbing the engraved surface, mainly in the presence of water, using a batch type- or conveyor type-brush washout machine known as a developing machine for photosensitive resin letterpress plates, and the like. If the viscous liquid of the engraving remnants cannot be removed by simply washing with the water or the liquid, a rinsing solution containing soap may be used.

When the process (3) of rinsing the engraved surface is performed, it is preferable to further perform the process (4) of drying, in which the relief layer which has been engraved is dried to volatilize the rinsing solution.

Further, the process (5) of post-crosslinking, in which a crosslinked structure is formed in the relief layer, can be carried out if necessary. By carrying out the process (5) of post-crosslinking, the relief formed by engraving may be further strengthened.

The relief printing plate according to one aspect of the invention, that has a relief layer over a support, can be thus obtained.

A thickness of the relief layer of the relief printing plate is preferably in a range of 0.05 mm to 10 mm, more preferably in a range of 0.05 mm to 7 mm, and particularly preferably in a range of 0.05 mm to 3 mm in view of satisfying various applicability to flexographic printing such as wearing resistance or ink transfer property.

The Shore A hardness of the relief forming layer subjected to the crosslinking is preferably from 50° to 90°. When the Shore A hardness of the relief layer is 50° or more, the fine dots formed by engraving may not be fall and break even under the high printing pressure of a letterpress printing machine, and proper printing may be achieved. When the Shore A hardness of the relief layer is 90° or less, print scratches at solid parts may be prevented even in flexographic printing with a kiss-touch printing pressure.

The "Shore A hardness" herein means a value measured by a durometer (spring type rubber hardness meter), which impinges a presser (referred to as a penetration needle or an indenter) to a surface of an object to cause deformation of the surface, and measures the amount of the deformation (penetration depth) of the surface and expresses the result in a numerical value.

The relief printing plate produced by the method of the invention allows printing with a letterpress printing machine using oily ink or UV ink, and also allows printing with a flexographic printing machine using UV ink.

EXAMPLES

The invention will be hereinafter described in more detail by way of Examples, while the invention is not limited thereto.

Synthesis Example

Synthesis of Sulfur-Containing Polyfunctional Monomer M1

3,3'-Thiodipropionic acid (manufactured by Wako Pure Chemical, 89.05 g), glycidyl methacrylate (manufactured by Wako Pure Chemical, 156.26 g), 1-methoxy-2-propanol (manufactured by Nippon Nyukazai KK, 27.78 g), tetraethylammonium bromide (manufactured by Tokyo Kasei, 4.20 g) and 4-hydroxy-2,2,6,6-tetramethylpyridine 1-oxyl free radical (manufactured by Tokyo Kasei, 0.50 g) were placed in a 500-mL three-necked flask equipped with stirring fans and a cooling pipe and stirred at 80° C. for 4 hours. Water (500 g) and ethyl acetate (500 g) were added to this solution, and the resulted mixture was transferred to a separating funnel and vigorously stirred. Then, after an aqueous layer was removed therefrom, a saturated aqueous solution of sodium carbonate (200 g) was added thereto followed by stirring vigorously and an aqueous layer was removed therefrom. Then a saturated saline solution (200 g) was added thereto followed by stirring vigorously. Then, after an aqueous layer was removed therefrom, an organic layer thereof was transferred to a one-liter Erlenmeyer flask and dried by addition of magnesium sulfate (100 g) thereto. The magnesium sulfate was removed by filtration, and ethyl acetate was removed therefrom under reduced pressure to give 233.04 g of a sulfur-containing polyfunctional monomer M1 having the following structure. The structure of the resulting sulfur-containing polyfunctional monomer M1 was identified by means of $^1$H-NMR.

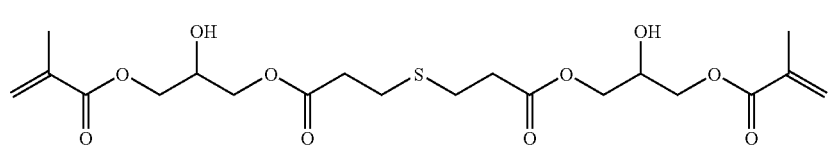

Synthesis Example

Synthesis of Sulfur-Containing Polyfunctional Monomers M2, M3 and M7

The sulfur-containing polyfunctional monomers M2, M3 and M7 shown by the following structures were synthesized by the similar synthetic method as that for the sulfur-containing polyfunctional monomer M1, except that "3,3'-thiodipropionic acid" was changed to "3,3'-dithiodipropionic acid", "2,2'-dithiodiglycolic acid" or "bis(4-hydroxy)sulfone", respectively. The structures of the resulting sulfur-containing polyfunctional monomers M2, M3 and M7 were identified by means of $^1$H-NMR.

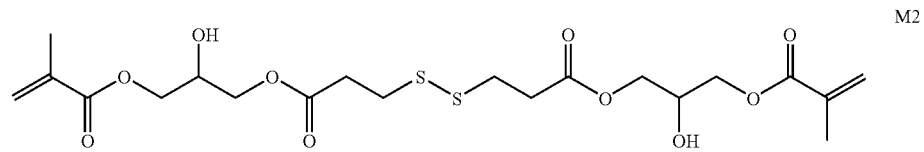

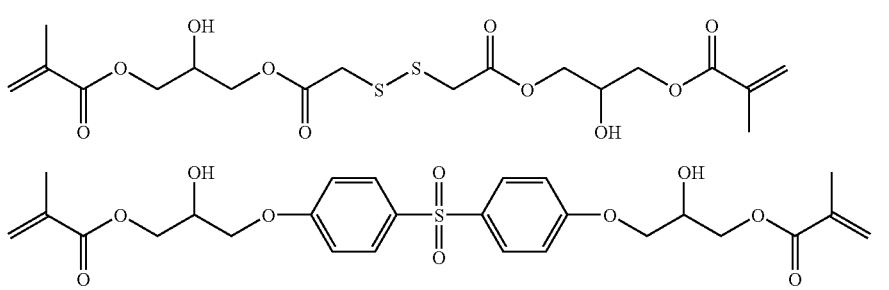

Synthesis Example 15

Synthesis of Sulfur-Containing Polyfunctional Monomer M4

2,2'-Dithiodiethanol (manufactured by Tokyo Kasei, 10.00 g), KARENZU MOI (trade name, manufactured by Showa Denko, 20.12 g), 2-butanone (dehydrated, manufactured by Wako Pure Chemical, 30.12 g), 4-hydroxy-2,2,6,6-tetramethylpyridine 1-oxyl free radical (manufactured by Tokyo Kasei, 60.2 mg) and NEOSTATIN U-600 (trade name, manufactured by Nitto Kasei; 0.05 g) were placed in a 200-mL one-necked eggplant-shaped flask in which a stirrer is placed and stirred at 75° C. for 1 hour. After completion of the reaction, 2-butanone was evaporated therefrom to give 30.05 g of a sulfur-containing polyfunctional monomer M4 having the following structure. The structure of the resulting sulfur-containing polyfunctional monomer M4 was identified by means of $^1$H-NMR.

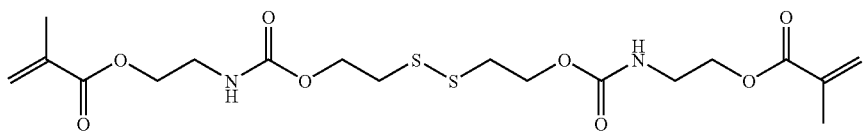

Synthesis Example

Synthesis of Sulfur-Containing Polyfunctional Monomer M5

1,4-phenylenediisothiocyanate (manufactured by Tokyo Kasei, 3.00 g), 2-hydroxyethyl methacrylate (manufactured by Tokyo Kasei, 4.06 g), 2-butanone (dehydrated, manufactured by Wako Pure Chemical, 7.06 g), 4-hydroxy-2,2,6,6-tetramethylpyridine 1-oxyl free radical (manufactured by Tokyo Kasei, 14.1 mg) and triethylamine (manufactured by Kanto Kagaku, 0.05 g) were placed in a 100-mL one-necked eggplant-shaped flask in which a stirrer is placed and stirred at 60° C. for 8 hour. After completion of the reaction, 2-butanone was evaporated therefrom to give 7.03 g of a sulfur-containing polyfunctional monomer M5 having the following structure. The structure of the resulting sulfur-containing polyfunctional monomer M5 was identified by means of $^1$H-NMR.

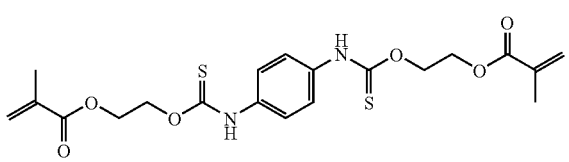

Synthesis Example

Synthesis of Sulfur-Containing Polyfunctional Monomer M6

Thioglycolic acid (manufactured by Tokyo Kasei, 6.35 g) and triethylamine (manufactured by Kanto Kagaku, 0.09 g) were placed in a 100-mL three-necked flask equipped with stirring fans and a cooling pipe, and 2,4-tolylene diisocyanate

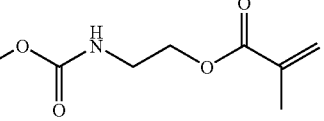

(manufactured by Tokyo Kasei, 6.00 g) was dropped thereinto at room temperature. After the mixture was heated up to 60° C. and stirred for 4 hours, it was returned to room temperature and I-methoxy-2-propanol (manufactured by Nippon Nyukazai KK, 12.35 g), glycidyl methacrylate (manufactured by Wako Pure Chemical, 9.80 g), 4-hydroxy-2,2,6,6-tetramethylpyridine 1-oxyl free radical (manufactured by Tokyo Kasei, 44.3 mg) and tetraethylammonium bromide (manufactured by Tokyo Kasei, 0.30 g) were placed therein followed by stirring at 80° C. for 5 hours. Water (100 g) and ethyl acetate (100 g) were added to this solution, and the resulted mixture was transferred to a separating funnel and vigorously stirred. After an aqueous layer was removed therefrom, a saturated aqueous solution of sodium carbonate (50 g) was added thereto followed by stirring vigorously. After an aqueous layer was removed therefrom, a saturated saline solution (50 g) was added thereto, and the resulted mixture was vigorously stirred. After an aqueous layer was removed therefrom, an organic layer was transferred to a 300-mL Erlenmeyer flask, and dried by addition of magnesium sulfate (30 g) thereto. The magnesium sulfate was removed by filtration, and ethyl acetate was removed therefrom under reduced pressure to give 22.13 g of a sulfur-containing polyfunctional monomer M6 having the following structure. Structure of the resulting sulfur-containing polyfunctional monomer M6 was identified by means of $^1$H-NMR.

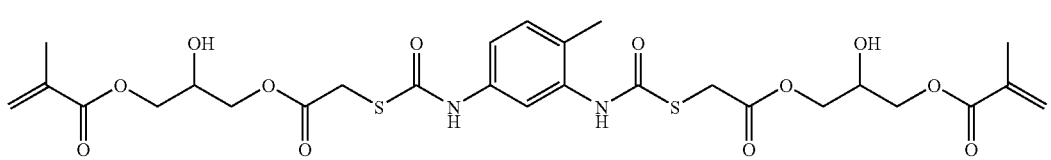

M6

Synthesis Example
Synthesis of Sulfur-Containing Polyfunctional Monomer M8

The sulfur-containing polyfunctional monomer M8 shown by the following structure was synthesized by the similar synthetic method as that for the sulfur-containing polyfunctional monomer M6, except that 1,4-phenylenediisothiocyanate was used in place of the 2,4-tolylene diisocyanate. The structure of the resulting sulfur-containing polyfunctional monomer M8 was identified by means of $^1$H-NMR.

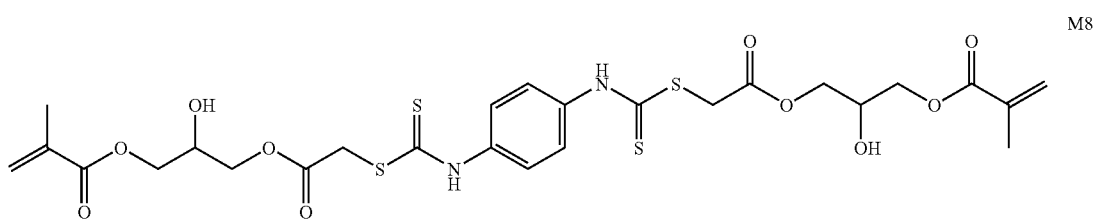

M8

Synthesis Example
Synthesis of Sulfur-Containing Polyfunctional Monomer M9

The sulfur-containing polyfunctional monomer M9 shown by the following structure was synthesized by the similar synthetic method as that for the sulfur-containing polyfunctional monomer M1, except that allylglycidyl ether was used in place of the glycidyl methacrylate. The structure of the resulting sulfur-containing polyfunctional monomer M9 was identified by means of $^1$H-NMR.

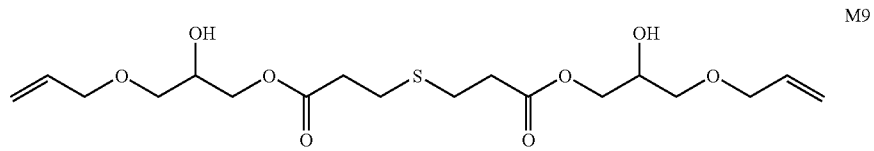

M9

Synthesis Example
Synthesis of Sulfur-Containing Polyfunctional Monomer M10

The sulfur-containing polyfunctional monomer M10 shown by the following structure was synthesized by the similar synthetic method as that for the sulfur-containing polyfunctional monomer M4, except that 3-isopropenyl-α,α-dimethylbenzyl isocyanate was used in place of the KARENZU MOI (described above). The structure of the resulting sulfur-containing polyfunctional monomer M10 was identified by means of $^1$H-NMR.

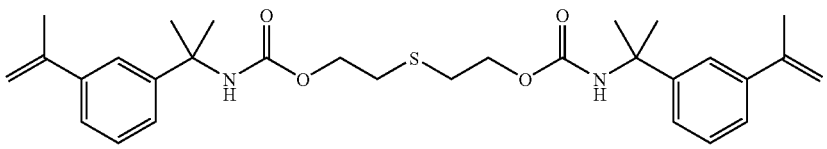
M10

Synthesis Example

Synthesis of Sulfur-Containing Polyfunctional Monomer M11

The sulfur-containing polyfunctional monomer M11 shown by the following structure was synthesized by esterification reaction using 2-hydroxyethyl methacrylate and 3,3'-thiodipropionate. The structure of the resulting sulfur-containing polyfunctional monomer M10 was identified by means of $^1$H-NMR.

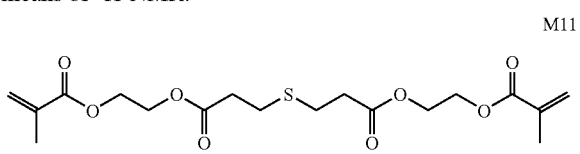
M11

Synthesis Example

Synthesis of Sulfur-Containing Polyfunctional Monomer M12

3,6-Dithio-1,8-octanediol (manufactured by Tokyo Kasei, 150.00 g), triethylamine (manufactured by Kanto Kagaku; 279.03 g), N,N-diaminopyridine (manufactured by Wako Pure Chemical, 183.15 g) and toluene (manufactured by Wako Pure Chemical, 300 mL) were placed in a 2-L three-necked flask equipped with stirring fans and stirred at room temperature on a water bath. Methacrylic acid anhydride (manufactured by Aldrich, 279.03 g) was dropped into the solution during 1 hour followed by stirring for 1 hour more. Water (200 mL) was added to the solution, and the resulted mixture was transferred to a separating funnel and vigorously stirred. After an aqueous layer was removed therefrom, 2M hydrochloric acid (20 mL) was added thereto followed by vigorous stirring. After an aqueous layer was removed therefrom, an organic layer was transferred to an Erlenmeyer flask and dried by addition of magnesium sulfate (150 g) thereto. The magnesium sulfate was removed by filtration, and toluene was removed therefrom under reduced pressure to give 1,000.38 g of a sulfur-containing polyfunctional monomer M12 having the following structure. Structure of the resulting sulfur-containing polyfunctional monomer M12 was identified by means of $^1$H-NMR.

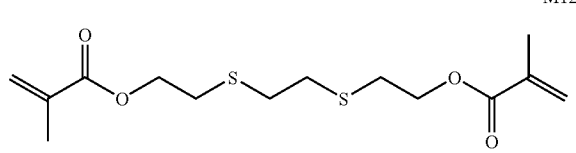
M12

Synthesis Example

Synthesis of Sulfur-Containing Polyfunctional Monomer M13

3,6-Dithio-1,8-octanediol (manufactured by Tokyo Kasei, 469.19 g), methyl methacrylate (manufactured by Wako Pure Chemical, 1,537.80 g), titanium tetraisopropoxide (manufactured by Wako Pure Chemical, 43.66 g) and 4-hydroxy-2,2,6,6-tetramethylpyridine 1-oxyl free radical (manufactured by Tokyo Kasei, 1.40 g) were placed in a one-liter three-necked flask equipped with stirring fans and a Dean-Stark device and stirred at 120° C. for 2 hours while removing, by distillation, methanol formed during the reaction. Methyl methacrylate (manufactured by Wako Pure Chemical, 384.45 g) was added to the resulted solution, and the mixture was stirred at 120° C. for 2 hours. Nitrogen gas was flown thereinto to evaporate an excessive amount of methyl methacrylate. Water (90 g) and acetone (200 mL) were added to the resulting crude product, and the resulted mixture was stirred at room temperature for 30 minutes. Magnesium sulfate (150 g) was added thereto followed by stirring for 30 minutes at room temperature. Insoluble matters were removed therefrom by filtration, and acetone was evaporated therefrom under reduced pressure to give 988.38 g of a sulfur-containing polyfunctional monomer M13 having the following structure. Structure of the resulting sulfur-containing polyfunctional monomer M13 was identified by means of $^1$H-NMR.

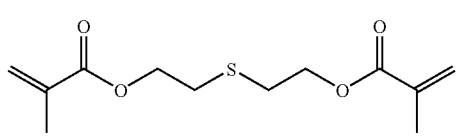
M13

Synthesis Example

Synthesis of Sulfur-Containing Polyfunctional Monomer M14

Bismuthiol (manufactured by Tokyo Kasei Kogyo, 194.2 g), tetraethylammonium bromide (manufactured by Tokyo Kasei Kogyo, 2.717 g), 4-hydroxy-2,2,6,6-tetramethylpyridine 1-oxyl free radical (manufactured by Tokyo Kasei, 1.205 g) and ethanol (650 g) were placed in a one-liter three-necked flask equipped with stirring fans and a cooling pipe and cooled down to 5° C. on an ice bath. Glycidyl methacrylate (manufactured by Wako Pure Chemical, 404.3 g) was dropped thereinto over 2 hours so that the temperature of the reaction solution did not exceed 15° C. After that, the resulted mixture was stirred at 60° C. for 3 hours, and ethanol was evaporated therefrom under reduced pressure to give 608.52 g of a sulfur-containing polyfunctional monomer M14 having the following structure. Structure of the resulting sulfur-containing polyfunctional monomer M14 was identified by means of $^1$H-NMR.

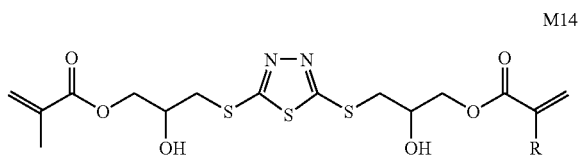

M14

Synthesis Example

Synthesis of Comparative Polyfunctional Monomer C1

The comparative polyfunctional monomer C1 shown by the following structure was synthesized by the similar synthetic method as that for the sulfur-containing polyfunctional monomer M1, except that pimelic acid was used in place of the 3,3'-thiodipropionic acid. The structure of the resulting comparative polyfunctional monomer C1 was identified by means of $^1$H-NMR.

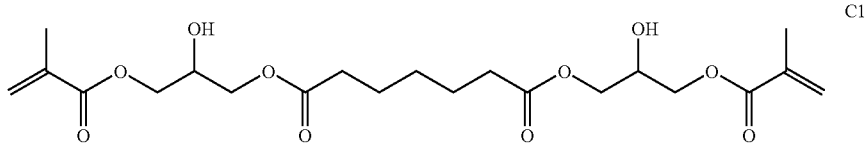

C1

Example 1

1. Preparation of Resin Composition for Laser Engraving 40 g of a PVA compound (trade name: GOHSENAL T-215, manufactured by Nippon Synthetic Chemical Industry) as a binder polymer, 0.75 g of carbon black (trade name: KETJEN BLACK EC 600 JD, manufactured by Lion) as a light-heat converting agent, 20 g of diethylene glycol as a plasticizer, and 35 g of water and 12 g of ethanol as solvents were placed into a three-necked flask equipped with stirring fans and a cooling pipe, and heated with stirring at 70° C. for 120 hours to dissolve the polymer. 28 g of the sulfur-containing polyfunctional monomer M1 and 1.6 g of a polymerization initiator (trade name: PERBUTYL Z, manufactured by NOF) were added thereto, followed by stirring for 30 minutes to give a resin composition 1 for laser engraving having fluidity (an application solution composition for forming relief layer).

2. Preparation of Relief Printing Plate Precursor for Laser Engraving

A spacer of a predetermined thickness was placed on a PET substrate to form a frame, and the resin composition 1 for laser engraving was quietly cast into the frame to such an extent as not flowing out of the spacer and dried in an oven at 70° C. for 3 hrs to dispose a relief forming layer of about 1 mm thickness. The thus-obtained relief forming layer was subjected to crosslinking by being heated at 100° C. for 2.5 hrs to provide a relief printing plate precursor 1 for laser engraving.

3. Production of Relief Printing Plate

The relief forming layer subjected to the crosslinking was engraved to form a 2 cm square solid image-shaped engraved portion by using a near infrared laser engraving machine (trade name: FD-100, manufactured by Tosei Electrobeam Co., Ltd.) having a semiconductor laser at a maximum power of 16 W (laser oscillation wavelength: 840 nm) while setting the engraving conditions to a laser power at 15 W, a scanning speed at 100 mm/sec, and a pitch distance at 0.15 mm to obtain a relief printing plate 1 having a relief forming layer.

The thickness of the relief layer present in the relief printing plate 1 was about 1.25 mm. The Shore A hardness of the relief layer measured by the above-described method was 65°. The measurement for the Shore A hardness was also carried out in the same manner in each of the following examples and comparative examples.

Examples 2 to 15 and Comparative Examples 1 and 2

Relief printing plates 2 to 15, C1, and C2 were manufactured in the similar manner as the relief printing plate 1, except that the following polyfunctional monomers are respectively used in place of the sulfur-containing polyfunctional monomer M1 for preparing a printing plate precursor for laser engraving from which the plates are respectively formed.

Namely, in Example 2, the relief printing plate 2 was prepared by using the sulfur-containing polyfunctional monomer M2; in Example 3, the relief printing plate 3 was prepared by using the sulfur-containing polyfunctional monomer M3; in Example 4, the relief printing plate 4 was prepared by using the sulfur-containing polyfunctional monomer M4; in Example 5, the relief printing plate 5 was prepared by using the sulfur-containing polyfunctional monomer M5; in Example 6, the relief printing plate 6 was prepared by using the sulfur-containing polyfunctional monomer M6; in Example 7, the relief printing plate 7 was prepared by using the sulfur-containing polyfunctional monomer M7; in Example 8, the relief printing plate 8 was prepared by using the sulfur-containing polyfunctional monomer M8; in Example 9, the relief printing plate 9 was prepared by using the sulfur-containing polyfunctional monomer M9; in Example 10, the relief printing plate 10 was prepared by using the sulfur-containing polyfunctional monomer M10; in Example 11, the relief printing plate 11 was prepared by using the sulfur-containing polyfunctional monomer M11; in Example 12, the relief printing plate 12 was prepared by using a 1:1 (mass ratio) mixture of the sulfur-containing polyfunctional monomer M1 and glycidyl methacrylate; in Example 13, the relief printing plate 13 was prepared by using the sulfur-containing polyfunctional monomer M12; in Example 14, the relief printing plate 14 was prepared by using the sulfur-containing polyfunctional monomer M13; in Example 15, the relief printing plate 15 was prepared by using the sulfur-containing polyfunctional monomer M14; in Comparative example 1, the relief printing plate C1 was prepared by using the comparative polyfunctional monomer C1; and in Comparative example 2, the relief printing plate C2 was prepared by using 1,3-glycerol dimethacrylate.

The thickness and the Shore A hardness of each of the relief printing plates 2 to 15, C1, and C2 are shown in the following Table 1.

Example 16

A relief printing plate 16 was prepared in the similar manner as in Example 1, except that AAUA PASS-01x (trade name, manufactured by Mitsubishi Rayon) was used as a binder polymer in place of the GOHSENAL T-215 (described above) to form a resin composition of a printing plate precursor for laser engraving from which the relief printing plate is formed.

Thickness and the shore A hardness of a relief layer of the relief printing plate 16 are shown in the following Table 1.

Example 17

A relief printing plate 17 was prepared in the similar manner as in Example 1, except that a cyanine compound (trade name: ADS820HO, manufactured by American Dye Source Inc.) was used as a light-heat conversion agent in place of the KETJEN BLACK EC 600 JD (described above) to form a resin composition of a printing plate precursor for laser engraving from which the relief printing plate is formed.

Thickness and the shore A hardness of a relief layer of the relief printing plate 17 are shown in the following Table 1.

Example 18

A relief printing plate 18 was prepared in the similar manner as in Example 1, except that a phthalocyanine compound (trade name: D99-009, manufactured by Yamamoto Chemicals Inc.) was used as a light-heat conversion agent in place of the KETJEN BLACK EC 600 JD (described above) to form a resin composition of a printing plate precursor for laser engraving from which the relief printing plate is formed.

Thickness and the shore A hardness of a relief layer of the relief printing plate 18 are shown in the following Table 1.

Example 19

A relief printing plate 19 was prepared in the similar manner as in Example 1, except that an azo compound (trade name: V-30, manufactured by Wako Pure Chemical Industries, Ltd.) was used as a polymerization initiator in place of the PERBUTYL Z (described above) to form a resin composition of a printing plate precursor for laser engraving from which the relief printing plate is formed.

Thickness and the shore A hardness of a relief layer of the relief printing plate 19 are shown in the following Table 1.

Examples 20 to 38 and Comparative Examples 3 and 4

Relief printing plates 20 to 38 of Examples 20 to 38 and relief printing plates C3 and C4 of Comparative examples 3 and 4 were prepared in the same manner as in Examples 1 to 19 and Comparative examples 1 and 2, except that the laser engraving of the relief forming layers subjected to the crosslinking was performed by using a $CO_2$ gas laser with the following condition in place of the semiconductor laser.

Namely, the engraving of the relief forming layer subjected to the crosslinking was carried out to form a 2 cm square solid image-shaped engraved portion by using a $CO_2$ gas laser engraving machine (trade name: $CO_2$ LASER MARKER ML-Z9500, manufactured by Keyence Corporation) equipped with a $CO_2$ gas laser having a maximum power of 30 W, while setting engraving conditions to a laser power at 15 W, a scanning speed at 100 mm/sec, and a pitch distance at 0.15 mm.

The thickness and the Shore A hardness of each of the relief layers were also evaluated in the same manner as Example 1. The results of the evaluation are shown in Table 2.

Evaluation of Engraving Depth

"Engraving depth" of the relief layer of in each of the relief printing plates 1 to 38 and C1 to C4 was measured as described below. The "engraving depth" herein means a distance between an engraved position (height) and a not-engraved position (height) observed in a cross section of the relief layer. The engraving depth was measured by observing the cross section of the relief layer by a super depth color 3D measuring microscope (trade name: VK9510, manufactured by Keyence Corporation). It is estimated that the engraving sensitivity is more excellent as the engraving depth is larger. The evaluation results of the the engraving depth are shown in the following Tables 1 and 2.

TABLE 1

| | Relief Layer | | | | |
|---|---|---|---|---|---|
| | Relief Printing Plate | Thickness (mm) | Shore A Hardness (°) | Laser for Engraving | Engraving Depth (μm) |
| Example 1 | 1 | 1.25 | 65 | Semiconductor Laser | 560 |
| Example 2 | 2 | 1.33 | 68 | Semiconductor Laser | 600 |
| Example 3 | 3 | 1.32 | 65 | Semiconductor Laser | 600 |
| Example 4 | 4 | 1.22 | 72 | Semiconductor Laser | 600 |
| Example 5 | 5 | 1.42 | 71 | Semiconductor Laser | 550 |
| Example 6 | 6 | 1.36 | 69 | Semiconductor Laser | 580 |
| Example 7 | 7 | 1.51 | 74 | Semiconductor Laser | 555 |
| Example 8 | 8 | 1.43 | 61 | Semiconductor Laser | 580 |
| Example 9 | 9 | 1.19 | 65 | Semiconductor Laser | 530 |
| Example 10 | 10 | 1.23 | 81 | Semiconductor Laser | 515 |
| Example 11 | 11 | 1.41 | 78 | Semiconductor Laser | 545 |
| Example 12 | 12 | 1.54 | 73 | Semiconductor Laser | 590 |
| Example 13 | 13 | 1.38 | 63 | Semiconductor Laser | 570 |
| Example 14 | 14 | 1.33 | 65 | Semiconductor Laser | 560 |
| Example 15 | 15 | 1.43 | 75 | Semiconductor Laser | 550 |
| Example 16 | 16 | 1.33 | 68 | Semiconductor Laser | 570 |
| Example 17 | 17 | 1.36 | 64 | Semiconductor Laser | 560 |
| Example 18 | 18 | 1.29 | 81 | Semiconductor Laser | 560 |
| Example 19 | 19 | 1.42 | 68 | Semiconductor Laser | 555 |
| Comparative Example 1 | C1 | 1.36 | 76 | Semiconductor Laser | 440 |
| Comparative Example 2 | C2 | 1.45 | 79 | Semiconductor Laser | 430 |

TABLE 2

| | Relief Layer | | | | |
|---|---|---|---|---|---|
| | Relief Printing Plate | Thickness (mm) | Shore A Hardness (°) | Laser for Engraving | Engraving Depth (μm) |
| Example 20 | 20 | 1.25 | 65 | Carbon Dioxide Laser | 240 |
| Example 21 | 21 | 1.33 | 68 | Carbon Dioxide Laser | 285 |
| Example 22 | 22 | 1.32 | 65 | Carbon Dioxide Laser | 285 |
| Example 23 | 23 | 1.22 | 72 | Carbon Dioxide Laser | 285 |
| Example 24 | 24 | 1.42 | 71 | Carbon Dioxide Laser | 240 |
| Example 25 | 25 | 1.36 | 69 | Carbon Dioxide Laser | 265 |
| Example 26 | 26 | 1.51 | 74 | Carbon Dioxide Laser | 245 |
| Example 27 | 27 | 1.43 | 61 | Carbon Dioxide Laser | 265 |
| Example 28 | 28 | 1.19 | 65 | Carbon Dioxide Laser | 215 |

TABLE 2-continued

| | Relief Layer | | | | |
|---|---|---|---|---|---|
| | Relief Printing Plate | Thickness (mm) | Shore A Hardness (°) | Laser for Engraving | Engraving Depth (μm) |
| Example 29 | 29 | 1.23 | 81 | Carbon Dioxide Laser | 200 |
| Example 30 | 30 | 1.41 | 78 | Carbon Dioxide Laser | 225 |
| Example 31 | 31 | 1.54 | 73 | Carbon Dioxide Laser | 275 |
| Example 32 | 32 | 1.38 | 63 | Carbon Dioxide Laser | 245 |
| Example 33 | 33 | 1.33 | 65 | Carbon Dioxide Laser | 240 |
| Example 34 | 34 | 1.43 | 75 | Carbon Dioxide Laser | 235 |
| Example 35 | 35 | 1.33 | 68 | Carbon Dioxide Laser | 245 |
| Example 36 | 36 | 1.36 | 64 | Carbon Dioxide Laser | 240 |
| Example 37 | 37 | 1.29 | 81 | Carbon Dioxide Laser | 240 |
| Example 38 | 38 | 1.42 | 68 | Carbon Dioxide Laser | 235 |
| Comparative Example 3 | C3 | 1.36 | 76 | Carbon Dioxide Laser | 200 |
| Comparative Example 4 | C4 | 1.45 | 79 | Carbon Dioxide Laser | 185 |

From the results shown in Tables 1 and 2, it can be understood that the relief printing plates of the Examples manufactured by using the resin compositions for laser engraving containing the sulfur-containing polyfunctional monomer according to the invention have a larger engraving depth than the relief printing plates of comparative examples which are prepared without using the sulfur-containing polyfunctional monomer. From the results, it can be understood that the resin composition for laser engraving prepared in the Examples have high engraving sensitivity.

What is claimed is:

1. A resin composition for laser engraving, comprising (A) a polyfunctional polymerizable compound having two or more ethylenic unsaturated bonds, a carbon-sulfur bond being contained at the site where two among the two or more ethylenic unsaturated bonds are connected, and (B) a binder polymer, wherein the polymerizable compound having two or more ethylenic unsaturated bonds has at least one unit selected from the group consisting of —C—S—S—, —NH(C=S)O—, —NH(C=O)S— and —NH(C=S)S— as the carbon-sulfur bond.

2. The resin composition for laser engraving of claim 1, further comprising (C) a light-heat converting agent which can absorb light having a wavelength of 700 nm to 1,300 nm.

3. A relief printing plate precursor for laser engraving, comprising a relief forming layer, the relief forming layer comprising the resin composition for laser engraving of claim 1.

4. A relief printing plate precursor for laser engraving, comprising a relief forming layer, the relief forming layer comprising a product formed by subjecting the resin composition for laser engraving of claim 1 to crosslinking by at least one of light or heat.

5. A method for manufacturing a relief printing plate, the method comprising: crosslinking at least a part of components of the relief forming layer of the relief printing plate precursor for laser engraving of claim 3 by at least one of light or heat; and laser engraving the relief forming layer subjected to the crosslinking to form a relief layer.

6. The method for manufacturing a relief printing plate of claim 5, wherein the crosslinking comprises application of heat to the relief forming layer.

7. A relief printing plate, comprising a relief layer and manufactured by the method for manufacturing a relief printing plate of claim 5.

8. The relief printing plate of claim 7, wherein the thickness of the relief layer is from 0.05 mm to 10 mm.

9. The relief printing plate of claim 7, wherein the Shore A hardness of the relief layer is from 50° to 90°.

* * * * *